United States Patent
Bower et al.

(10) Patent No.: US 10,252,514 B2
(45) Date of Patent: Apr. 9, 2019

(54) APPARATUS AND METHODS FOR MICRO-TRANSFER-PRINTING

(71) Applicant: X-Celeprint Limited, Cork (IE)

(72) Inventors: Christopher Bower, Raleigh, NC (US); Matthew Meitl, Durham, NC (US); David Gomez, Holly Springs, NC (US); Salvatore Bonafede, Chapel Hill, NC (US); David Kneeburg, Durham, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/387,389

(22) Filed: Dec. 21, 2016

(65) Prior Publication Data

US 2017/0103964 A1 Apr. 13, 2017

Related U.S. Application Data

(63) Continuation of application No. 14/804,047, filed on Jul. 20, 2015, now Pat. No. 9,550,353.
(Continued)

(51) Int. Cl.
*B41F 16/00* (2006.01)
*B41K 3/04* (2006.01)
(Continued)

(52) U.S. Cl.
CPC .............. *B41F 16/00* (2013.01); *B25J 15/00* (2013.01); *B41F 16/006* (2013.01);
(Continued)

(58) Field of Classification Search
CPC .. B41K 99/00; B41K 3/04; B41K 3/12; G03F 7/0002; B29C 59/023; B81C 2201/0185;
(Continued)

(56) References Cited

U.S. PATENT DOCUMENTS

| 4,934,267 A | 6/1990 | Hashimoto et al. |
| 5,205,032 A | 4/1993 | Kuroda et al. |

(Continued)

FOREIGN PATENT DOCUMENTS

| EP | 0281100 B1 | 6/1992 |
| JP | H11-142878 A | 5/1999 |

(Continued)

OTHER PUBLICATIONS

Bower, C. A. et al., Transfer Printing: An Approach for Massively Parallel Assembly of Microscale Devices, IEE, Electronic Components and Technology Conference, 2008, pp. 1105-1109.
(Continued)

*Primary Examiner* — David H Banh
(74) *Attorney, Agent, or Firm* — William R. Haulbrook; Michael D. Schmitt; Choate, Hall & Stewart LLP

(57) ABSTRACT

In an aspect, a system and method for assembling a semiconductor device on a receiving surface of a destination substrate is disclosed. In another aspect, a system and method for assembling a semiconductor device on a destination substrate with topographic features is disclosed. In another aspect, a gravity-assisted separation system and method for printing semiconductor device is disclosed. In another aspect, various features of a transfer device for printing semiconductor devices are disclosed.

8 Claims, 37 Drawing Sheets

Related U.S. Application Data

(60) Provisional application No. 62/027,166, filed on Jul. 21, 2014, provisional application No. 62/026,694, filed on Jul. 20, 2014.

(51) Int. Cl.

| | | |
|---|---|---|
| *B41K 3/12* | (2006.01) | |
| *B25J 15/00* | (2006.01) | |
| *H01L 21/52* | (2006.01) | |
| *H01L 21/56* | (2006.01) | |
| *H01L 21/67* | (2006.01) | |
| *H01L 23/00* | (2006.01) | |
| *H01L 23/29* | (2006.01) | |
| *H01L 23/31* | (2006.01) | |
| *H01L 25/00* | (2006.01) | |
| *H01L 31/18* | (2006.01) | |
| *H01L 21/683* | (2006.01) | |
| *H01L 21/3065* | (2006.01) | |

(52) U.S. Cl.
CPC ...... *B41F 16/0046* (2013.01); *B41F 16/0073* (2013.01); *B41K 3/04* (2013.01); *B41K 3/12* (2013.01); *H01L 21/3065* (2013.01); *H01L 21/52* (2013.01); *H01L 21/565* (2013.01); *H01L 21/568* (2013.01); *H01L 21/67103* (2013.01); *H01L 21/683* (2013.01); *H01L 21/6835* (2013.01); *H01L 23/293* (2013.01); *H01L 23/3171* (2013.01); *H01L 24/75* (2013.01); *H01L 24/83* (2013.01); *H01L 24/97* (2013.01); *H01L 25/50* (2013.01); *H01L 31/1892* (2013.01); *H01L 2221/68318* (2013.01); *H01L 2221/68354* (2013.01); *H01L 2221/68368* (2013.01); *H01L 2221/68377* (2013.01); *H01L 2221/68381* (2013.01); *H01L 2224/32225* (2013.01); *H01L 2224/32245* (2013.01); *H01L 2224/7598* (2013.01); *H01L 2224/75315* (2013.01); *H01L 2224/83001* (2013.01); *H01L 2224/832* (2013.01); *H01L 2224/83011* (2013.01); *H01L 2224/83013* (2013.01); *H01L 2224/83024* (2013.01); *H01L 2224/83894* (2013.01); *H01L 2224/83895* (2013.01); *H01L 2924/1032* (2013.01); *H01L 2924/1034* (2013.01); *H01L 2924/10253* (2013.01); *H01L 2924/10328* (2013.01); *H01L 2924/10329* (2013.01); *H01L 2924/10332* (2013.01); *H01L 2924/10335* (2013.01); *H01L 2924/10336* (2013.01); *H01L 2924/10337* (2013.01); *H01L 2924/10338* (2013.01)

(58) Field of Classification Search
CPC .... B81C 2201/0187; B81C 2201/0174; B81C 2201/018; B81C 2201/0197; B41F 16/00; B41F 16/0046; B41F 16/006; B41F 16/0073; B25J 15/00; H01L 2924/1032; H01L 2924/10328; H01L 2924/10329; H01L 2924/10332; H01L 2924/10335; H01L 2924/10336; H01L 2924/10337; H01L 2924/10338; H01L 2924/1034; H01L 31/1892; H01L 2221/68318; H01L 2221/68354; H01L 2221/68368; H01L 2221/68377; H01L 2221/68381
See application file for complete search history.

(56) References Cited

U.S. PATENT DOCUMENTS

| | | |
|---|---|---|
| 5,550,066 A | 8/1996 | Tang et al. |
| 5,621,555 A | 4/1997 | Park |
| 5,815,303 A | 9/1998 | Berlin |
| 5,882,532 A | 3/1999 | Field et al. |
| 6,025,730 A | 2/2000 | Akram et al. |
| 6,180,239 B1 | 1/2001 | Whitesides et al. |
| 6,278,242 B1 | 8/2001 | Cok et al. |
| 6,387,778 B1 | 5/2002 | Bonin et al. |
| 6,555,408 B1 | 4/2003 | Jacobsen et al. |
| 6,577,367 B2 | 6/2003 | Kim |
| 6,717,560 B2 | 4/2004 | Cok et al. |
| 6,756,576 B1 | 6/2004 | McElroy et al. |
| 6,933,532 B2 | 8/2005 | Arnold et al. |
| 6,969,624 B2 | 11/2005 | Iwafuchi et al. |
| 6,974,711 B2 | 12/2005 | Yanagisawa et al. |
| 6,998,644 B1 | 2/2006 | Boling et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,622,367 B1 | 11/2009 | Nuzzo et al. |
| 7,662,545 B2 | 2/2010 | Nuzzo et al. |
| 7,691,656 B2 | 4/2010 | Bader et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,893,612 B2 | 2/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,110,425 B2 | 2/2012 | Yun |
| 8,198,621 B2 | 6/2012 | Rogers et al. |
| 8,207,547 B2 | 6/2012 | Lin |
| 8,217,381 B2 | 7/2012 | Rogers et al. |
| 8,261,660 B2 | 9/2012 | Menard |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,502,192 B2 | 8/2013 | Kwak et al. |
| 8,506,867 B2 | 8/2013 | Menard |
| 8,664,699 B2 | 3/2014 | Nuzzo et al. |
| 8,685,764 B2 | 4/2014 | Chu et al. |
| 8,686,447 B2 | 4/2014 | Tomoda et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,854,294 B2 | 10/2014 | Sakariya |
| 8,871,547 B2 | 10/2014 | Chu et al. |
| 8,877,648 B2 | 11/2014 | Bower et al. |
| 8,889,485 B2 | 11/2014 | Bower |
| 8,895,406 B2 | 11/2014 | Rogers et al. |
| 8,934,259 B2 | 1/2015 | Bower et al. |
| 8,941,215 B2 | 1/2015 | Hu et al. |
| 8,987,765 B2 | 3/2015 | Bibl et al. |
| 9,153,171 B2 | 10/2015 | Sakariya et al. |
| 9,217,541 B2 | 12/2015 | Bathurst et al. |
| 9,238,309 B2 | 1/2016 | King et al. |
| 9,307,652 B2 | 4/2016 | Bower |
| 9,308,649 B2 | 4/2016 | Golda et al. |

(56) References Cited

U.S. PATENT DOCUMENTS

| | | | |
|---|---|---|---|
| 9,358,775 B2 | 6/2016 | Bower et al. | |
| 9,368,683 B1 | 6/2016 | Meitl et al. | |
| 9,401,344 B2 | 7/2016 | Bower et al. | |
| 9,548,332 B2 | 1/2017 | Hu et al. | |
| 9,550,353 B2 | 1/2017 | Bower et al. | |
| 9,555,644 B2 | 1/2017 | Rogers et al. | |
| 9,626,908 B2 | 4/2017 | Sakariya et al. | |
| 9,765,934 B2 | 9/2017 | Rogers et al. | |
| 2001/0040298 A1 | 11/2001 | Baba et al. | |
| 2002/0050220 A1 | 5/2002 | Schueller et al. | |
| 2002/0158568 A1 | 10/2002 | Satake | |
| 2003/0027083 A1 | 2/2003 | Fuller et al. | |
| 2003/0141570 A1 | 7/2003 | Chen et al. | |
| 2004/0082163 A1 | 4/2004 | Mori et al. | |
| 2004/0130020 A1 | 7/2004 | Kuwabara et al. | |
| 2004/0173876 A1 | 9/2004 | Musalem et al. | |
| 2004/0192041 A1 | 9/2004 | Jeong et al. | |
| 2004/0227886 A1 | 11/2004 | Kimura | |
| 2005/0040754 A1 | 2/2005 | Sakurai | |
| 2005/0133241 A1 | 6/2005 | Chi et al. | |
| 2005/0202595 A1 | 9/2005 | Yonehara et al. | |
| 2005/0285246 A1 | 12/2005 | Haba et al. | |
| 2006/0024974 A1 | 2/2006 | Azuri et al. | |
| 2006/0038182 A1* | 2/2006 | Rogers | B82Y 10/00 257/77 |
| 2006/0051900 A1 | 3/2006 | Shizuno | |
| 2006/0063309 A1 | 3/2006 | Sugiyama et al. | |
| 2007/0032089 A1 | 2/2007 | Nuzzo et al. | |
| 2007/0037318 A1 | 2/2007 | Kim | |
| 2007/0080464 A1 | 4/2007 | Goebel et al. | |
| 2007/0120681 A1 | 5/2007 | Yamazaki et al. | |
| 2007/0254455 A1 | 11/2007 | Yamaguchi et al. | |
| 2008/0108171 A1 | 5/2008 | Rogers et al. | |
| 2008/0131822 A1 | 6/2008 | Liao et al. | |
| 2008/0164575 A1 | 7/2008 | Ikeda et al. | |
| 2008/0185705 A1 | 8/2008 | Osborn et al. | |
| 2008/0202365 A1 | 8/2008 | Schneider et al. | |
| 2008/0268571 A1 | 10/2008 | Kim | |
| 2009/0133914 A1 | 5/2009 | Dellmann et al. | |
| 2009/0199960 A1* | 8/2009 | Nuzzo | B82Y 10/00 156/230 |
| 2010/0018420 A1 | 1/2010 | Menard | |
| 2010/0062098 A1 | 3/2010 | Ando et al. | |
| 2010/0072495 A1 | 3/2010 | Yamazaki | |
| 2010/0123134 A1 | 5/2010 | Nagata | |
| 2010/0123268 A1 | 5/2010 | Menard | |
| 2010/0155989 A1 | 6/2010 | Ishii et al. | |
| 2010/0190293 A1 | 7/2010 | Maeda et al. | |
| 2010/0224317 A1* | 9/2010 | Kawamura | B41M 3/006 156/277 |
| 2010/0248484 A1 | 9/2010 | Bower et al. | |
| 2010/0265440 A1 | 10/2010 | French et al. | |
| 2010/0289115 A1 | 11/2010 | Akiyama et al. | |
| 2010/0308008 A1 | 12/2010 | Zhu et al. | |
| 2010/0316845 A1 | 12/2010 | Rule et al. | |
| 2011/0182805 A1 | 7/2011 | DeSimone et al. | |
| 2011/0210468 A1 | 9/2011 | Shannon et al. | |
| 2011/0219973 A1 | 9/2011 | Gullentops et al. | |
| 2011/0266670 A1 | 11/2011 | England et al. | |
| 2011/0277813 A1 | 11/2011 | Rogers et al. | |
| 2012/0000379 A1 | 1/2012 | Greener et al. | |
| 2012/0027557 A1 | 2/2012 | Ashdown et al. | |
| 2012/0043130 A1 | 2/2012 | Rathburn | |
| 2012/0104624 A1 | 5/2012 | Choi et al. | |
| 2012/0115262 A1* | 5/2012 | Menard | H01L 21/6835 438/26 |
| 2012/0126229 A1 | 5/2012 | Bower | |
| 2012/0168776 A1 | 7/2012 | Nakamura et al. | |
| 2012/0228669 A1 | 9/2012 | Bower et al. | |
| 2012/0256346 A1 | 10/2012 | Ogino et al. | |
| 2012/0313241 A1 | 12/2012 | Bower | |
| 2012/0314388 A1 | 12/2012 | Bower et al. | |
| 2012/0321738 A1 | 12/2012 | Ishii et al. | |
| 2012/0328728 A1 | 12/2012 | Nakatsuka et al. | |
| 2013/0036928 A1* | 2/2013 | Rogers | B41J 2/475 101/483 |
| 2013/0068720 A1 | 3/2013 | Taniguchi | |
| 2013/0069275 A1 | 3/2013 | Menard et al. | |
| 2013/0078576 A1 | 3/2013 | Wu et al. | |
| 2013/0088416 A1 | 4/2013 | Smith et al. | |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0273695 A1 | 10/2013 | Menard et al. | |
| 2013/0333094 A1 | 12/2013 | Rogers et al. | |
| 2013/0337608 A1 | 12/2013 | Kotani et al. | |
| 2014/0084450 A1 | 3/2014 | Nielson et al. | |
| 2014/0094878 A1 | 4/2014 | Gossler et al. | |
| 2014/0104243 A1 | 4/2014 | Sakariya et al. | |
| 2014/0159064 A1 | 6/2014 | Sakariya et al. | |
| 2014/0264763 A1 | 9/2014 | Meitl et al. | |
| 2014/0267683 A1 | 9/2014 | Bibl et al. | |
| 2014/0327132 A1 | 11/2014 | Zhang et al. | |
| 2014/0367633 A1 | 12/2014 | Bibl et al. | |
| 2015/0135525 A1 | 5/2015 | Bower | |
| 2015/0137153 A1 | 5/2015 | Bibl et al. | |
| 2015/0163906 A1 | 6/2015 | Bower et al. | |
| 2015/0169011 A1 | 6/2015 | Bibl et al. | |
| 2015/0348926 A1 | 12/2015 | Bower | |
| 2015/0371874 A1 | 12/2015 | Bower et al. | |
| 2016/0016399 A1 | 1/2016 | Bower et al. | |
| 2016/0020120 A1 | 1/2016 | Bower et al. | |
| 2016/0020127 A1 | 1/2016 | Bower et al. | |
| 2016/0020130 A1 | 1/2016 | Bower et al. | |
| 2016/0020131 A1 | 1/2016 | Bower et al. | |
| 2016/0020187 A1 | 1/2016 | Okada et al. | |
| 2017/0047303 A1 | 2/2017 | Meitl et al. | |
| 2017/0047306 A1 | 2/2017 | Meitl et al. | |
| 2017/0154819 A1 | 6/2017 | Bower et al. | |
| 2017/0173852 A1 | 6/2017 | Moore et al. | |
| 2017/0206845 A1 | 7/2017 | Sakariya et al. | |
| 2017/0207193 A1 | 7/2017 | Bower et al. | |
| 2017/0256521 A1 | 9/2017 | Cok et al. | |

FOREIGN PATENT DOCUMENTS

| | | |
|---|---|---|
| JP | 2005 099410 A | 4/2005 |
| TW | 200707688 A | 2/2007 |
| WO | WO-2005/088704 A1 | 9/2005 |
| WO | WO-2007/037106 A1 | 4/2007 |
| WO | WO-2008/103931 A2 | 8/2008 |
| WO | WO-2008/143635 A1 | 11/2008 |
| WO | WO-2011/126726 A1 | 10/2011 |
| WO | WO-2016/012409 A2 | 1/2016 |

OTHER PUBLICATIONS

Cok, R. S. et al., AMOLED Displays Using Transfer-Printed Integrated Circuits, Society for Information Display, 10:902-904 (2010).

Foest, R. et al., Kalte Normaldruck-Jetplasmen zur Iokalen Oberflächenbehandlung, Vakuum in Forschung und Praxis, 21(6):17-21, (2009).

Hamer et al., 63.2: AMOLED Displays Using Transfer-Printed Integrated Circuits, SID 09 Digest, 40(2):947-950 (2009).

Howlader, M. M. R. et al., Nanobonding Technology Toward Electronic, Fluidic, and Photonic Systems Integration, IEEE, Journal of Selected Topics in Quantum Electronics, 17(3):689-703, (2011).

Kim, S. et al, Microstructural elastomeric surfaces with reversible adhesion and examples of their use in deterministic assembly by transfer printing, PNAS, 107(40):17095-17100 (2010).

Roscher, H., VCSEL Arrays with Redundant Pixel Designs for 10Gbits/s 2-D Space-Parallel MMF Transmission, Annual Report, optoelectronics Department, (2005).

Yaniv et al., A 640x480 Pixel Computer Display Using Pin Diodes with Device Redundancy, 1988 International Display Research Conference, IEEE, CH-2678-1/88:152-154 (1988).

Hui, C. Y. et al., Constraints on Microcontact Printing Imposed by Stamp, Langmuir, 18:1394-1407 (2002).

(56) References Cited

OTHER PUBLICATIONS

Zhou, W. et al., Mechanism for stamp collapse in soft lithography, Applied Physics Letters, 87:251925-1 (2005).

* cited by examiner

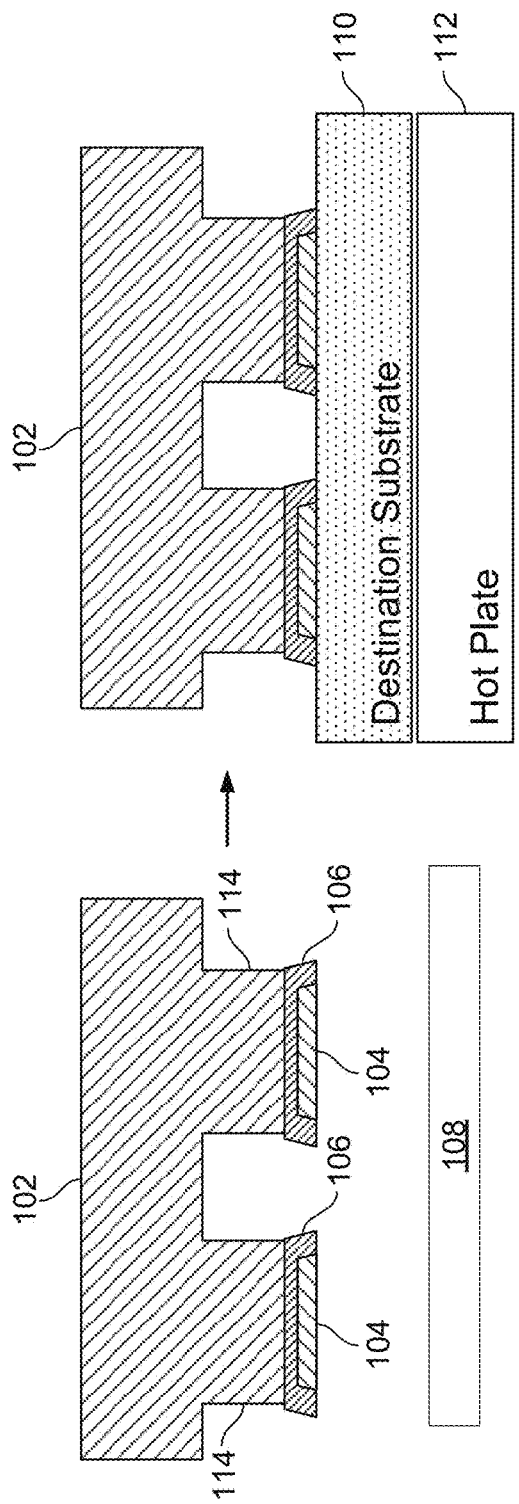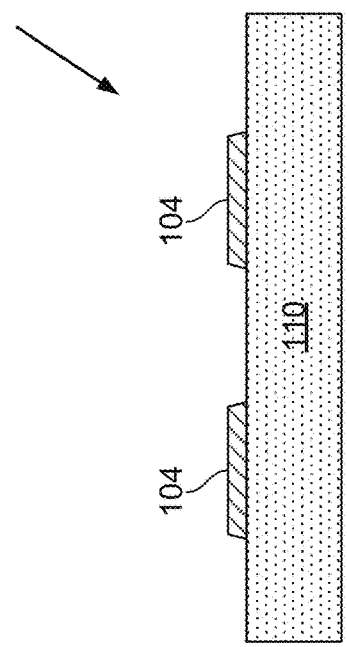

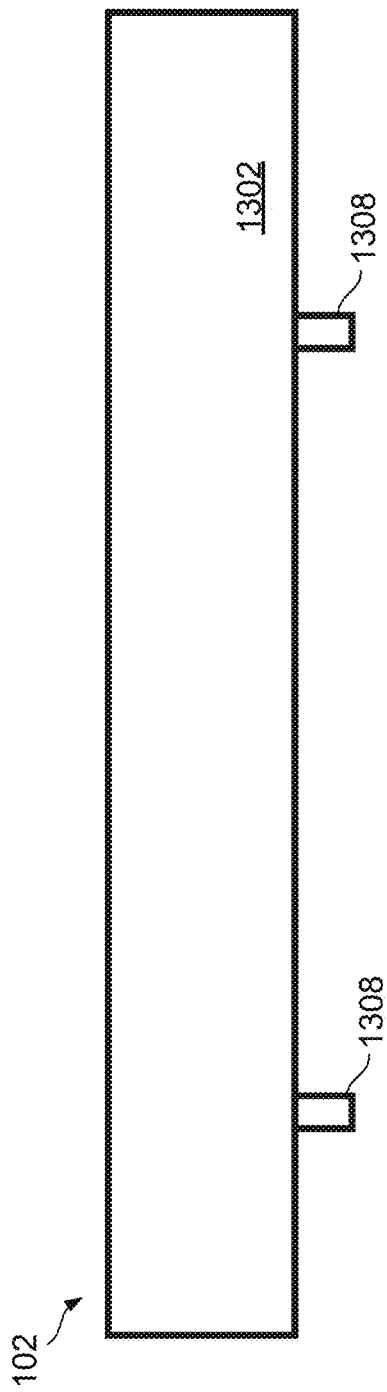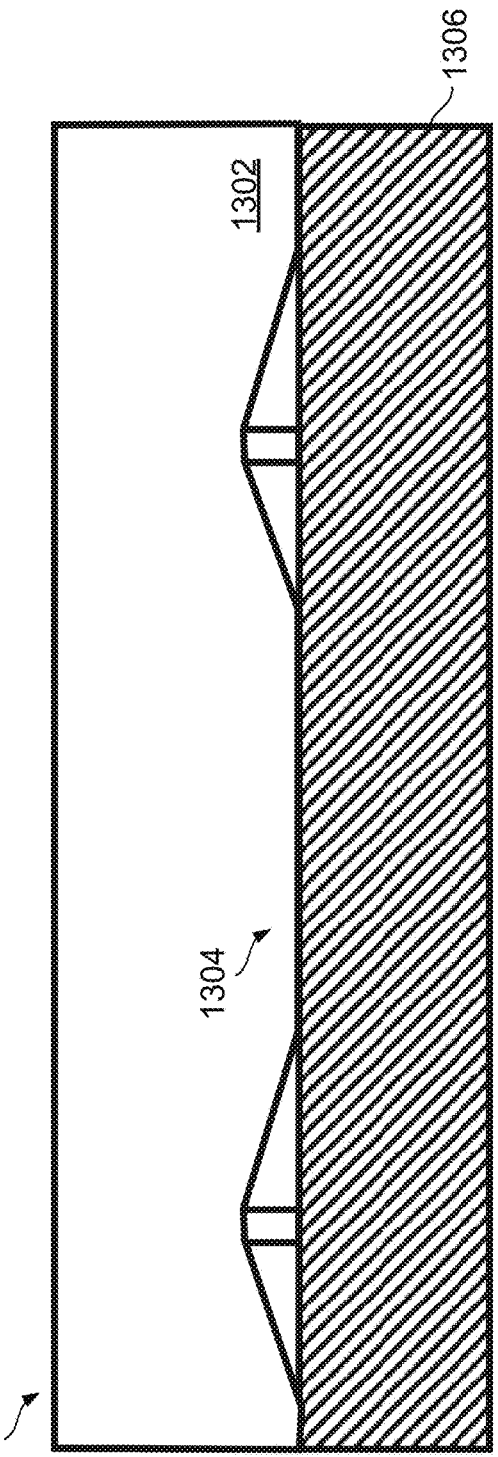
FIG. 13A
FIG. 13B

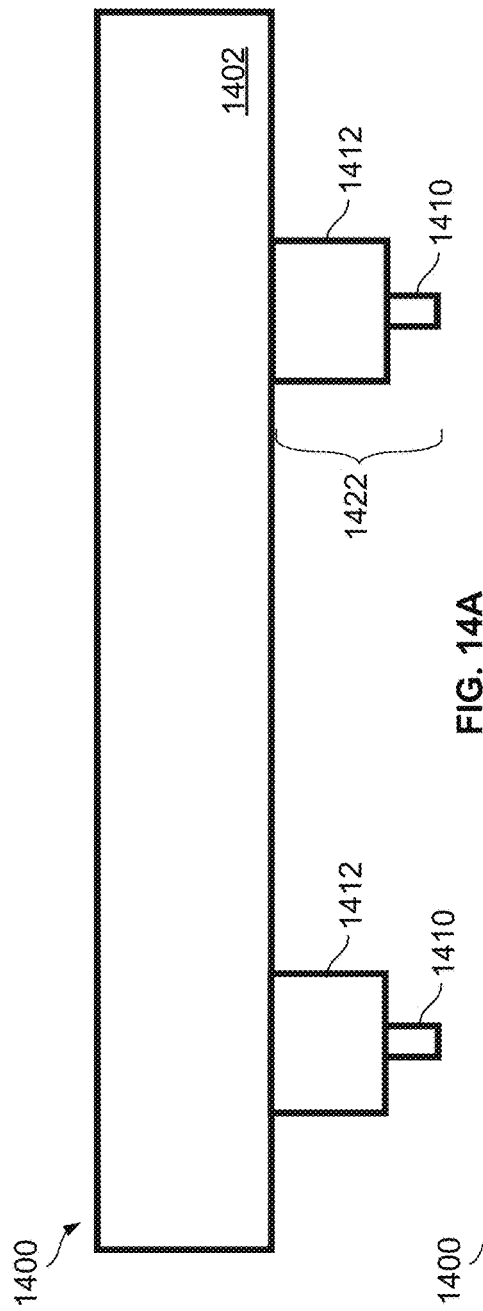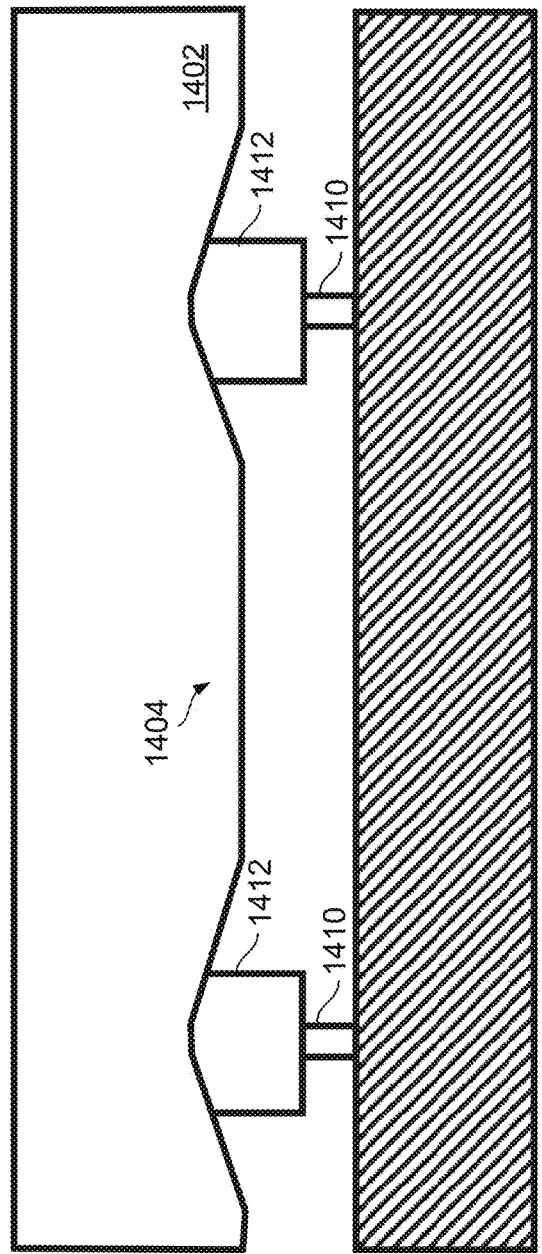

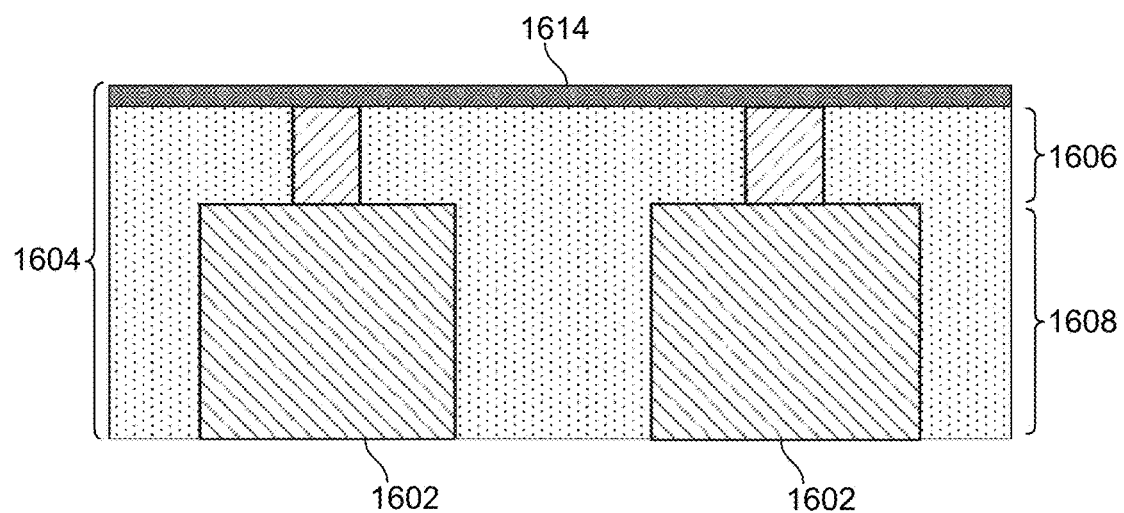
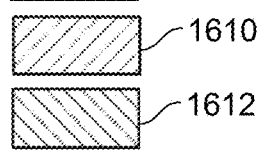
FIG. 16

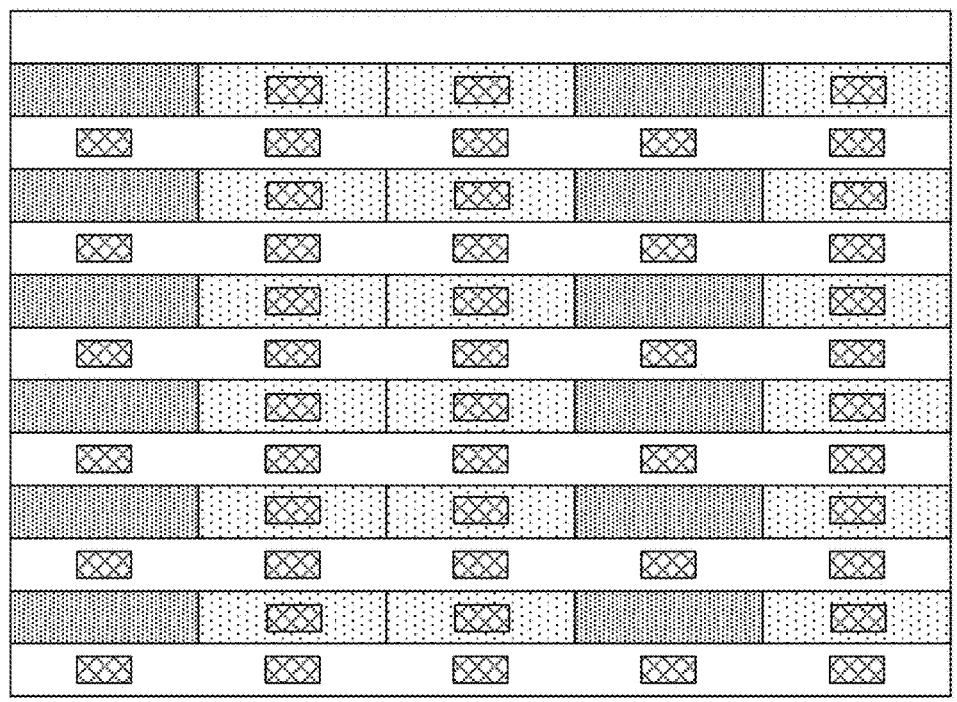
Legend
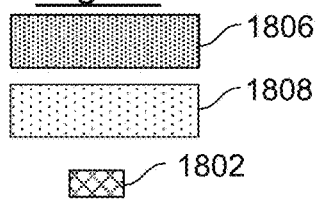
FIG. 19

APPARATUS AND METHODS FOR MICRO-TRANSFER-PRINTING

PRIORITY APPLICATIONS

This application claims priority to and the benefit of U.S. patent application Ser. No. 14/804,047, filed Jul. 20, 2015, entitled "Apparatus and Methods for Micro-Transfer-Printing", which claims priority to and benefit of U.S. Provisional Patent Application No. 62/026,694, filed Jul. 20, 2014, entitled "Apparatus and Method for Micro-Transfer Printing" and U.S. Provisional Patent Application No. 62/027,166, filed Jul. 21, 2014, entitled "Methods and Tools for Micro-Transfer Printing," the contents of each of which is incorporated by reference herein in its entirety.

FIELD OF THE INVENTION

The present invention relates to methods and tools for micro-transfer-printing printable devices to destination substrates.

BACKGROUND OF THE INVENTION

The disclosed technology relates generally to methods and tools for micro-transfer-printing. It is often difficult to pick up and place ultra-thin and/or small devices using this technology. Micro transfer printing permits the selection and application of these ultra-thin, fragile, and/or small devices without causing damage to the devices themselves.

Micro-transfer-printing allows for deterministically assembling and integrating arrays of micro-scale, high-performance devices onto non-native substrates. In its simplest embodiment, micro-transfer-printing is analogous to using a rubber stamp to transfer liquid-based inks from an ink-pad onto paper. However, in micro-transfer-printing the "inks" are composed of high-performance solid-state semiconductor devices and the "paper" can be substrates, including plastics and other semiconductors. The micro-transfer-printing process leverages engineered elastomer stamps coupled with high-precision motion-controlled print-heads to selectively pick-up and print large arrays of micro-scale devices onto non-native destination substrates.

Adhesion between the elastomer transfer device and the printable element can be selectively tuned by varying the speed of the print-head. This rate-dependent adhesion is a consequence of the viscoelastic nature of the elastomer used to construct the transfer device. When the transfer device is moved quickly away from a bonded interface, the adhesion is large enough to "pick" the printable elements away from their native substrates, and conversely, when the transfer device is moved slowly away from a bonded interface the adhesion is low enough to "let go" or "print" the element onto a foreign surface. This process may be performed in massively parallel operations in which the stamps can transfer, for example, hundreds to thousands of discrete structures in a single pick-up and print operation.

Micro transfer printing also enables parallel assembly of high-performance semiconductor devices onto virtually any substrate material, including glass, plastics, metals, or other semiconductors. The substrates may be flexible, thereby permitting the production of flexible electronic devices. Flexible substrates may be integrated in a large number of configurations, including configurations not possible with brittle silicon-based electronic devices. Additionally, plastic substrates, for example, are mechanically rugged and may be used to provide electronic devices that are less susceptible to damage or electronic performance degradation caused by mechanical stress. Thus, these materials may be used to fabricate electronic devices by continuous, high-speed, printing techniques capable of generating electronic devices over large substrate areas at low cost (e.g., roll to roll manufacturing).

Moreover, these micro transfer printing techniques can print semiconductor devices at temperatures compatible with assembly on plastic polymer substrates. In addition, semiconductor materials may be printed onto large areas of substrates thereby enabling continuous, high speed printing of complex integrated electrical circuits over large substrate areas. Moreover, fully flexible electronic devices with good electronic performance in flexed or deformed device orientations may be provided to enable a wide range of flexible electronic devices.

Micro-structured stamps may be used to pick up micro devices, transport the micro devices to the destination, and print the micro devices onto a destination substrate. The transfer device (e.g., micro-structured stamp) can be created using various materials. Posts on the transfer device can be generated such that they pick up material from a pick-able object and then print the material to the target substrate. The posts can be generated in an array fashion and can be a range of heights depending on the size of the printable material. Compression (in the z direction) of the transfer device can be used to fully laminate the array of printable objects to the posts of the transfer device. Additionally, compression can be used to allow for a critical velocity to be reached by increasing the distance the stamp is moved at a set acceleration based on the equation $v^2=2ad$.

However, compression of the transfer device poses several issues. Among other things, there is a possibility of sagging between posts. This sag allows for unwanted materials to be picked up from the source substrate. As the span between adjacent posts is increased, the risk of sag causing problems increases. Additionally, there is a crowning effect that can be noted at the edge of the transfer device bulk material that is caused by the coefficient of thermal expansion (CTE) mismatch between the bulk material and the hard plate interface (e.g., glass) as shown, for example, in FIG. 22. Thus, there is a need for techniques that minimize or eliminate at least these issues and increase bonding when devices are printed.

Transfer printing with a visco-elastic stamp material requires a high-velocity separation between stamp and source material to "pick" chips. Typical applications use approximately 1 g of acceleration to accomplish the chip or die "pick" process step. However, the velocity at separation occurs at small distances (e.g., tens of microns or less) dependent on the compression of the stamp at lamination. Thus, there is a need for greater acceleration to create higher separation velocities at small distances that in turn increases the adhesion between the stamp and source.

SUMMARY OF THE INVENTION

As described herein, the present disclosure provides methods and tools for micro transfer printing. In certain embodiments, the disclosed technology utilizes high acceleration when picking up chips from the source wafer. Traditional methods of the "pick" process utilize a vertical stage (with stamp attached) that moves the stamp rapidly upward, away from the substrate. Typically, approximately 1 g of acceleration is used to pick up devices from the native substrate. In certain embodiments, it is advantageous to increase the initial acceleration (5-100 g) to achieve higher velocities during the pick process. The velocity at separation occurs at very small travel distances that are dependent on the compression of the stamp at lamination. Higher acceleration can create higher separation velocities at small distances that in turn increases the adhesion between the stamp and source. Movement of the stamp in the downward direction, away from the source substrate, during the "pick" process can increase the overall acceleration by moving with gravity, and therefore can add an additional 1 g of acceleration to the transfer.

In certain embodiments, heat-assisted micro-transfer-printing is performed to adhesiveless surfaces and topographic surfaces. Polymer encapsulations can be used to enhance transfer of semiconductor devices to non-native substrates when the polymer is designed to contract and then reflow while in contact with the destination substrate. The polymer layer can be subsequently removed while leaving behind the transferred device on the non-native substrate. This also improves the ability to micro-transfer-print to topographic surfaces.

A plasma treatment (e.g., no vacuum required) can be performed during micro transfer printing. The plasma can be applied to bottom surfaces of devices that are attached to an elastomer transfer-element. This treatment of bottom surfaces can be used (i) to provide improved bonding between the devices and destination substrate, (ii) to clean the bottom surface of devices that have been fabricated using epitaxial lift-off methods, and (iii) to remove thin layers of oxides (e.g., Cu—Cu, CuSn—Cu, Cu—Sn—Sn—Cu, Au—Au) from the bottom surface (e.g., if a reducing gas such as forming gas, ammonia, formic acid, etc., is added to the plasma). The treatment can be applied to the devices while they are on the transfer device in a manner in which the devices are un-distributed (e.g., do not fall of the stamp).

In certain embodiments, plasma treatment can be applied to the bottom surfaces of devices that are attached to the transfer device. The treatment can be used to improve bonding between the devices and the destination substrate. The treatment can be used to clean the bottom surfaces and or to remove any layers of oxides from the bottom surfaces. If the devices have a backside metal, the plasma can be used to remove oxides from the surface of the metal.

In certain embodiments, if the devices have a backside metal, the semiconductor elements are printed to a destination substrate with mating metal pads that have been coated with a flux. After transferring the devices, the flux can be reflowed thereby leaving a good metal connection between the pads and the backside metal on the devices.

A crowning effect can be noted at the edge of the transfer device bulk material manufactured using prior art methods. The crowning is caused by the coefficient of thermal expansion (CTE) mismatch between the bulk material and the hard-plate interface (e.g., glass) as shown, for example, in FIG. 22. In certain embodiments, the disclosed technology includes transfer devices designed to eliminate or reduce issues related to crowning. In certain embodiments, the crown is cut with a razor so that printable semiconductor elements are not picked up by the crown during a print operation.

In certain embodiments, a second material is placed between the bulk volume and the hard-plate interface. As a result, the bulk volume material directly above the second material is thinner than it otherwise would be. This produces a smaller crown since there is less material to deform and bulge to form the crown.

In some embodiments, the bezel or sidewall of the bulk volume is such that crowning is minimized. As explained below, certain shape sidewalls result in a transfer device with less crowning.

In certain embodiments, multiple bulk material layers (e.g., viscoelastic material) are provided. The first bulk material layer is on the hard-plate interface and typically has what would normally be a problematic crown. A second bulk material layer is provided on the first bulk material layer. The second bulk material layer is thinner than the first bulk material layer. As the second bulk material layer is thinner, it will have a smaller crown. The posts are placed on the second bulk material layer and are prominent relative to the crown on the second layer of bulk material. Additionally, the posts are prominent relative to the first bulk material layer since the thickness of the second bulk material layer and the height of the posts combined is larger than the crown on the first layer of bulk material.

In certain embodiments, the transfer devices has multi-tiered posts with successively smaller cross sections on successive tiers of posts. A micro-post is formed on a post. The micro-post is used to physically contact the printable semiconductor devices. The micro-post is typically shorter and narrower than the post. The use of multi-tiered posts allows desired aspect ratios for the posts to be maintained while still allowing small devices to be picked up. The height gained by the multi-tiered post can reduce the risk of crowning problems as the height of the post is increased. Additionally, the multi-tiered posts can reduce issues related to sagging.

When a transfer device is compressed during a pickup operation, there is a possibility of sagging between posts. This sag allows for unwanted materials to be picked up from the source substrate. As the span between adjacent posts is increased, the risk of sag causing problems increases.

Multi-tiered posts can be used to increase the height of the posts while maintaining desired aspect ratios for the posts, thus reducing issues related to sagging and crowning. In certain embodiments, anti-sag features are provided between posts on the transfer device. The anti-sag features can have an aspect ratio such that they will not pick up devices. In this manner, the anti-sag posts prevent the body of the bulk material in the transfer device from contacting the source substrate, thereby reducing issues related to sagging.

In certain embodiments, the transfer device is provided with a rough surface between the posts. The rough surface reduces the risk that printable semiconductor elements will be picked up if sagging occurs because the rough surface reduces adhesion.

In one aspect, the disclosed technology includes a method for assembling a semiconductor device on a receiving surface of a destination substrate, the method including: providing the semiconductor device formed on a native substrate; contacting a top surface of the semiconductor device with a conformable transfer device having a contact surface, wherein contact between the contact surface and the top surface of the semiconductor device at least temporarily binds the semiconductor device to the conformable transfer device, separating the semiconductor device from the native substrate such that the contact surface of the conformable transfer device has the semiconductor device disposed thereon with the semiconductor device released from the native substrate; prior to contacting the semiconductor device with the receiving surface of the destination substrate, exposing a backside surface of the semiconductor device to a plasma (e.g., atmospheric plasma) following separation from the native substrate; contacting the semiconductor device disposed on the contact surface with the receiving surface of the destination substrate; and separating the contact surface of the conformable transfer device from the semiconductor device, thereby assembling the semiconductor device on the receiving surface of the destination substrate.

In certain embodiments, exposing the backside surface to plasma improves bonding between the semiconductor device and the receiving substrate of the destination substrate.

In certain embodiments, exposing the backside surface to plasma cleans the backside surface of the semiconductor device.

In certain embodiments, exposing the backside surface to plasma removes thin layers of oxides from the backside surface of the semiconductor device.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a transparency greater than or equal to 50%, 80%, 90%, or 95% for visible light.

In certain embodiments, the native substrate comprises a member selected form the group consisting of inorganic semiconductor material, single crystalline silicon wafers, silicon on insulator wafers, polycrystalline silicon wafers, GaAs wafers, Si (1 1 1), InAlP, InP, GaAs, InGaAs, AlGaAs, GaSb, GaAlSb, AlSb, InSb, InGaAlSbAs, InAlSb, and InGaP.

In certain embodiments, the plasma comprises a reducing gas.

In certain embodiments, the method includes controlling at least one of a duty cycle, residence time, power of the plasma, and distance of the plasma to the semiconductor device to prevent shearing and delamination of the semiconductor devices from the contacting surface of the conformable transfer device.

In certain embodiments, the backside surface of the semiconductor device comprises metal.

In certain embodiments, the metal is at least one of copper, tin, aluminum, and a mixture thereof.

In certain embodiments, the receiving surface of the destination substrate at least in part comprises metal.

In certain embodiments, the metal is at least one of copper, tin, aluminum, and a mixture thereof.

In certain embodiments, conformable transfer device comprises at least one of a visco-elastic stamp and an elastic stamp.

In certain embodiments, the method includes, prior to contacting the semiconductor device disposed on the contact surface with the receiving surface of the destination substrate, separating the conformable transfer device from the native substrate, thereby picking up the semiconductor device from the native substrate.

In certain embodiments, separating the conformable transfer device from the native substrate is performed with an initial acceleration of no less than 5 g (e.g., 5-100 g).

In certain embodiments, said separating the conformable transfer device from the native substrate comprises one or both of the following: (i) moving the conformable transfer device away from the native substrate; and (ii) moving the native substrate away from the conformable transfer device.

In certain embodiments, the conformable transfer device comprises at least one of a cylindrical post, triangular post, rectangular post, pentagonal post, hexagonal post, heptagonal post, and octagonal post.

In certain embodiments, the conformable transfer device comprises a transfer device layer with a plurality of posts, each of the posts shaped to contact an individual semiconductor device from the native substrate, thereby assembling an array of semiconductor devices on the receiving surface of the destination substrate.

In certain embodiments, the conformable transfer device comprises one or more anti-sag posts located between two adjacent posts of the plurality of posts.

In certain embodiments, the anti-sag posts have a height that is less than the height of one or more of the posts.

In certain embodiments, the surface of the transfer device between each post of the plurality of posts is a roughened surface.

In certain embodiments, a bulk volume of the transfer device comprises a first material and the plurality of posts comprise a second material, wherein the plurality of posts are disposed on the bulk volume.

In certain embodiments, the method includes, after contacting the semiconductor device disposed on the contact surface with the receiving surface of the destination substrate, heating, by a heating element, the polymer layer.

In certain embodiments, the method includes, after providing the semiconductor device formed on a native substrate, etching at least a portion of a release layer formed between the semiconductor device and the native substrate.

In certain embodiments, the semiconductor device comprises a unitary inorganic semiconductor structure.

In certain embodiments, the destination substrate comprises Si.

In certain embodiments, the semiconductor device comprises an encapsulating polymer layer.

In certain embodiments, the conformable transfer device comprises one or more anti-sag posts of the same height as the plurality of posts, each anti-sag post located between at least two posts of the plurality of posts.

In certain embodiments, the semiconductor device is assembled on the receiving surface of the destination substrate such that a metal backside surface of the semiconductor device at least partially contacts a flux layer on the destination substrate.

In certain embodiments, the method includes, after assembling the semiconductor device on the receiving surface of the destination substrate, thermally treating the flux layer, thereby securing the metal backside surface to the metal pad.

In certain embodiments, the semiconductor device has a polymer layer disposed on a top surface of the semiconductor device.

In another aspect, the disclosed technology includes a method for assembling a semiconductor device on a receiving surface of a destination substrate, the method including: providing the semiconductor device formed on a native substrate with a polymer layer disposed on a top surface of the semiconductor device; contacting the polymer layer of the semiconductor device with a conformable transfer device having a contact surface, wherein contact between the contact surface and the semiconductor device at least temporarily binds the semiconductor device to the conformable transfer device, separating the semiconductor device from the native substrate so that the semiconductor device is disposed on the contact surface of the conformable transfer device and is released from the native substrate; contacting the semiconductor device disposed on the contact surface to the receiving surface of the destination substrate; heating, by a heating element, the polymer layer, and separating the contact surface of the conformable transfer device from the semiconductor device so that the semiconductor device is transferred onto the receiving surface, thereby assembling the semiconductor device on the receiving surface of the destination substrate.

In certain embodiments, the heating element is a hotplate.

In certain embodiments, the heating element is disposed on a side of the destination substrate opposite the semiconductor device.

In certain embodiments, the destination substrate is non-native to the semiconductor devices.

In certain embodiments, the method includes, after heating the polymer layer, removing, at least in part, the polymer.

In certain embodiments, heat from the heating element reduces a viscosity of the polymer layer and causes the polymer layer to flow.

In certain embodiments, the polymer layer is disposed on the top surface of the semiconductor device and one or more sides of the semiconductor device.

In certain embodiments, the polymer layer encapsulates at least a portion of the printable semiconductor on the native substrate.

In certain embodiments, the receiving surface of the destination substrate comprises a non-planar topographical surface.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a transparency greater than or equal to 50%, 80%, 90%, or 95% tor visible light.

In certain embodiments, the native substrate comprises a member selected form the group consisting of inorganic semiconductor material, single crystalline silicon wafers, silicon on insulator wafers, poly crystalline silicon wafers, GaAs wafers, Si (1 1 1), InAlP, InP, GaAs, InGaAs, AlGaAs, GaSb, GaAlSb, AlSb, InSb, InGaAlSbAs, InAlSb, and InGaP.

In certain embodiments, the semiconductor device is assembled on the receiving surface of the destination substrate such that a metal backside surface of the semiconductor device at least partially contacts a flux layer on the destination substrate.

In certain embodiments, the method includes, after assembling the semiconductor device on the receiving surface of the destination substrate, thermally treating the flux layer, thereby securing the metal backside surface to the metal pad.

In certain embodiments, the method includes, prior to contacting the semiconductor device with the receiving surface of the destination substrate, exposing a backside surface of the semiconductor device, opposite the top surface of the semiconductor device, to plasma following separation from the native substrate.

In another aspect, the disclosed technology includes a method for assembling a semiconductor device on a receiving surface of a destination substrate, the method including: providing the semiconductor device formed on a native substrate, the semiconductor device comprising a metal backside surface; contacting a top surface of the semiconductor device with a conformable transfer device having a contact surface, wherein contact between the contact surface and the semiconductor device at least temporarily binds the semiconductor device to the conformable transfer device; separating the semiconductor device from the native substrate so that the contact surface of the conformable transfer device has the semiconductor device disposed thereon with the semiconductor device released from the native substrate; contacting the semiconductor device disposed on the contact surface with the receiving surface of the destination substrate, wherein the receiving surface comprises a flux layer on a metal pad disposed on the destination substrate; separating the contact surface of the conformable transfer device from the semiconductor device, thereby assembling the semiconductor device on the receiving surface of the destination substrate such that the metal backside surface of the semiconductor device at least partially contacts the flux layer; and exposing the flux layer to heat, thereby securing the metal backside surface to the metal pad.

In certain embodiments, thermally treating the flux layer comprises exposing the flux layer to heat.

In certain embodiments, the flux layer is exposed to heat using a heating element.

In certain embodiments, the heating element is a hotplate.

In certain embodiments, the heating element is disposed on a side of the destination substrate opposite the printable semiconductor device.

In certain embodiments, providing the semiconductor device formed on the native substrate comprises providing the semiconductor device formed on the native substrate with a polymer layer disposed on a top surface of the semiconductor device.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a transparency greater than or equal to 50%, 80%, 90%, or 95% for visible light.

In certain embodiments, the native substrate comprises a member selected form the group consisting of inorganic semiconductor material, single crystalline silicon wafers, silicon on insulator wafers, polycrystalline silicon wafers, GaAs wafers, Si (1 1 1), InAlP, InP, GaAs, InGaAs, AlGaAs, GaSb, GaAlSb, AlSb, InSb, InGaAlSbAs, InAlSb, and InGaP.

In certain embodiments, providing the semiconductor device formed on the native substrate comprises: forming the semiconductor device on the native substrate; and encapsulating the printable semiconductor at least in part with a polymer layer.

In certain embodiments, the semiconductor device formed on the native substrate is encapsulated with a polymer layer.

In certain embodiments, the receiving surface of the destination substrate comprises one or more non-planar topographical features.

In certain embodiments, the one or more non-planar topographic features comprise at least one member selected from the group consisting of mesas, v-shaped channels, and trenches.

In certain embodiments, the semiconductor device has a polymer layer disposed on a top surface of the semiconductor device.

In certain embodiments, the method includes, after contacting the semiconductor device disposed on the contact surface with the receiving surface of the destination substrate, heating, by a heating element, the polymer layer.

In certain embodiments, the method includes, following separation from the native substrate and prior to contacting the semiconductor device with the receiving surface of the destination substrate, exposing to plasma a backside surface of the semiconductor device, opposite the top surface of the semiconductor device.

In another aspect, the disclosed technology includes a conformable transfer device with reduced crowning, the transfer device comprising: a bulk volume having a first surface and a second surface, opposite the first surface, and a side between the first surface and the second surface, wherein the bulk area comprises a tapered surface connecting the side to the first surface; and a plurality of printing posts disposed on the first surface of the bulk volume for picking up printable material, wherein the plurality of printing posts and the bulk volume are arranged such that a force applied to the second surface of the bulk volume is transmitted to the plurality of printing posts.

In certain embodiments, an aspect ratio (height to width) of each post of the plurality of posts is less than or equal to 4:1 (e.g., from 2:1 to 4:1).

In certain embodiments, each post of the plurality of printing posts comprises a contact surface on the end of the post opposite the first surface, wherein the contact surfaces of the plurality of posts are substantially in a same plane.

In certain embodiments, the thickness of plurality of printing posts is from 1 micron to 100 microns (e.g., from 1 to 5 microns, 5 to 10 microns, 10 to 15 microns, 50 to 25 microns, 25 to 40 microns, 40 to 60 microns, 60 to 80 microns, or 80 to 100 microns).

In certain embodiments, the thickness of the bulk volume is from 0.5 mm to 5 mm (e.g., from 0.5 to 1 mm, 1 to 2 mm, 2 to 3 mm, 3 to 4 mm, or 4 to 5 mm).

In certain embodiments, the ratio of the thickness of the plurality of printing posts and the thickness of the bulk volume is from 1:1 to 1:10 (e.g., from 1:1 to 1:2, 1:2 to 1:4, 1:4 to 1:6, 1:6 to 1:8, or 1:8 to 1:10).

In certain embodiments, the bulk volume has a Young's modulus from 1 GPa to 10 GPa (e.g., from 1 to 4 GPa, 4 to 7 GPa, 7 to 10 GPa).

In certain embodiments, the plurality of printing posts have a Young's modulus from 1 MPa to 10 MPa (e.g., from 1 to 4 MPa, 4 to 7 MPa, 7 to 10 MPa).

In certain embodiments, the plurality of printing posts have a first Young's modulus and the base has a second Young's modulus, greater than the first Young's modulus.

In certain embodiments, the bulk volume comprises a polymer having a coefficient of thermal expansion less than or equal to 14.5 ppm.

In certain embodiments, the plurality of printing posts occupy an area selected from 10 $cm^2$ to 260 $cm^2$ (e.g., from 10 $cm^2$ to 40 $cm^2$, 40 $cm^2$ to 80 $cm^2$, 120 $cm^2$ to 160 $cm^2$, 160 $cm^2$ to 200 $cm^2$, 200 $cm^2$ to 240 $cm^2$, or 240 $cm^2$ to 260 $cm^2$).

In certain embodiments, each printing post of the plurality of printing posts has at least one of a width, length, and height from 50 nanometers to 10 micrometers (e.g., 50 nm to 100 nm, 100 nm to 200 nm, 200 nm to 400 nm, 400 nm to 600 nm, 600 nm to 800 nm, 800 nm to 1 micron, 1 micron to 5 microns, or 5 microns to 10 microns).

In certain embodiments, the plurality of printing posts are formed in a continuous, unitary layer.

In certain embodiments, the plurality of printing posts comprises a polymer.

In certain embodiments, the bulk volume is Polydimethylsiloxane (PDMS).

In certain embodiments, the bulk volume and the plurality of printing posts are formed from a single material.

In certain embodiments, a least a portion of the posts are arranged on the first surface from 1 mm to 15 mm away from a edge of the first surface (e.g., from 1 mm to 5 mm or 5 mm to 10 mm, 10 mm to 15 mm from the edge).

In certain embodiments, the bulk volume has a side surface between the first and second surfaces.

In certain embodiments, the side surface has a beveled and/or rounded edge.

In certain embodiments, the side surface has a rounded profile (e.g., convex or concave).

In certain embodiments, the side surface has a beveled edge forming an angle from horizontal (parallel to the first surface) of no greater than 75° (e.g., no greater than 60°, no greater than 45°, no greater than 30°, or no greater than 15°).

In another aspect, the disclosed technology includes a conformable transfer device comprising an elastomer (e.g., PDMS) slab (e.g., bulk volume) having a mesa configuration with a surface upon which a plurality of (e.g., array of) posts are disposed, wherein one or more of the following holds [any of (i), (ii), and/or (iii)]: (i) the edge of the mesa has a beveled and/or rounded edge so as to reduce distortion of the surface and allow accurate spacing of the plurality of posts; (ii) the plurality of posts are arranged on the surface at least 1 mm away from the edge (e.g., from 1 mm to 5 mm or 5 mm to 20 mm from the edge); and (iii) the mesa has a thickness no greater than 10 mm (e.g., from 1 to 5 mm).

In certain embodiments, the edge of the mesa has a beveled edge forming an angle from horizontal (parallel to the surface) of no greater than 75° (e.g., no greater than 60°, no greater than 45°, no greater than 30°, or no greater than 15°).

In certain embodiments, the edge of the mesa has a rounded profile (e.g., convex or concave).

In certain embodiments, the device includes a substrate (e.g., glass) upon which the elastomer slab is disposed.

In certain embodiments, an aspect ratio (height to width) of each post of the plurality of posts is less than or equal to 4:1 (e.g., from 2:1 to 4:1).

In certain embodiments, each post of the plurality of printing posts comprises a contact surface on the end of the post opposite the first surface, wherein the contact surfaces of the plurality of posts are substantially in a same plane.

In certain embodiments, the thickness of the posts is from 1 micron to 100 microns (e.g., from 1 to 5 microns, 5 to 10 microns, 10 to 15 microns, 50 to 25 microns, 25 to 40 microns, 40 to 60 microns, 60 to 80 microns, or 80 to 100 microns).

In certain embodiments, the thickness of the mesa is from 0.5 mm to 5 mm (e.g., from 0.5 to 1 mm, 1 to 2 mm, 2 to 3 mm, 3 to 4 mm, or 4 to 5 mm).

In certain embodiments, the ratio of the thickness of the plurality of posts to the thickness of the mesa is from 1:1 to 1:10 (e.g., from 1:1 to 1:2, 1:2 to 1:4, 1:4 to 1:6, 1:6 to 1:8, or 1:8 to 1:10).

In certain embodiments, the mesa has a Young's modulus from 1 GPa to 10 GPa (e.g., from 1 to 4 GPa, 4 to 7 GPa, 7 to 10 GPa).

In certain embodiments, the posts have a Young's modulus from 1 MPa to 10 MPa (e.g., from 1 to 4 MPa, 4 to 7 MPa, 7 to 10 MPa).

In certain embodiments, the posts have a first Young's modulus and the mesa has a second Young's modulus, greater than the first Young's modulus.

In certain embodiments, the posts have a Young's modulus from 1 MPa to 5 MPa.

In certain embodiments, the mesa comprises a polymer having a coefficient of thermal expansion less than or equal to 14.5 ppm.

In certain embodiments, the posts occupy an area selected from 10 $cm^2$ to 260 $cm^2$ (e.g., from 10 $cm^2$ to 40 $cm^2$, 40 $cm^2$ to 80 $cm^2$, 120 $cm^2$ to 160 $cm^2$, 160 $cm^2$ to 200 $cm^2$, 200 $cm^2$ to 240 $cm^2$, or 240 $cm^2$ to 260 $cm^2$).

In certain embodiments, each post of the posts has at least one of a width, length, and height from 50 nanometers to 10 micrometers (e.g., 50 nm to 100 nm, 100 nm to 200 nm, 200 nm to 400 nm, 400 nm to 600 nm, 600 nm to 800 nm, 800 nm to 1 micron, 1 micron to 5 microns, or 5 microns to 10 microns).

In certain embodiments, the posts are formed in a continuous, unitary layer.

In certain embodiments, the posts comprises a polymer.

In certain embodiments, the mesa is Poly dimethyl siloxane (PDMS).

In certain embodiments, the mesa and the posts are formed from a single material.

In another aspect, the disclosed technology includes a conformable transfer device, the transfer device including: a bulk volume having a first surface and a second surface, opposite the first surface; a mesa disposed on the bulk volume, a layer comprising a plurality of posts (e.g., array of posts) disposed on the mesa, opposite the bulk volume, for picking up printable material, wherein the plurality of posts, the mesa, and the bulk volume are arranged such that a force applied to the second surface of the bulk volume is transmitted to the plurality of posts.

In certain embodiments, a thickness of the mesa is greater than a thickness of the posts.

In certain embodiments, an aspect ratio (height to width) of each post of the plurality of posts is less than or equal to 4:1 (e.g., from 2:1 to 4:1).

In certain embodiments, each post of the plurality of printing posts comprises a contact surface on the end of the post opposite the first surface, wherein the contact surfaces of the plurality of posts are substantially in a same plane.

In certain embodiments, the thickness of the posts is from 1 micron to 100 microns (e.g., from 1 to 5 microns, 5 to 10 microns, 10 to 15 microns, 50 to 25 microns, 25 to 40 microns, 40 to 60 microns, 60 to 80 microns, or 80 to 100 microns).

In certain embodiments, a thickness of the bulk volume is from 0.5 mm to 5 mm (e.g., from 0.5 to 1 mm, 1 to 2 mm, 2 to 3 mm, 3 to 4 mm, or 4 to 5 mm).

In certain embodiments, a ratio of a thickness of the posts to a thickness of the bulk volume is from 1:1 to 1:10 (e.g., from 1:1 to 1:2, 1:2 to 1:4, 1:4 to 1:6, 1:6 to 1:8, or 1:8 to 1:10).

In certain embodiments, the bulk volume has a Young's modulus from 1 GPa to 10 GPa (e.g., from 1 to 4 GPa, 4 to 7 GPa, 7 to 10 GPa).

In certain embodiments, the posts have a Young's modulus from 1 MPa to 10 MPa (e.g., from 1 to 4 MPa, 4 to 7 MPa, 7 to 10 MPa).

In certain embodiments, the posts have a first Young's modulus and the bulk volume has a second Young's modulus, greater than the first Young's modulus.

In certain embodiments, the mesa has the first Young's modulus.

In certain embodiments, the mesa has the second Young's modulus.

In certain embodiments, the bulk volume comprises a polymer having a coefficient of thermal expansion less than or equal to 14.5 ppm.

In certain embodiments, the posts occupy an area selected from 10 cm$^2$ to 260 cm$^2$ (e.g., from 10 cm$^2$ to 40 cm$^2$, 40 cm$^2$ to 80 cm$^2$, 120 cm$^2$ to 160 cm$^2$, 160 cm$^2$ to 200 cm$^2$, 200 cm$^2$ to 240 cm$^2$, or 240 cm$^2$ to 260 cm$^2$).

In certain embodiments, each post of the plurality of posts has at least one of a width, length, and height from 50 nanometers to 10 micrometers (e.g., 50 nm to 100 nm, 100 nm to 200 nm, 200 nm to 400 nm, 400 nm to 600 nm, 600 nm to 800 nm, 800 nm to 1 micron, 1 micron to 5 microns, or 5 microns to 10 microns).

In certain embodiments, the posts are formed in a continuous, unitary layer.

In certain embodiments, the posts comprise a polymer.

In certain embodiments, the bulk volume is Polydimethylsiloxane (PDMS).

In certain embodiments, the bulk volume and the posts are formed from a single material.

In certain embodiments, a least a portion of the posts are arranged on the first surface from 1 mm to 15 mm away from a edge of the first surface (e.g., from 1 mm to 5 mm or 5 mm to 10 mm, 10 mm to 15 mm from the edge).

In certain embodiments, the bulk volume has a side surface between the first and second surfaces.

In certain embodiments, the side surface has a beveled and/or rounded edge.

In certain embodiments, the side surface has a rounded profile (e.g., convex or concave).

In certain embodiments, the side surface has a beveled edge forming an angle from horizontal (parallel to the first surface) of no greater than 75° (e.g., no greater than 60°, no greater than 45°, no greater than 30°, or no greater than 15°).

In another aspect, the disclosed technology includes a method of modifying a conformable transfer device to reduce crowning, the method comprising providing a transfer device comprising: a bulk volume having a first surface and a second surface, opposite the first surface, and one or more sides between the first surface and the second surface; a plurality of printing posts disposed on the first surface of the bulk volume for picking up printable material, wherein the plurality of printing posts and the bulk volume are arranged such that a force applied to the second surface of the bulk volume is transmitted to the plurality of printing posts; and cutting an edge of the first surface of the bulk substrate at an non-zero angle with respect to the first surface, thereby reducing crowning at the edge.

In certain embodiments, an aspect ratio (height to width) of each post of the plurality of posts is less than or equal to 4:1 (e.g., from 2:1 to 4:1).

In certain embodiments, each post of the plurality of printing posts comprises a contact surface on the end of the post opposite the first surface, wherein the contact surfaces of the plurality of posts are substantially in a same plane.

In certain embodiments, a thickness of plurality of printing posts is from 1 micron to 100 microns (e.g., from 1 to 5 microns, 5 to 10 microns, 10 to 15 microns, 50 to 25 microns, 25 to 40 microns, 40 to 60 microns, 60 to 80 microns, or 80 to 100 microns).

In certain embodiments, a thickness of the bulk volume is from 0.5 mm to 5 mm (e.g., from 0.5 to 1 mm, 1 to 2 mm, 2 to 3 mm, 3 to 4 mm, or 4 to 5 mm).

In certain embodiments, a ratio of a thickness of the plurality of printing posts and a thickness of the bulk volume is from 1:1 to 1:10 (e.g., from 1:1 to 1:2, 1:2 to 1:4, 1:4 to 1:6, 1:6 to 1:8, or 1:8 to 1:10).

In certain embodiments, the bulk volume has a Young's modulus from 1 GPa to 10 GPa (e.g., from 1 to 4 GPa, 4 to 7 GPa, 7 to 10 GPa).

In certain embodiments, the plurality of printing posts have a Young's modulus from 1 MPa to 10 MPa (e.g., from 1 to 4 MPa, 4 to 7 MPa, 7 to 10 MPa).

In certain embodiments, the plurality of printing posts have a first Young's modulus and the bulk volume has a second Young's modulus, greater than the first Young's modulus.

In certain embodiments, the bulk volume comprises a polymer having a coefficient of thermal expansion less than or equal to 14.5 ppm.

In certain embodiments, the plurality of printing posts occupy an area selected from 10 cm² to 260 cm² (e.g., from 10 cm² to 40 cm², 40 cm² to 80 cm², 120 cm² to 160 cm², 160 cm² to 200 cm², 200 cm² to 240 cm², or 240 cm² to 260 cm²).

In certain embodiments, each printing post of the plurality of printing posts has at least one of a width, length, and height from 50 nanometers to 10 micrometers (e.g., 50 nm to 100 nm, 100 nm to 200 nm, 200 nm to 400 nm, 400 nm to 600 nm, 600 nm to 800 nm, 800 nm to 1 micron, 1 micron to 5 microns, or 5 microns to 10 microns).

In certain embodiments, the plurality of printing posts are formed in a continuous, unitary layer.

In certain embodiments, the plurality of printing posts comprises a polymer.

In certain embodiments, the bulk volume is Polydimethylsiloxane (PDMS).

In certain embodiments, the bulk volume and the plurality of printing posts are formed from a single material.

In certain embodiments, a least a portion of the posts are arranged on the first surface from 1 mm to 15 mm away from a edge of the first surface (e.g., from 1 mm to 5 mm or 5 mm to 10 mm, 10 mm to 15 mm from the edge).

In certain embodiments, the bulk volume has a side surface between the first and second surfaces.

In certain embodiments, the side surface has a beveled and/or rounded edge.

In certain embodiments, the side surface has a rounded profile (e.g., convex or concave).

In certain embodiments, the side surface has a beveled edge forming an angle from horizontal (parallel to the first surface) of no greater than 75° (e.g., no greater than 60°, no greater than 45°, no greater than 30°, or no greater than 15°).

In another aspect, the disclosed technology includes a conformable transfer device, the transfer device including: a bulk volume having a first surface and a second surface, opposite the first surface; and a plurality of posts disposed on the first surface of the bulk volume for picking up printable material, wherein each posts comprises a base section and a top section, wherein the top section has a cross-sectional area smaller than that of the base section (e.g., less than 50%, 30%, 25%, 10% of the cross-sectional area of the base section).

In certain embodiments, each of the plurality of posts comprises a contact surface on the end of the post opposite the first surface, wherein the contact surfaces of the plurality of posts are substantially in a same plane.

In certain embodiments, a thickness of posts ranges from 1 micron to 100 microns (e.g., from 1 to 5 microns, 5 to 10 microns, 10 to 15 microns, 50 to 25 microns, 25 to 40 microns, 40 to 60 microns, 60 to 80 microns, or 80 to 100 microns).

In certain embodiments, a thickness of the bulk volume is from 0.5 mm to 5 mm (e.g., from 0.5 to 1 mm, 1 to 2 mm, 2 to 3 mm, 3 to 4 mm, or 4 to 5 mm).

In certain embodiments, a ratio of a thickness of the posts to a thickness of the bulk volume is from 1:1 to 1:10 (e.g., from 1:1 to 1:2, 1:2 to 1:4, 1:4 to 1:6, 1:6 to 1:8, or 1:8 to 1:10).

In certain embodiments, the bulk volume has a Young's modulus from 1 GPa to 10 GPa (e.g., from 1 to 4 GPa, 4 to 7 GPa, 7 to 10 GPa).

In certain embodiments, the posts have a Young's modulus from 1 MPa to 10 MPa (e.g., from 1 to 4 MPa, 4 to 7 MPa, 7 to 10 MPa).

In certain embodiments, the posts have a first Young's modulus and a base has a second Young's modulus, greater than the first Young's modulus.

In certain embodiments, the bulk volume comprises a polymer having a coefficient of thermal expansion less than or equal to 14.5 ppm.

In certain embodiments, the posts occupy an area selected from 10 cm² to 260 cm² (e.g., from 10 cm² to 40 cm², 40 cm² to 80 cm², 120 cm² to 160 cm², 160 cm² to 200 cm², 200 cm² to 240 cm², or 240 cm² to 260 cm²).

In certain embodiments, each post of the plurality of posts has at least one of a width, length, and height from 50 nanometers to 10 micrometers (e.g., 50 nm to 100 nm, 100 ran to 200 nm, 200 nm to 400 nm, 400 nm to 600 nm, 600 nm to 800 nm, 800 nm to 1 micron, 1 micron to 5 microns, or 5 microns to 10 microns).

In certain embodiments, the posts are formed in a continuous, unitary layer.

In certain embodiments, the posts comprise a polymer.

In certain embodiments, the bulk volume is Polydimethylsiloxane (PDMS).

In certain embodiments, the bulk volume and the posts are formed from a single material.

In certain embodiments, an aspect ratio (height to width) of each post of the plurality of posts is less than or equal to 4:1 (e.g., from 2:1 to 4:1).

In certain embodiments, the bulk volume has a side surface between the first and second surfaces.

In certain embodiments, the side surface has a beveled and/or rounded edge.

In certain embodiments, the side surface has a rounded profile (e.g., convex or concave).

In certain embodiments, the side surface has a beveled edge forming an angle from horizontal (parallel to the first surface) of no greater than 75° (e.g., no greater than 60°, no greater than 45°, no greater than 30°, or no greater than 15°).

In certain embodiments, a least a portion of the posts are arranged on the first surface from 1 mm to 15 mm away from a edge of the first surface (e.g., from 1 mm to 5 mm or 5 mm to 10 mm, 10 mm to 15 mm from the edge).

In another aspect, the disclosed technology includes a conformable transfer device, the transfer device including: a bulk volume having a first surface and a second surface, opposite the first surface; a plurality of printing posts disposed on the first surface of the bulk volume for picking up printable material; a plurality of anti-sag posts disposed on the first surface of the bulk volume for preventing the first surface of the bulk volume from sagging and inadvertently picking up printable material when printable material is picked up by the plurality of printing posts, wherein the plurality of printing posts and the bulk volume are arranged such that a force applied to the second surface of the bulk volume is transmitted to the plurality of printing posts.

In certain embodiments, the plurality of printing posts and the plurality of anti-sag posts are disposed on a connecting layer positioned between the plurality of printing posts and the plurality of anti-sag posts.

In certain embodiments, the connecting layer comprises a thin metal layer.

In certain embodiments, each of the plurality of posts comprises a contact surface on the end of the post opposite the first surface, wherein the contact surfaces of the plurality of posts are substantially in a same plane.

In certain embodiments, a thickness of the printing posts is from 1 micron to 100 microns (e.g., from 1 to 5 microns, 5 to 10 microns, 10 to 15 microns, 50 to 25 microns, 25 to 40 microns, 40 to 60 microns, 60 to 80 microns, or 80 to 100 microns).

In certain embodiments, a thickness of the bulk volume is from 0.5 mm to 5 mm (e.g., from 0.5 to 1 mm, 1 to 2 mm, 2 to 3 mm, 3 to 4 mm, or 4 to 5 mm).

In certain embodiments, a ratio of a thickness of the printing posts to a thickness of the bulk volume is from 1:1 to 1:10 (e.g., from 1:1 to 1:2, 1:2 to 1:4, 1:4 to 1:6, 1:6 to 1:8, or 1:8 to 1:10).

In certain embodiments, the bulk volume has a Young's modulus from 1 GPa to 10 GPa (e.g., from 1 to 4 GPa, 4 to 7 GPa, 7 to 10 GPa).

In certain embodiments, the printing posts have a Young's modulus from 1 MPa to 10 MPa (e.g., from 1 to 4 MPa, 4 to 7 MPa, 7 to 10 MPa).

In certain embodiments, the printing posts have a first Young's modulus and the bulk volume has a second Young's modulus, greater than the first Young's modulus.

In certain embodiments, the bulk volume comprises a polymer having a coefficient of thermal expansion less than or equal to 14.5 ppm.

In certain embodiments, the printing posts occupy an area selected from 10 $cm^2$ to 260 $cm^2$ (e.g., from 10 $cm^2$ to 40 $cm^2$, 40 $cm^2$ to 80 $cm^2$, 120 $cm^2$ to 160 $cm^2$, 160 $cm^2$ to 200 $cm^2$, 200 $cm^2$ to 240 $cm^2$, or 240 $cm^2$ to 260 $cm^2$).

In certain embodiments, each of the printing posts has at least one of a width, length, and height from 50 nanometers to 10 micrometers (e.g., 50 nm to 100 nm, 100 nm to 200 nm, 200 nm to 400 nm, 400 nm to 600 nm, 600 nm to 800 nm, 800 nm to 1 micron, 1 micron to 5 microns, or 5 microns to 10 microns).

In certain embodiments, the printing posts are formed in a continuous, unitary layer.

In certain embodiments, the printing posts comprise a polymer.

In certain embodiments, the bulk volume is Polydimethylsiloxane (PDMS).

In certain embodiments, the bulk volume and the printing posts are formed from a single material.

In certain embodiments, the anti-sag posts are interspersed between the printing posts.

In certain embodiments, the plurality of anti-sag posts have a greater modulus than the printing posts.

In certain embodiments, an aspect ratio (height to width) of each post of the posts is less than or equal to 4:1 (e.g., from 2:1 to 4:1).

In certain embodiments, a least a portion of the posts are arranged on the first surface from 1 mm to 15 mm away from a edge of the first surface (e.g., from 1 mm to 5 mm or 5 mm to 10 mm, 10 mm to 15 mm from the edge).

In certain embodiments, the bulk volume has a side surface between the first and second surfaces.

In certain embodiments, the side surfaces has a beveled and/or rounded edge.

In certain embodiments, the side surface has a rounded profile (e.g., convex or concave).

In certain embodiments, the side surface has a beveled edge forming an angle from horizontal (parallel to the first surface) of no greater than 75° (e.g., no greater than 60°, no greater than 45°, no greater than 30°, or no greater than 15°).

In another aspect, the disclosed technology includes a conformable transfer device, the transfer device including: a bulk volume having a first surface and a second surface, opposite the first surface; and a plurality of posts disposed on the first surface of the bulk volume for picking up printable material, wherein the plurality of posts and the bulk volume are arranged such that a force applied to the second surface of the bulk volume is transmitted to the plurality of posts, wherein a portion of the area of the first surface unoccupied by the plurality of posts comprises a roughened area (e.g., thereby anti-sagging).

In certain embodiments, the roughened area comprises a plurality of features, each feature having a width less than the width of each post and a height less than the height of each post.

In certain embodiments, the roughened area is located on the first surface between the posts.

In certain embodiments, the roughened area comprises a patterned array of features.

In certain embodiments, the roughened area comprises a random array of features.

In certain embodiments, each of the plurality of posts comprises a contact surface on the end of the post opposite the first surface, wherein the contact surfaces of the plurality of posts are substantially in a same plane.

In certain embodiments, a thickness of posts is from 1 micron to 100 microns (e.g., from 1 to 5 microns, 5 to 10 microns, 10 to 15 microns, 50 to 25 microns, 25 to 40 microns, 40 to 60 microns, 60 to 80 microns, or 80 to 100 microns).

In certain embodiments, a thickness of the bulk volume is from 0.5 mm to 5 mm microns (e.g., from 0.5 to 1 mm, 1 to 2 mm, 2 to 3 mm, 3 to 4 mm, or 4 to 5 mm).

In certain embodiments, a ratio of a thickness of the posts and a thickness of the bulk volume is from 1:1 to 1:10 (e.g., from 1:1 to 1:2, 1:2 to 1:4, 1:4 to 1:6, 1:6 to 1:8, or 1:8 to 1:10).

In certain embodiments, the bulk volume has a Young's modulus from 1 GPa to 10 GPa (e.g., from 1 to 4 GPa, 4 to 7 GPa, 7 to 10 GPa).

In certain embodiments, the posts have a Young's modulus from 1 MPa to 10 MPa (e.g., from 1 to 4 MPa, 4 to 7 MPa, 7 to 10 MPa).

In certain embodiments, the posts have a first Young's modulus and the bulk volume has a second Young's modulus, greater than the first Young's modulus.

In certain embodiments, the bulk volume comprises a polymer having a coefficient of thermal expansion less than or equal to 14.5 ppm.

In certain embodiments, the posts occupy an area selected from 10 $cm^2$ to 260 $cm^2$ (e.g., from 10 $cm^2$ to 40 $cm^2$, 40 $cm^2$ to 80 $cm^2$, 120 $cm^2$ to 160 $cm^2$, 160 $cm^2$ to 200 $cm^2$, 200 $cm^2$ to 240 $cm^2$, or 240 $cm^2$ to 260 $cm^2$).

In certain embodiments, each of the posts has at least one of a width, length, and height from 50 nanometers to 10 micrometers.

In certain embodiments, the posts are formed in a continuous, unitary layer.

In certain embodiments, the posts comprise a polymer.

In certain embodiments, the bulk volume is PDMS.

In certain embodiments, the bulk volume and the posts are formed from a single material.

In certain embodiments, the conformable transfer device is a visco-elastomeric stamp.

In certain embodiments, the conformable transfer device is an elastomeric stamp.

In certain embodiments, the elastomer stamp is made of Polydimethylsiloxane (PDMS).

In certain embodiments, an aspect ratio (height to width) of each post of the posts is less than or equal to 4:1 (e.g., from 2:1 to 4:1).

In certain embodiments, the posts are arranged on the first surface from 1 mm to 15 mm away from a edge of the first surface (e.g., from 1 mm to 5 mm or 5 mm to 10 mm, 10 mm to 15 mm from the edge).

In certain embodiments, the bulk volume has a side surface between the first and second surfaces.

In certain embodiments, the side surfaces has a beveled and/or rounded edge.

In certain embodiments, the side surface has a rounded profile (e.g., convex or concave).

In certain embodiments, the side surface has a beveled edge forming an angle from horizontal (parallel to the first surface) of no greater than 75° (e.g., no greater than 60°, no greater than 45°, no greater than 30°, or no greater than 15°).

In another aspect, the disclosed technology includes a conformable transfer device, the transfer device including: a base comprising a first material; a sub-base comprising a second material and disposed on the base (e.g., wherein the sub-base has a smaller cross-sectional area than the base); a bulk volume comprising a material different from the base and the sub-base and disposed at least partly on the sub-base (e.g., and also at least partly at the base), wherein a thickness of a portion of the bulk volume that is disposed on the sub-base is less than a thickness of the sub-base; and a plurality of posts disposed on the bulk volume, opposite and above the sub-base, for picking up printable material, wherein the plurality of posts, the base, the sub-base, and the bulk volume are arranged such that a force applied to a surface of the base opposite the sub-base is transmitted to the plurality of posts.

In certain embodiments, the first material comprises glass.

In certain embodiments, the first and second materials are the same.

In certain embodiments, the bulk volume and the plurality of posts are formed from a single material.

In certain embodiments, the bulk volume comprises a polymer.

In certain embodiments, the first material is transparent.

In certain embodiments, the second material is transparent.

In certain embodiments, each of the plurality of posts comprises a contact surface on the end of the post opposite the bulk volume, wherein the contact surfaces of the plurality of posts are substantially in a same plane.

In certain embodiments, a thickness of the posts is from 1 micron to 100 microns (e.g., from 1 to 5 microns, 5 to 10 microns, 10 to 15 microns, 50 to 25 microns, 25 to 40 microns, 40 to 60 microns, 60 to 80 microns, or 80 to 100 microns).

In certain embodiments, a thickness of the bulk volume is from 0.5 mm to 5 mm (e.g., from 0.5 to 1 mm, 1 to 2 mm, 2 to 3 mm, 3 to 4 mm, or 4 to 5 mm).

In certain embodiments, a ratio of a thickness of the posts to a thickness of the bulk volume is from 1:1 to 1:10 (e.g., from 1:1 to 1:2, 1:2 to 1:4, 1:4 to 1:6, 1:6 to 1:8, or 1:8 to 1:10).

In certain embodiments, the bulk volume has a Young's modulus from 1 GPa to 10 GPa (e.g., from 1 to 4 GPa, 4 to 7 GPa, 7 to 10 GPa).

In certain embodiments, the posts have a Young's modulus from 1 MPa to 10 MPa (e.g., from 1 to 4 MPa, 4 to 7 MPa, 7 to 10 MPa).

In certain embodiments, the posts have a first Young's modulus and the base has a second Young's modulus, greater than the first Young's modulus.

In certain embodiments, the bulk volume comprises a polymer having a coefficient of thermal expansion less than or equal to 14.5 ppm.

In certain embodiments, the posts occupy an area selected from 10 cm² to 260 cm² (e.g., from 10 cm² to 40 cm², 40 cm² to 80 cm², 120 cm² to 160 cm², 160 cm² to 200 cm², 200 cm² to 240 cm², or 240 cm² to 260 cm²).

In certain embodiments, each post of the plurality of posts has at least one of a width, length, and height from 50 nanometers to 10 micrometers (e.g., 50 nm to 100 nm, 100 nm to 200 nm, 200 nm to 400 nm, 400 nm to 600 nm, 600 nm to 800 nm, 800 nm to 1 micron, 1 micron to 5 microns, or 5 microns to 10 microns).

In certain embodiments, the posts are formed in a continuous, unitary layer.

In certain embodiments, the posts comprise a polymer.

In certain embodiments, the bulk volume is Polydimethylsiloxane (PDMS).

In certain embodiments, the bulk volume has a greater modulus than the posts.

In certain embodiments, an aspect ratio (height to width) of each post of the posts is less than or equal to 4:1 (e.g., from 2:1 to 4:1).

In certain embodiments, a least a portion of the posts are arranged on the first surface from 1 mm to 15 mm away from a edge of the first surface (e.g., from 1 mm to 5 mm or 5 mm to 10 mm, 10 mm to 15 mm from the edge).

In certain embodiments, the bulk volume has a side surface between the first and second surfaces.

In certain embodiments, the side surface has a beveled and/or rounded edge.

In certain embodiments, the side surface has a rounded profile (e.g., convex or concave).

In certain embodiments, the side surface has a beveled edge forming an angle from horizontal (parallel to the first surface) of no greater than 75° (e.g., no greater than 60°, no greater than 45°, no greater than 30°, or no greater than 15°).

In another aspect, the disclosed technology includes a conformable transfer device, the transfer device including; a bulk volume having a first surface and a second surface, opposite the first surface, wherein the bulk volume has a first composition; a plurality of posts disposed on the first surface of the bulk volume for picking up printable material, wherein the plurality of posts, and the bulk volume are arranged so that a force applied to the second surface of the base by the base is transmitted to the plurality of posts, wherein at least a part of (e.g., all of each post or a top portion of each post) each post has a second composition different from the first composition.

In certain embodiments, at least a part of each post has the second composition.

In certain embodiments, a bottom portion of each post closest to the bulk volume has the second composition.

In certain embodiments, the first composition comprises a polymer.

In certain embodiments, the second composition comprises a polymer.

In certain embodiments, the first composition comprises a hardener.

In certain embodiments, the second composition comprises a hardener.

In certain embodiments, the base is glass.

In certain embodiments, each post of the plurality of posts comprises a contact surface on the end of the post opposite the first surface, wherein the contact surfaces of the plurality of posts are in substantially a same plane.

In certain embodiments, a thickness of the posts is from 1 micron to 100 microns (e.g., from 1 to 5 microns, 5 to 10 microns, 10 to 15 microns, 50 to 25 microns, 25 to 40 microns, 40 to 60 microns, 60 to 80 microns, or 80 to 100 microns).

In certain embodiments, a thickness of the bulk volume is from 0.5 mm to 5 mm (e.g., from 0.5 to 1 mm, 1 to 2 mm, 2 to 3 mm, 3 to 4 mm, or 4 to 5 mm).

In certain embodiments, a ratio of a thickness of the posts and a thickness of the bulk volume is from 1:1 to 1:10 (e.g., from 1:1 to 1:2, 1:2 to 1:4, 1:4 to 1:6, 1:6 to 1:8, or 1:8 to 1:10).

In certain embodiments, the bulk volume has a Young's modulus from 1 GPa to 10 GPa (e.g., from 1 to 4 GPa, 4 to 7 GPa, 7 to 10 GPa).

In certain embodiments, the posts have a Young's modulus from 1 MPa to 10 MPa (e.g., from 1 to 4 MPa, 4 to 7 MPa, 7 to 10 MPa).

In certain embodiments, the posts have a first Young's modulus and the base has a second Young's modulus, greater than the first Young's modulus.

In certain embodiments, the bulk volume comprises a polymer having a coefficient of thermal expansion less than or equal to 14.5 ppm.

In certain embodiments, the posts occupy an area selected from 10 cm² to 260 cm² (e.g., from 10 cm² to 40 cm², 40 cm² to 80 cm², 120 cm² to 160 cm², 160 cm² to 200 cm², 200 cm² to 240 cm², or 240 cm² to 260 cm²).

In certain embodiments, each post of the plurality of posts has at least one of a width, length, and height from 50 nanometers to 10 micrometers (e.g., 50 nm to 100 nm, 100 nm to 200 nm, 200 nm to 400 nm, 400 nm to 600 nm, 600 nm to 800 nm, 800 nm to 1 micron, 1 micron to 5 microns, or 5 microns to 10 microns).

In certain embodiments, the posts are formed in a continuous, unitary layer.

In certain embodiments, an aspect ratio (height to width) of each post of the plurality of posts is less than or equal to 4:1 (e.g., from 2:1 to 4:1).

In certain embodiments, a least a portion of the posts are arranged on the first surface from 1 mm to 15 mm away from a edge of the first surface (e.g., from 1 mm to 5 mm or 5 mm to 10 mm, 10 mm to 15 mm from the edge).

In certain embodiments, the bulk volume has a side surface between the first and second surfaces.

In certain embodiments, the side surface has a beveled and/or rounded edge.

In certain embodiments, the side surface has a rounded profile (e.g., convex or concave).

In certain embodiments, the side surface has a beveled edge forming an angle from horizontal (parallel to the first surface) of no greater than 75° (e.g., no greater than 60°, no greater than 45°, no greater than 30°, or no greater than 15°).

BRIEF DESCRIPTION OF THE FIGURES

The foregoing and other objects, aspects, features, and advantages of the present disclosure will become more apparent and better understood by referring to the following description taken in conjunction with the accompanying drawings.

FIGS. 1A through 1C are illustrations of heat-assisted micro-transfer-printing with photoresist encapsulation.

FIGS. 13A and 13B are illustrations of a typical transfer device and sag occurring during compression.

FIGS. 14A and 14B are illustrations of a multi-tiered stamp.

FIG. 16 is an illustration of a casting for forming a transfer device with multi-layer posts.

FIGS. 18 and 19 are diagrams of examples of the anti-sag features.

Figure 2A:
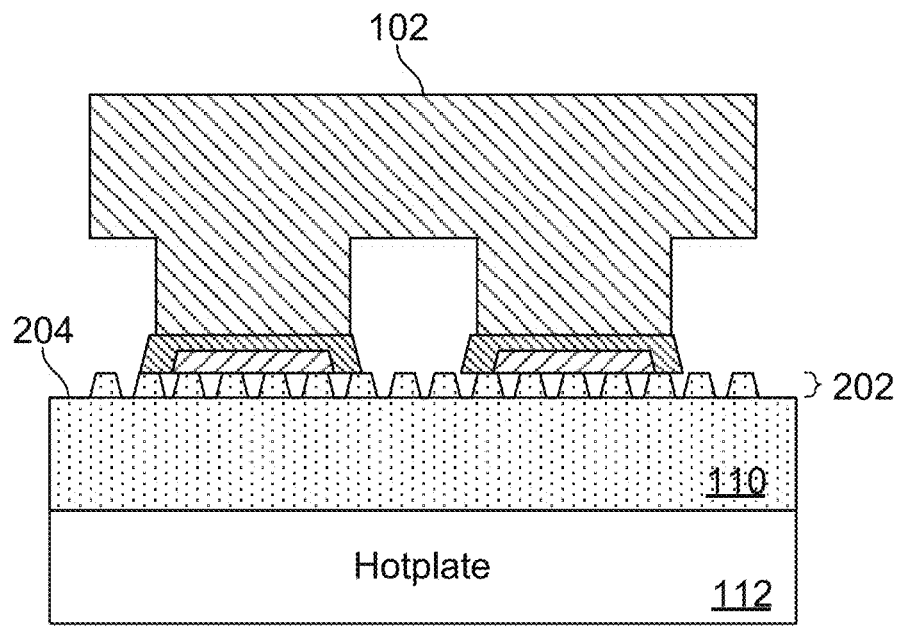
FIGS. 2A and 2B are illustrations of heat-assisted printing of semiconductor elements onto a destination, non-native substrate having topographic features.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF THE INVENTION

As used herein the expression "semiconductor element" and "semiconductor structure" are used synonymously and broadly refer to a semiconductor material, structure, device, or component of a device. Semiconductor elements include high-quality single crystalline and polycrystalline semiconductors, semiconductor materials fabricated via high-temperature processing, doped semiconductor materials, organic and inorganic semiconductors, and composite semiconductor materials and structures having one or more additional semiconductor components or n on-semi conductor components, such as dielectric layers or materials or conducting layers or materials. Semiconductor elements include semiconductor devices and device components including, but not limited to, transistors, photovoltaics including solar cells, diodes, light-emitting diodes, lasers, p-n junctions, photodiodes, integrated circuits, and sensors. In addition, semiconductor element can refer to a part or portion that forms a functional semiconductor device or product.

"Semiconductor" refers to any material that is a material that is an insulator at a very low temperature, but which has an appreciable electrical conductivity at temperatures of about 300 Kelvin. The electrical characteristics of a semiconductor can be modified by the addition of impurities or dopants and controlled by the use of electrical fields. In the present description, use of the term semiconductor is intended to be consistent with use of this term in the art of microelectronics and electronic devices. Semiconductors useful in the present invention can include elemental semiconductors, such as silicon, germanium and diamond, and compound semiconductors, for example group IV compound semiconductors such as SiC and SiGe, group III-V semiconductors such as AlSb, AlAs, Aln, AlP, BN, GaSh, GaAs, GaN, GaP, InSb, InAs, InN, and InP, group III-V ternary semiconductors alloys such as $Al_xGal_{-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors or dopants. Specific semiconductor materials useful for in some applications of the present invention include, but are not limited to, Si, Ge, SiC, AlP, AlAs, AlSh, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AllnP, GaAsP, GalnAs, GalnP, AlGaAsSb, AlGalnP, and GalnAsP. Porous silicon semiconductor materials are useful for applications of the present invention in the field of sensors and light-emitting materials, such as light-emitting diodes (LEDs) and solid-state lasers. Impurities of semiconductor materials are atoms, elements, ions or molecules other than the semiconductor material(s) themselves or any dopants provided in the semiconductor material. Impurities are undesirable materials present in semiconductor materials that can negatively impact the electronic properties of semiconductor materials, and include but are not limited to oxygen, carbon, and metals including heavy metals. Heavy-metal impurities include, but are not limited to, the group of elements between copper and lead on the periodic table, calcium, sodium, and all ions, compounds and/or complexes thereof.

"Substrate" refers to a structure or material on which, or in which, a process is (or has been) conducted, such as patterning, assembly or integration of semiconductor elements. Substrates include, but are not limited to: (i) a structure upon which semiconductor elements are fabricated, deposited, transferred or supported (also referred to as a native substrate), (ii) a device substrate, for example an electronic device substrate; (iii) a donor substrate having elements, such as semiconductor elements, for subsequent transfer, assembly or integration; and (iv) a target substrate for receiving printable structures, such as semiconductor elements. A donor substrate can be, but is not necessarily, a native substrate.

"Destination substrate" as used herein refers to the target substrate (also referred to as a non-native substrate) for receiving printable structures, such as semiconductor elements. Examples of display substrate materials include polymer, plastic, resin, polyimide, polyethylene naphthalate, polyethylene terephthalate, metal, metal foil, glass, flexible glass, a semiconductor, and sapphire.

Printable" relates to materials, structures, device components, or integrated functional devices that are capable of transfer, assembly, patterning, organizing, or integrating onto or into substrates without exposure of the substrate to high temperatures (e.g. at temperatures less than or equal to about 400, 200, or 150 degrees Celsius). In one embodiment of the present invention, printable materials, elements, device components, or devices are capable of transfer, assembly, patterning, organizing or integrating onto or into substrates via solution printing, micro-transfer printing, or dry transfer contact printing.

"Printable semiconductor elements" of the present invention comprise semiconductor structures that can be assembled or integrated onto substrate surfaces, for example by using dry transfer contact printing, micro-transfer printing, or solution printing methods. In one embodiment, printable semiconductor elements of the present invention are unitary single crystalline, poly crystalline or microcrystalline inorganic semiconductor structures. In the context of this description, a unitary structure is a monolithic element having features that are mechanically connected. Semiconductor elements of the present invention can be undoped or doped, can have a selected spatial distribution of dopants, or can be doped with a plurality of different dopant materials, including p and n-type dopants. The present invention includes microstructured printable semiconductor elements having at least one cross-sectional dimension greater than or equal to about 1 micron and nanostructured printable semiconductor elements having at least one cross-sectional dimension less than or equal to about 1 micron. Printable semiconductor elements useful in many applications comprise elements derived from "top down" processing of high-purity bulk materials, such as high-purity crystalline semiconductor wafers generated using conventional high-temperature processing techniques. In one embodiment, printable semiconductor elements of the present invention comprise composite structures having a semiconductor operationally connected to at least one additional device component or structure, such as a conducting layer, dielectric layer, electrode, additional semiconductor structure, or any combination of these. In one embodiment, printable semiconductor elements of the present invention comprise stretchable semiconductor elements or heterogeneous semiconductor elements.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which can provide desired chemical or physical properties.

"Dielectric" and "dielectric material" are used synonymously in the present description and refer to a substance that is highly resistant to flow of electric current and can be polarized by an applied electric field. Useful dielectric materials include, but are not limited to, $SiO_2$, $Ta_2O_5$, $TiO_2$, $ZrO_2$, $Y_2O_3$, $SiN_4$, STO, BST, PLZT, PMN, and PZT.

"Polymer" refers to a molecule comprising a plurality of repeating chemical groups, typically referred to as monomers. Polymers are often characterized by high molecular masses. Polymers useable in the present invention can be organic polymers or inorganic polymers and can be in amorphous, semi-amorphous, crystalline or partially crystalline states. Polymers can comprise monomers having the same chemical composition or can comprise a plurality of monomers having different chemical compositions, such as a copolymer. Cross-linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Micro-transfer printing" as used herein refers to systems, methods, and techniques for the deterministic assembly of micro- and nano-materials, devices, and semiconductor elements into spatially organized, functional arrangements with two-dimensional and three-dimensional layouts. It is often difficult to pick up and place ultra-thin or small devices, however, micro-transfer printing permits the selection and application of these ultra-thin, fragile, or small devices, such as micro-LEDs, without causing damage to the devices themselves.

Microstructured stamps (e.g., elastomeric, electrostatic stamps, or hybrid elastomeric/electrostatic stamps) can be used to pick up micro devices, transport the micro devices to a destination substrate, and print the micro devices onto the destination substrate. In some embodiments, surface adhesion forces are used to control the selection and printing of these devices onto the destination substrate. This process can be performed massively in parallel. The stamps can be designed to transfer a single device or hundreds to thousands of discrete structures in a single pick-up-and-print operation. For a discussion of micro-transfer printing generally, see U.S. Pat. Nos. 7,622,367 and 8,506,867, each of which is hereby-incorporated by reference in its entirety.

Heat-Assisted Micro-Transfer-Printing to Adhesive less Surfaces and Topographic Surfaces FIGS. 1A through 1C are illustrations of heat-assisted micro-transfer-printing. The transfer device 102 (e.g., conformable transfer device, such as an elastomer or visco-elastomer stamp (e.g., polydimethylsiloxane (PDMS) stamp)) includes an array of posts 114 for (i) picking up printable semiconductor elements 104 from a native substrate 108 (e.g., native to the printable semiconductor elements 104 and used to fabricate the printable semiconductor elements 104) and (ii) transferring the printable semiconductor elements 104 to a non-native, destination substrate 110. In certain embodiments, the printable semiconductor elements 104 are encapsulated in a polymer layer 106 (e.g., photoresist) before they are picked up.

In certain embodiments, the printable semiconductor elements 104 are fabricated on, or from, a bulk semiconductor substrate. In such embodiments, the non-native, destination substrate 110 is made of either (i) a non-semiconductor and/or non-metallic material (e.g., with conductive interconnectivity fabricated thereon) or (ii) one or more semiconductor material of different types from the destination substrate. Examples of non-native substrate 110 include, but not limited to, glass, sapphire, plastics, metals and/or other semiconductors. Examples of native substrate 108 include, but not limited to, inorganic semiconductor material such as single crystalline silicon wafers, silicon on insulator wafers, polycrystalline silicon wafers, GaAs wafers, Si (1 1 1), InAlP, InP, GaAs, InGaAs, AlGaAs, GaSb, GaAlSb, AlSb, InSb, InGaAlSbAs, InAlSb, and InGaP.

FIG. 1A illustrates the transfer device 102 after having picked up the printable semiconductor elements 104 from the native substrate 108, but before depositing the printable semiconductor elements 104 on the destination substrate 110. In certain embodiments, the printable semiconductor elements 104 are fabricated on the native substrate 108 and then coated with the polymer layer 106 prior to the transfer device 102 picking up the printable semiconductor elements 104 from the native substrate 108. In certain embodiments, the polymer 106 is on a top surface and sides of the printable semiconductor element 104. In certain embodiments, the polymer 106 is co-planar with the bottom of the printable semiconductor element 104 such that both the polymer 106 and the bottom of the printable semiconductor element 104 contact the destination substrate 110 during printing as shown in FIG. 1B.

In certain embodiments, prior to the printable semiconductor elements 104 being picked up from the native substrate 108, the polymer layer 106 serves as an anchor or tether for the printable semiconductor element 104 in that the layer 106 encapsulates the printable semiconductor elements 104 to maintain the printable semiconductor element 104 on the native substrate 108. Example details of anchoring are described in U.S. patent application Ser. No. 14/743,988, filed Jun. 18, 2015 and entitled Systems and Methods for Controlling Release of Transferable Semiconductor Structures, which is incorporated by reference herein in its entirety. In certain embodiments, the polymer layer 106 is a photoresist.

FIG. 1B illustrates the transfer device 102 transferring the printable semiconductor elements 104 to the destination substrate 110. During the transfer (e.g., printing process), the polymer layer 106, in certain embodiments, is situated between the transfer device 102 and the printable semiconductor elements 104 and serves as the interface for separation between the transfer device 102 and the destination substrate 110 when the printable semiconductor elements 104 are picked up by the transfer device 102. In certain embodiments, the polymer layers 106 increase adhesion to the transfer device 102 during the pick-up of the printable semiconductor elements 104 by the transfer device 102. In certain embodiments, subsequent to the separation of the transfer device 102 from the destination substrate 110, the polymer layer 106 is subsequently removed thereby leaving behind the transferred printable semiconductor elements 104 on the destination substrate 110.

In certain embodiments, the transfer device 102 places the printable semiconductor elements 104 and polymer layers 106 on the surface of the destination substrate 110 and remains in that placement position for a pre-defined time to allow the polymer layer 106 to flow, thereby separating from, or having a reduced adhesion with, the transfer device 102. After contacting the polymer 106 and the bottom of the printable semiconductor element 104 to the destination substrate 110, the polymer 106 can be heated (directly or indirectly). For example, in certain embodiments, a hot plate 112 is used to heat the destination substrate 110. The hot plate 112, in certain embodiments, is in direct thermal contact with the destination substrate 110. The destination substrate 110 may be heated to an equilibrium temperature prior to the printable semiconductor elements 104 being transferred to the substrate 110. This equilibrium temperature, for example, may be sufficient to cause the polymer layer 106 to reflow (e.g., heat from the heating element reduces the viscosity of the polymer layer 106 or causes the polymer layer 106 to flow during said contact) thereby reducing the adhesion forces between the transfer device 102 and the polymer layer 106. In certain embodiments, a non-contact thermal source is employed from a source that does not make direct physical contact with the destination substrate 110.

In certain embodiments, heating the polymer 106 facilitates printing. When a printable semiconductor element 104 is embedded in polymer 106 as shown in FIGS. 1A and 1B and the polymer 206 is heated, the polymer can flow, thereby facilitating printing (i.e., release of the printable semiconductor element 104 from the transfer device 102). In certain embodiments, heat also causes the transfer device 102 itself (e.g., a viscoelastic transfer device, such as PDMS transfer device) to expand more than the chip (due to CTE), thereby leading to shear forces between the printable semiconductor element 104 and the transfer device 102 that facilitate printing.

FIG. 1C illustrates a micro-transfer-printed semiconductor elements 104 on a destination, non-native substrate 110 after the polymer layers 106 have been removed. For example, after printing, plasma ashing may be performed to remove the polymer layers 106, thereby leaving behind the semiconductor elements 104 printed on the destination substrate 110.

Figure 2B:
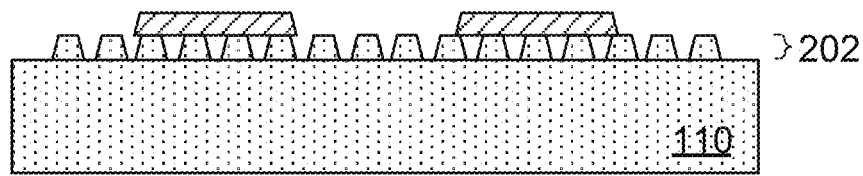

In certain embodiments, the destination substrate 110 includes topographic features 202 on the surface 204 of the destination substrate 110 to contact with the printable semiconductor elements 104 and the polymer layers 106. FIGS. 2A and 2B illustrate a heat-assisted micro-transfer transfer device 102 for printing semiconductor elements 104 onto a surface 204 of a destination, non-native substrate 110 having topographic features 202. In certain embodiments, the topographic features are grooves, v-shaped channels, trenches, mesas, or canals. The topographic features may have varying depths and varying cross-sectional areas. FIG. 2A shows the transfer device 102 placing the printable semiconductor elements 104 with polymer layers 106 on the topographic features 202 of the destination substrate 110. FIG. 2B shows the printable semiconductor elements 104 situated on the topographic features 202 of the destination substrate 110 after the polymer layers 106 has been removed as explained in relation to FIGS. 1A through 1C above. In certain embodiments, it is difficult to print to topographic surfaces 202 because less surface area on the bottom of the printable semiconductor elements 104 contacts the destination substrate 110 due to the topographic surface 202. The use of the polymer layer 106 as described herein is beneficial when, among other things, printing to destination substrates 110 with topographic surfaces 202, as it reduces adhesion between the transfer devices and the polymer layer itself. Thus, the semiconductor elements 104 can be printed even though less of the surface of the destination substrate 110 contacts the semiconductor elements 104 during printing.

Figure 3A:
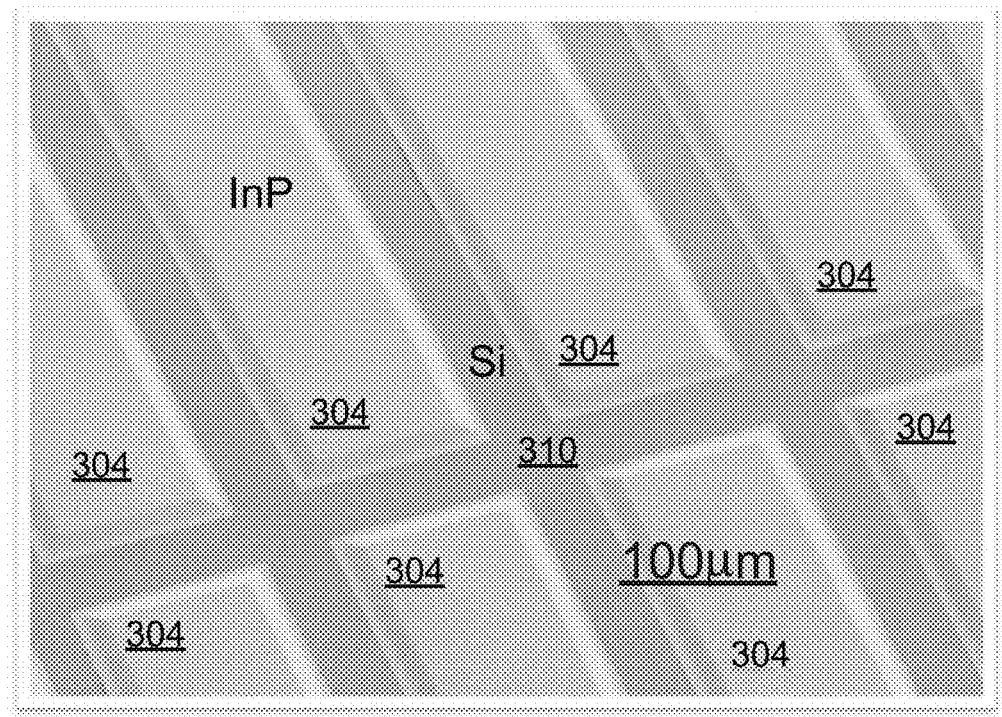
FIG. 3A is an SEM image of example semiconductor elements printed on a non-native substrate.

FIG. 3A is an SEM image of example semiconductor devices 304 printed on a non-native substrate 310. In the example, the devices 304 are InP devices fabricated from an InP substrate. The non-native substrate 310 is made of Si. In certain embodiments, a removal layer made of, for example, InGaAs, is employed between the InP device 304 and the InP bulk substrate to allow, or assist, in the separation of the device 304 from the native substrate.

Figure 3B:
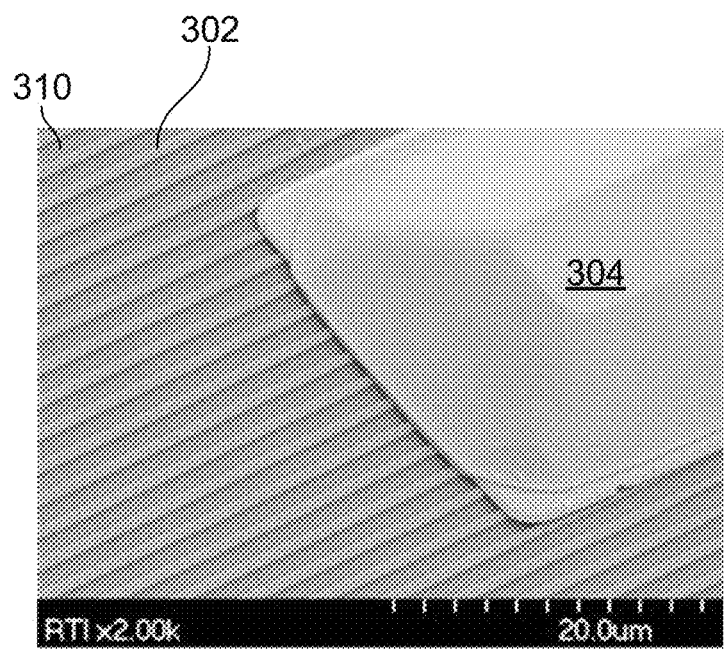
FIG. 3B is an SEM image of example semiconductor elements printed on a non-native substrate having topographic features.

FIG. 3B is a SEM image of an example semiconductor device 304 printed on a non-native substrate 310 with topographic features 302. As shown, an InP device 304 is printed on the surface of a Si destination substrate 310. In this example, the topographic features 302 include U-shaped channels formed on the surface of the destination substrate 310.

Plasma Treatment During Micro-Transfer-Printing

Figure 4:
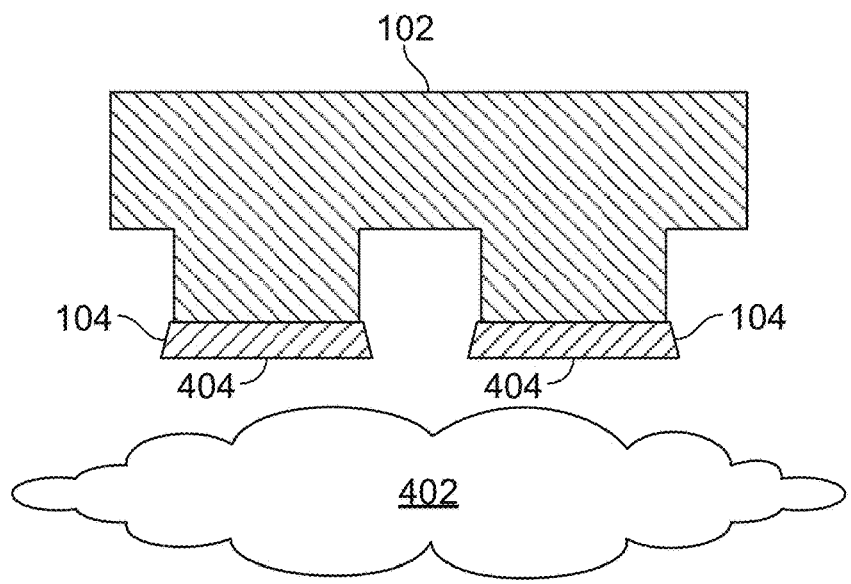
FIG. 4 is an example diagram illustrating the application of plasma to a contact surface of the semiconductor elements.

FIG. 4 is an example diagram illustrating plasma 402 being applied to the contact surface 404 of the semiconductor elements 104 to be printed to the destination substrate 110. In certain embodiments, plasma 402 is applied to the contact surface 404 of the semiconductor elements 104 to be printed to the destination substrate 110 while the semiconductor elements 104 are on the transfer device 102. For example, plasma 402 can be applied to bottom surfaces 404 of devices that are attached to an elastomer transfer device 102.

The plasma 402 treats the contact surface 404 of the semiconductor elements 104 to improve bonding between the semiconductor elements 104 and the destination substrate 110. In certain embodiments, the plasma 402 is used to clean the bottom surface 404 of devices that have been fabricated using some method of epitaxial lift-off. For example, the plasma 402 cleans the contact surface 404 of semiconductor elements 104 of an oxide layer formed at the contact surface 404. Removal of thin layers of oxides from the contact surfaces 404 can be improved by adding a reducing gas (forming gas, ammonia, formic acid, etc.) to the plasma 402. Semiconductor elements 104 that have been fabricated using certain methods of epitaxial lift-off, for example, may form oxide layers at surfaces that are exposed to an oxidizer (such as air). The plasma 402 is of sufficient temperature to remove the thin layer of oxides from the contact surface of the printable semiconductor element 104 with the destination substrate 110. In certain embodiments, a reducing gas (e.g., forming gas, ammonia, formic acid, etc.) is added into the plasma.

The plasma 402 can be applied to the semiconductor elements 104 in a manner in which the semiconductor elements 104 on the transfer device 102 are un-distributed (i.e., do not fall off the stamp) while the treatment is performed. Specifically, the plasma 402 is applied to the populated transfer device 102 in a manner to not cause a given printable semiconductor element 104 to fall off the transfer device 102. For example, in certain embodiments in which the transfer device 102 has a high coefficient of thermal expansion (CTE), the temperature of the transfer device 102 is maintained below a level that would cause shearing and delamination of the semiconductor elements 104 from the transfer device 102. In this instance, once the semiconductor elements 104 are on the transfer device 102, an uncontrolled release is undesired. Any heating of the stamp causes the transfer device 102 to effectively grow (e.g., expand). In some instances, the transfer device 102 grows more than the printable semiconductor element 104. This can leading to shear forces between the printable semiconductor element 104 and the transfer device 102 that causes the semiconductor elements 104 "drop" off the transfer device 102. However, in this instance, when the plasma 402 is applied to the populated transfer device 102, the shear forces and release of the printable semiconductor element 104 is undesired. A number of techniques can be used to maintain the temperature of the transfer device 102 below a level that would cause shearing and delamination of the semiconductor elements 104 from the transfer device 102. In certain embodiments, the duty cycle of the plasma output, the residence time (e.g., scan speeds of 0.5 to 5 mm/sec, 0.5 to 1 mm/sec, 1 to 2 mm/sec, 2 to 5 mm/sec), the power of the plasma 402 (e.g., 25-150 Watts or 80-100 Watts), and the distance (e.g., 0.5 to 5 mm, 0.5 to 1 mm, 1 to 2 mm, 2 to 5 mm) between the plasma 402 to the backside surface of the semiconductor elements 104 can be modulated to maintain the temperature of the transfer device 102 below the desired level (e.g., below 50, 75, or 100 degrees centigrade; e.g., below 50 degrees centigrade with short peaks above 100 degrees centigrade). For example, in certain embodiments, the power of the plasma is 80 to 100 Watts, the distance to the chip is 0.5 to 1 mm (e.g., 1 mm), and the scan speed is 0.5 to 1 mm/sec. This maintains the stamp at a desired temperature, such as below 50 degrees C. with short peaks above 100 degrees C. In certain embodiments, room temperature plasma 402 is used to keep the temperature of the transfer device 102 low enough to avoid this type of failure mode (chips falling from the chip).

Figure 5A:
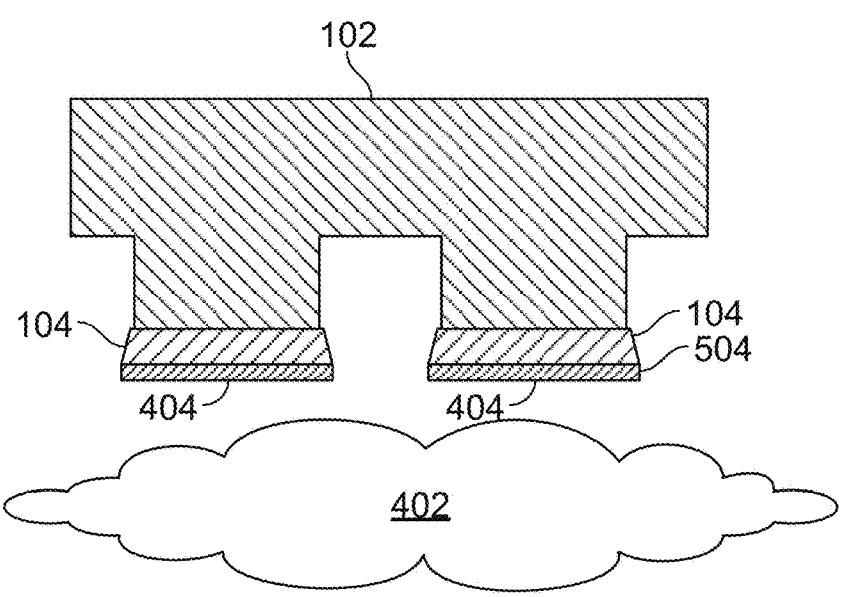
FIG. 5A is an example diagram illustrating the application of plasma to the contact surface of the semiconductor elements.
Figure 5B:
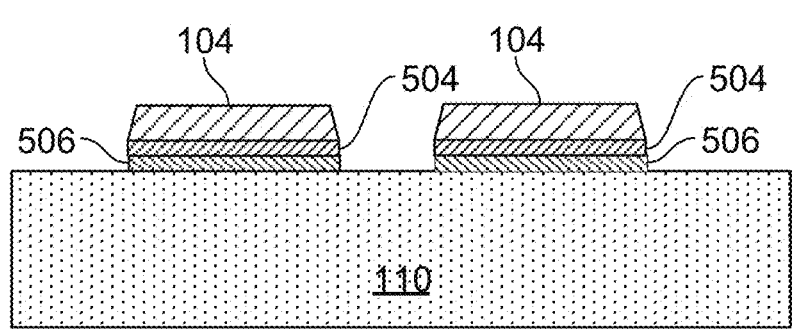
FIG. 5B is an illustration of metal-to-metal joining of the semiconductor devices to the destination substrate after applying plasma to the contact surface of the semiconductor elements.

FIG. 5A is an example diagram illustrating plasma 402 being applied to the contact surface 404 of the semiconductor elements 104 to be printed to the destination substrate 110. In certain embodiments, the semiconductor elements 104 have a backside metal 504, the plasma 402 can be used to remove oxides from the surface of the metal 504. This improves metal-to-metal joining of the backside metal 504 on the semiconductor elements 104 to the metal 506 on the destination substrate 110 as shown in FIG. 5B. Examples of metal-to-metal materials for the metal 504 on the devices and the metal 506 on the destination substrate 110 include, but are not limited to, Cu—Cu, CuSn—Cu, Cu—Sn—Sn—Cu, and Au—Au.

Figure 6:
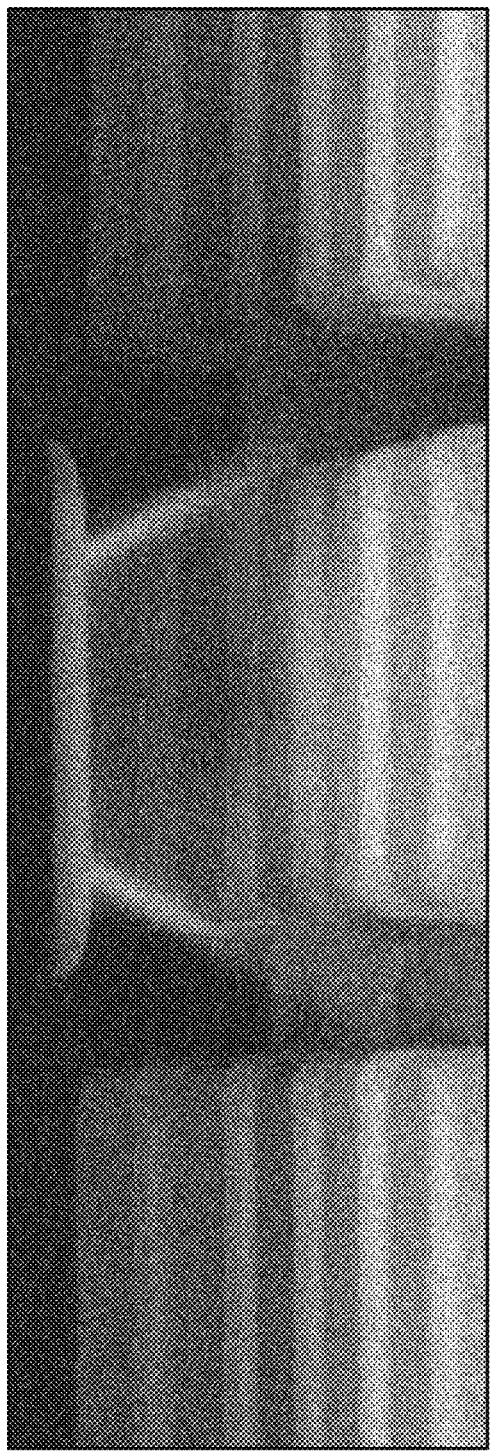
FIG. 6 is an example diagram illustrating application of plasma to the contact surface of the semiconductor devices.

FIG. 6 is an example photomicrograph illustrating the application of plasma 402 to the contact surface of the semiconductor devices.

Figure 7D:
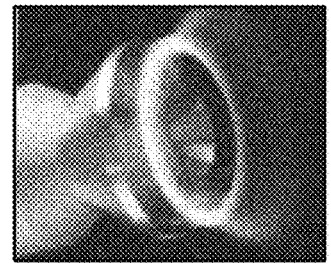
FIGS. 7A through 7D are examples of shapes of outputs of the plasma source.
Figure 7C:
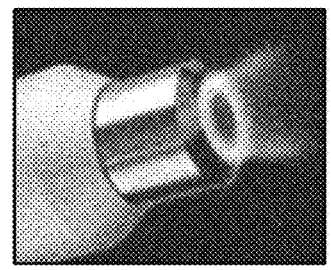
Figure 7B:
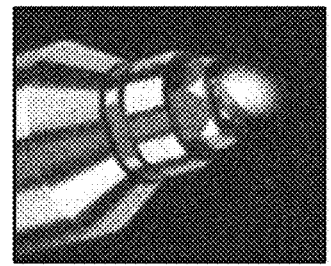
Figure 7A:
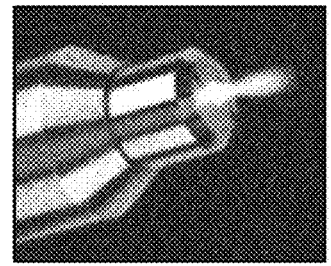

FIGS. 7A though 7D are examples output shapes of the plasma source. The shapes of the plasma outputs are shown as, but not limited to, a point source, a beam source, a narrow circular source, and a wide source.

Figure 8A:
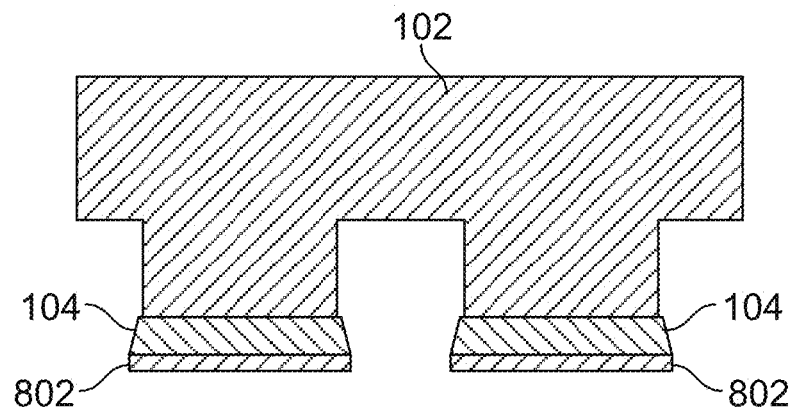
FIG. 8A through 8C are illustrations printing semiconductor elements to a destination substrate with a flux layer thereon.
Figure 8B:
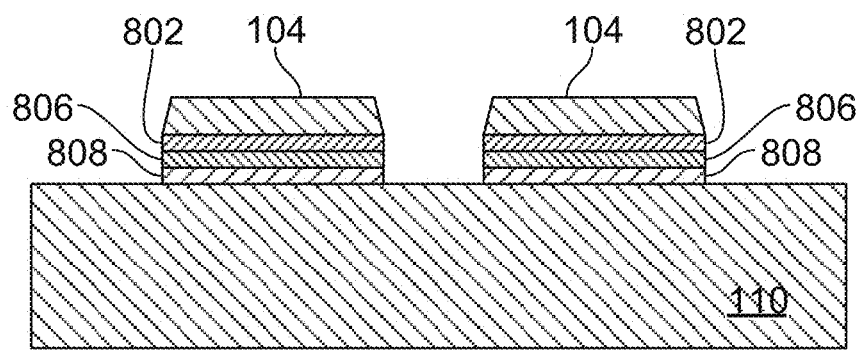
Figure 8C:
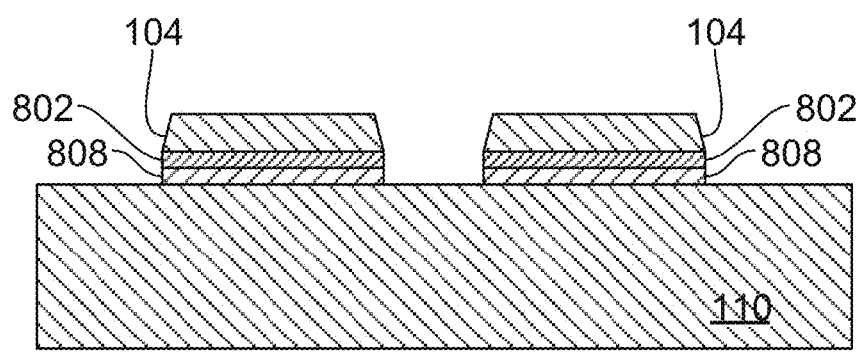

FIG. 8A through 8C are illustrations of printing semiconductor elements 104 having a metal layer-metal connection 808 on a destination substrate 110. In certain embodiments, semiconductor elements 104 have a backside metal 802. The semiconductor elements 104 can be printed to a destination substrate 110 with mating metal pads 808 that have been coated with a flux 806 before printing the semiconductor elements 104. The flux 806 can coat only the metal pads 808, the entire surface of the destination substrate 110 with the metal pads 808 thereon, or a portion (including the metal pads 808) of the destination substrate 110 with the metal pads 808 thereon.

FIG. 8A is an illustration of a transfer device 102 with semiconductor elements 104 having a metal layer 802 disposed on the bottom of the semiconductor elements 104. FIG. 8B is an illustration of semiconductor elements 104 printed to a destination substrate 110. The semiconductor elements 104 are printed onto metal pads 808 with flux 806 thereon. The flux layer 806 is employed between the metal layer 802 of the semiconductor elements 104 and the metal pads 808 on the destination substrate 110. The removal of the flux reduces metal oxides on the metal pads 808, thereby leading to good joining or bonding between metals. In certain embodiments, the flux 806 is a resin. In certain embodiments, the flux 806 is a no-clean flux or water-soluble flux. For example, in certain embodiments, the flux 806 can be removed using water (e.g., a heated water rinse).

In certain embodiments, the flux is an adhesive layer that contains reducing agents for removal of oxides. After the semiconductor elements 104 are printed, the flux 806 can be reflowed thereby creating a good metal connection between metal pads 808 on the destination substrate 110 and the backside metal 802 of the semiconductor elements 104.

A heating chamber or heating environment can be used to thermally treat the printable semiconductor element 104 and the destination substrate 110. The treatment causes the flux layer 804 to re-flow thereby allowing the metal layer 802 to contact the metal contact pads 808 as shown in FIG. 8C.

Micro-Transfer-Printing with High Acceleration During Device Pickup

Figure 9C:
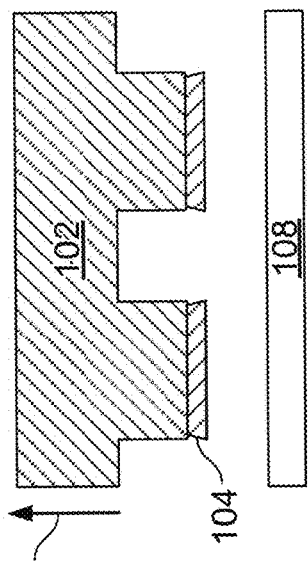
FIGS. 9A through 9C illustrate a typical method of picking up semiconductor elements.
Figure 9B:
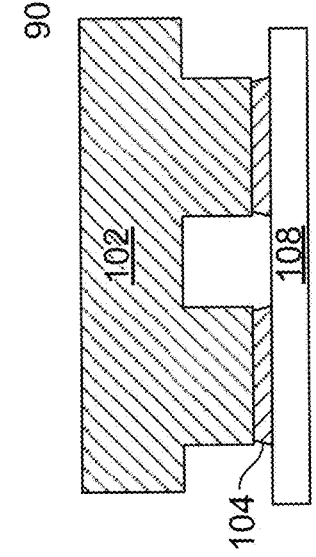
Figure 9A:
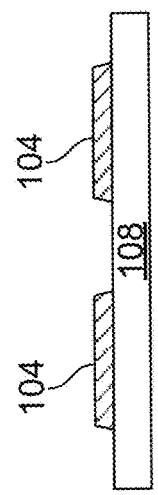

FIGS. 9A through 9C illustrate a typical method of picking up semiconductor elements 104. As shown in FIG. 9A, the devices 904 are formed on their native substrate 108. In this example, the transfer device 102 is brought into contact with the semiconductor elements 104 as shown in FIG. 9B. The transfer device is then moved away (in an upward direction 902) from the source substrate 108, thereby temporarily adhering the semiconductor elements 104 to the transfer device 102 as shown in FIG. 9C.

The methods described in relation to FIGS. 10A-B and FIGS. 11A-B can be used to increase (e.g., by 1 or more g) the initial acceleration (e.g., to 5 to 100 g), thereby achieving higher velocities during the pick up process. The velocity at separation occurs at very small travel distances (e.g., tens of microns or less) dependent on the compression of the transfer device 102 at lamination. Higher acceleration can create higher separation velocities at small distances that in turn increases the adhesion between the stamp and the source.

In certain embodiments, such as the transfer printing of an elastic stamp material, the transfer device 102 employs high-velocity separation between transfer device 102 and the source of the printable elements (e.g., semiconductor elements 104 and native substrate 108). It was found that higher acceleration can create higher separation velocities over a smaller distance and thus can increase the adhesion between the transfer device 102 and the printable element (e.g., the printable semiconductor element 104). To employ gravity to assist in the separation, in certain embodiments, the source substrate 108 is configured to move in a downward direction to provide an additional 1 g of acceleration during the separation process.

In certain embodiments, the transfer device 102 is configured to accelerate the source of the printable elements (e.g., the semiconductor elements 104 and native substrate 108) with an initial acceleration between 5 and 100 g. The initial acceleration allows the transfer device 102 to achieve a higher velocity of the semiconductor elements 104 when being picked up by the transfer device 102. The adhesion between a given transfer device 102 and a given printable element (e.g., the semiconductor elements 104) varies according to the speed of the separation between the transfer device 102 and the native substrate 108 due to the viscoelastic nature of the transfer device. To this end, when the transfer device 102 and the printable semiconductor element 104 are moved away at a sufficient speed, the adhesion at the bond interface between the transfer device 102 and the printable semiconductor element 104 is sufficiently large to "pick up" the printable element (e.g., printable semiconductor element 104) away from its native substrate 108. Conversely, when the transfer device 102 is moved at a slower speed, the adhesion at the bond interface between the transfer device 102 and the printable semiconductor element 104 is low enough to "let go" or "print" the printable semiconductor element 104 onto the non-native, destination substrate 110.

In certain embodiments, the separate occurs over a travel distance of (tens of microns or less). The separation distance may be a function of the compression of the transfer device 102 at lamination. In certain embodiments, the transfer device 102 employs a vertical stage that moves the source (e.g., the printable semiconductor element 104 and the native substrate 108) in the pick-up process.

Figure 10A:
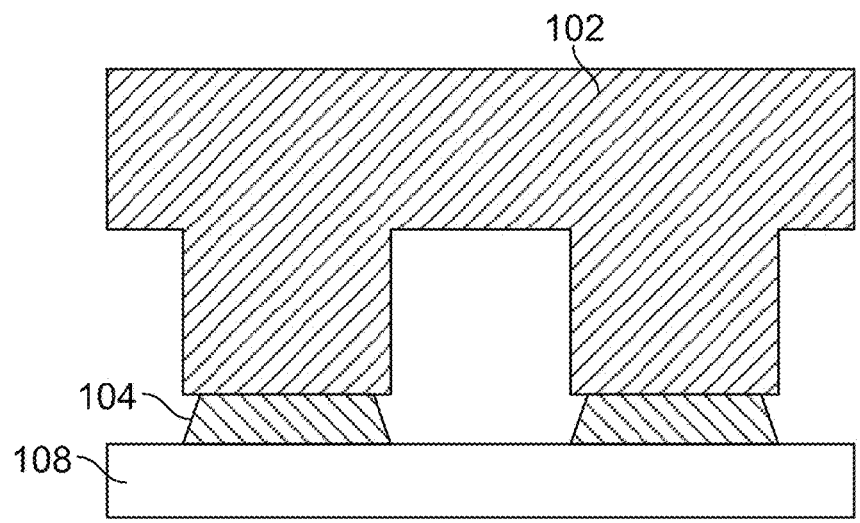
FIGS. 10A and 10B illustrate an example of gravity-assisted separation of the semiconductor elements from the native substrate.
Figure 10B:
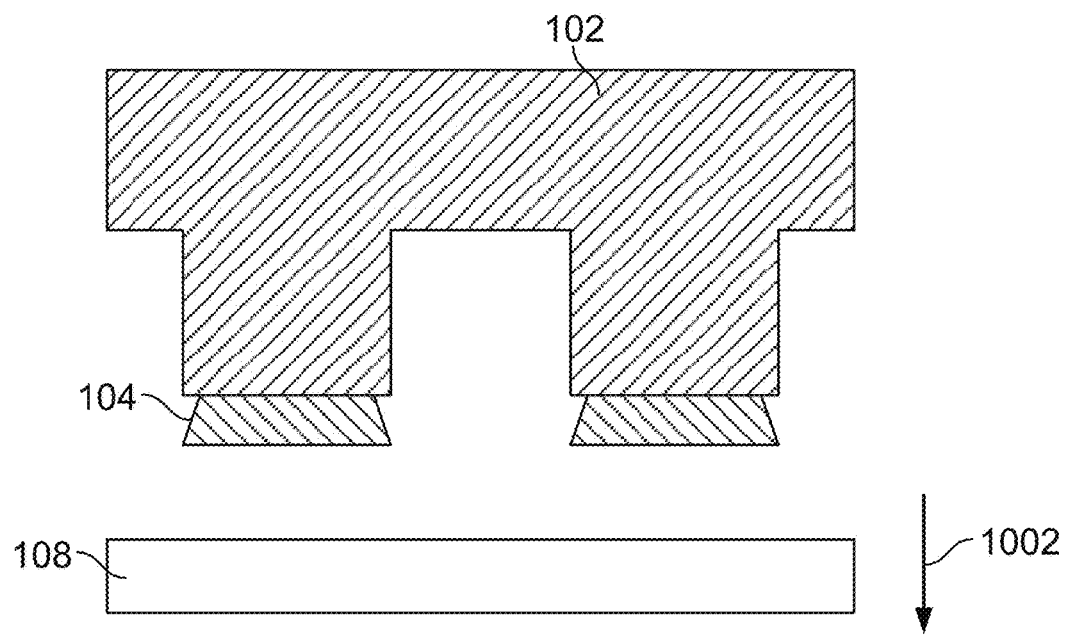

FIGS. 10A and 10B illustrate an example of gravity-assisted separation of the semiconductor elements 104 from the native substrate 108. In this example, the transfer device 102 is brought into contact with the semiconductor elements 104 as shown in FIG. 10A either by moving the transfer device 102, moving the substrate 108, or a combination thereof. In this example, the arrangement and method utilize gravity to assist with picking up the semiconductor elements 104 from the native substrate 108. As shown, the native substrate 108 is configured to move in a downward direction 1002 during the separation. To this end, a higher acceleration is provided to the printable semiconductor element 104 (e.g., due to moving with gravity) that is attached to the transfer device 102 during the pick-up operation as shown in FIG. 10B.

Figure 11A:
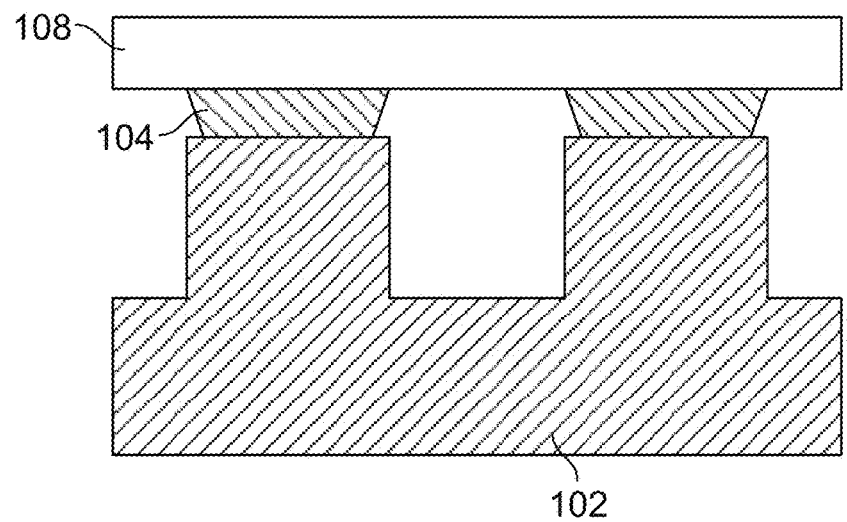
FIGS. 11A and 11B are diagrams illustrating another example of gravity-assisted separation of the semiconductor elements from the native substrate.
Figure 11B:
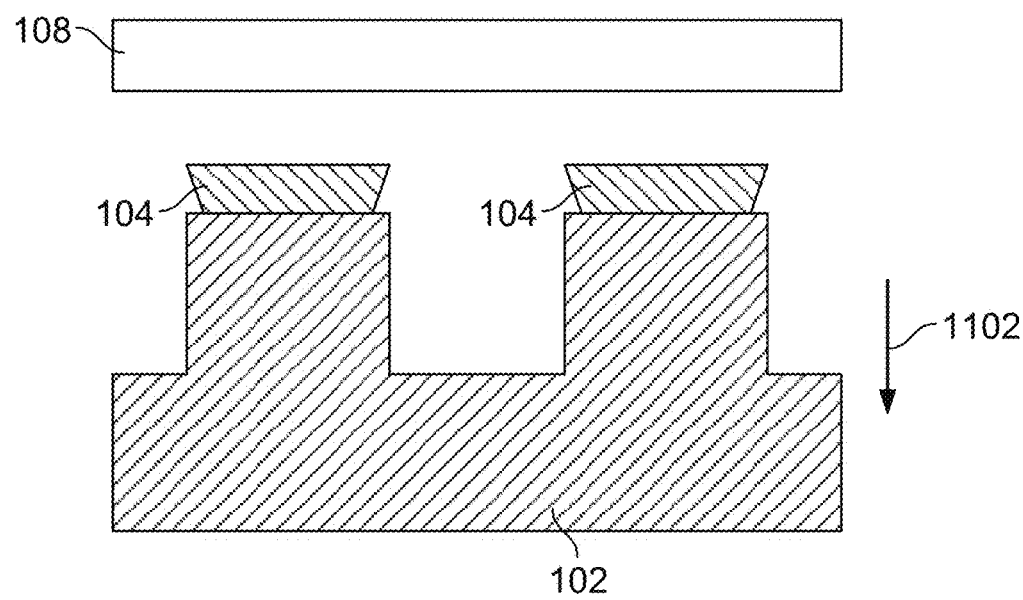

FIGS. 11A and 11B illustrate another example of gravity-assisted separation of the printable semiconductor element 104 from the native substrate 108. As shown, the transfer device 102 is oriented below the source substrate 108 and the semiconductor elements 104 are located on the bottom of the source substrate 108 as shown in FIG. 11A. This can be accomplished by forming the devices on the bottom of the substrate 108 or flipping the substrate 108 with the semiconductor elements 104 thereon after the semiconductor elements 104 are formed. The transfer device 102 is moved in a downward direction 1102 during the separation, thereby picking up the semiconductor elements 104 so that they are on the posts of the transfer device 102 as shown in FIG. 11B. Again, a higher acceleration is provided to assist with picking up the printable semiconductor element 104 (e.g., due to moving with gravity).

In certain embodiments, the method shown in FIGS. 10A and 10B and the method shown in FIGS. 11A and 11B are combined such that both the source substrate 108 and the transfer device 102 are moved away from each other (in a vertical direction). In such embodiments, the separation acceleration is applied to both the source of the printable elements (e.g., the semiconductor elements 104 and the native substrate 108) and the transfer device 102.

Transfer Devices Designed to Prevent Accidental Pick Up of Elements Due to Sag

Figure 12:
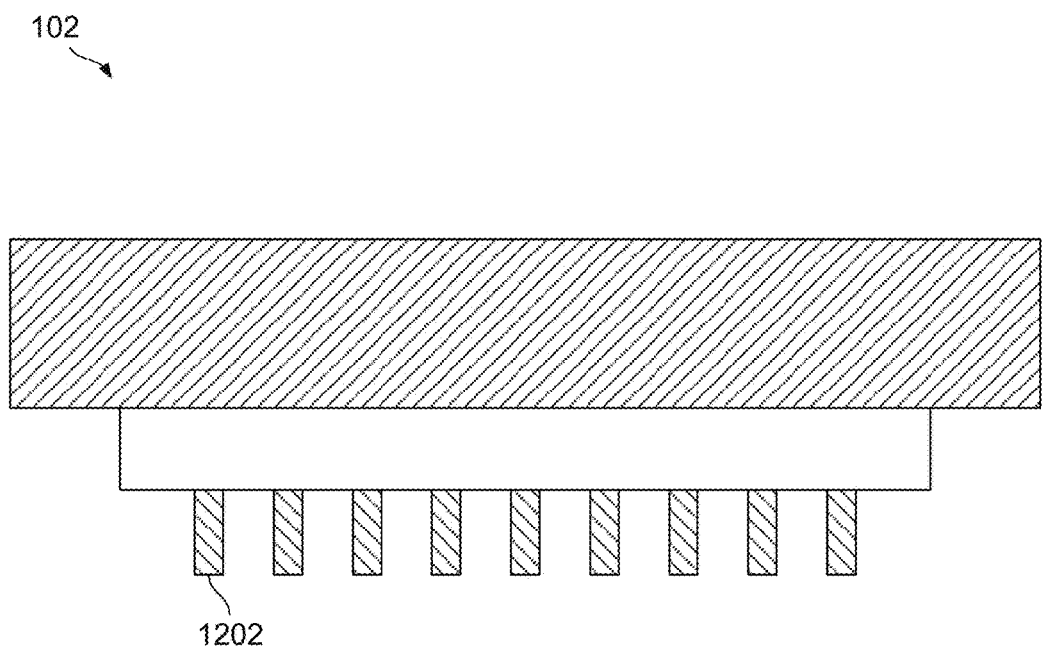
FIG. 12 is a diagram of an example transfer device with an array of posts.

FIG. 12 is a diagram of an example transfer device 102 with posts 1202 (e.g., an array of posts 1202). Typically, each post 1202 is arranged to contact a given printable semiconductor element 104 to be picked up by the transfer device 102. The posts 1202 may have varying ranges of heights that depend, for example, on the size of the source (e.g., the printable material such as the printable semiconductor element 104) to be picked up by the transfer device 102. In certain embodiments, the posts 1202 include a cylindrical post, triangular post, rectangular post, pentagonal post, hexagonal post, heptagonal post, and octagonal post.

In certain embodiments, during the pick-up of the printable semiconductor element 104 from the native substrate 108, the transfer device 102 compresses the transfer device 102 against the source (e.g., the printable semiconductor element 104 and the native substrate 108). The compression (e.g., in the z-direction), in certain embodiments, allows the lamination of the array of posts 1202 onto the printable elements on the source substrate. In addition, the compression allows for the critical velocity (for pick-up to occur) to be reached within a smaller clearance between the transfer device 102 and the printable semiconductor elements 104. To this end, the transfer device 102 may apply a smaller initial acceleration. In certain embodiments, the transfer device 102 sags during compression in the pickup phase of the print cycle. The sag may cause inadvertent pickup of semiconductor elements 104.

FIG. 13A illustrates a transfer device 1302 (e.g., the same as or similar to the transfer device shown in FIG. 12) and FIG. 13B illustrates sag 1304 occurring during compression of the transfer device 1302 (e.g., during pickup). This sag 1304 causes unwanted materials to be picked up from the source substrate. The array of printable semiconductor devices (not shown) on the native substrate 1306 may be denser than the posts 1308 on the transfer device 1302 such that during an individual transfer (e.g., a single pick up and print) printable devices are intentionally left on the native substrate 1306. However, if the sag 1304 is large enough, the sag 1304 can contact the printable semiconductor devices resulting in unintentional pick-up of these devices. A variety of solutions for reducing (or eliminating) the likelihood of unintentional pick-up of devices due to sag are disclosed herein, including transfer devices with multi-tiered posts, anti-sag posts, or both.

Transfer Devices with Multi-Tiered Posts

FIGS. 14A and 14B illustrate an example multi-tiered post 1400. In certain embodiments, a multi-tiered post can be used to eliminate (or reduce) the problems with sag described above in relation to FIGS. 13A and 13B. As shown in FIG. 14B compared to FIG. 13B, even if the transfer device in FIG. 14B experiences the same amount of sag 1404 as the transfer device in FIG. 13B (sag 1304), the sag 1404 of the transfer device shown in FIG. 14B will not pick up semiconductor devices due to the multi-tiered structure increasing the overall height of the post while maintaining the appropriate aspect ratio for the portion of the post (e.g., micro-post) that will interface with the printable device.

As shown in FIG. 14A, in certain embodiments, each post 1422 includes a base post 1412 and a micro-post 1410. The base post 1412 is wider than the micro-post 1410. In certain embodiments, the desired aspect ratio for each base post 1412 and each micro-post 1410 is less than 4:1 (e.g., between 4:1 and 2:1). For example, abase post 1412 can have a 20-micron width and 80-micron height and the micro-post 1410 can have a 5-micron width and a 20-micron height. Thus, the resulting multi-layer post has a 20-micron width and 100-micron height that is capable of picking up 5-micron devices. The base post 1412 can have, for example, a width of 5, 10, 15, 201, 25, 30, or 40 microns and a height of 10, 15, 20, 25, 30, 40, 50, 60, 70, 80, 90, 100, 110, 120, 130, 140, 150, or 160 microns. The micro-post 1410 can have, for example, a width of 1, 2, 3, 4, 5, 10, or 15 microns and a height of 2, 4, 6, 8, 10, 15, 20, 25, 30, 40, 50, or 60 microns.

Figure 15:
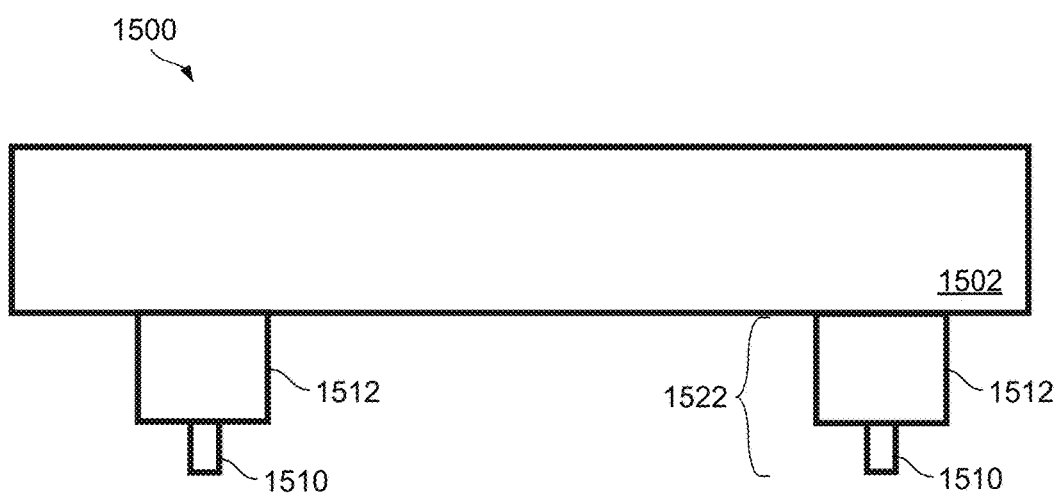
FIG. 15 is an illustration of a multi-tiered stamp.

FIG. 15 is an illustration of a transfer device 1500 with multi-tiered posts 1522. In this example, the micro-post 1510 is made of a viscoelastic material with a lower Young's modulus than the post 1512 and bulk area 1502 which are both made from the same viscoelastic material (i.e., having a higher Young's modulus than the micro-post). Utilizing a lower Young's modulus in the micro-posts 1510 allows printable device pick up to be tuned accordingly. The micro post 1510 (or posts if this techniques is applied to a transfer device without multi-tiered posts) can be tuned to pick up printable devices while the bulk volume 1502 has a higher Young's modulus, reducing the likelihood that the bulk area 1502 unintentionally picks up printable devices during a print operation. In certain embodiments, the entire post 1522 is formed of a viscoelastic material with a lower Young's modulus than the bulk area 1502.

FIG. 16 is an illustration of a casting for a multi-tiered transfer device (e.g., transfer device 1400 or 1500). In certain embodiments, multi-layer posts 1602 (i.e., including micro-post 1610 and post 1612) are generated using a multiple tiered master 1604 with multiple layers 1614, 1606, 1608. These layers can have different thicknesses and can be of different materials. The base 1614 is the layer on which the master is fabricated. In certain embodiments, the base 1614 is a silicon wafer. The layers 1606 and 1608, in certain embodiments, are polymer layers (e.g., photo-imageable polymer materials) and can be formed using spin-coating and photolithography techniques. The multi-tiered master 1604 can be used to form transfer devices, such as those shown in FIGS. 14A-14B and FIG. 15, with micro-posts for picking up smaller printable objects while maintaining aspect ratios comparable to a standard-sized base post.

In certain embodiments, the post 1602 includes a base post 1612 and a micro-post 1610. The base post 1612 is wider than the micro-post 1610. The base post 1612 allows the micro-post 1610 to have smaller cross-sectional area for contacting small printable devices, while allowing the transfer device to maintain a given post aspect ratio. In other embodiments, each base post 1612 includes an array of micro-posts 1610 thereon.

In certain embodiments, the transfer device is comprised of a single sheet of glass and a bulk volume of polymer. The transfer device is casted against a standard silicon wafer with either an image-able material covering the silicon allowing for a pattern to be generated. The silicon wafer is referred to as the master.

In certain embodiments, the glass transfer device and silicon master are advantageously configured such that the CTE variation between the two materials are minimized, or eliminated, during, for example, the cure step which is performed at elevated temperatures. The CTE matching allows the amount of pull back at the edge of the transfer device 102 to be decreased, thereby reducing the amount of crowning that can form at the edge of the bulk region, as well as decrease the any kind of through-out issues noted from post to post. In certain embodiments, a room temperature cure is employed to minimize the pullback at the edge of the transfer device. In certain embodiments, the transfer device 102 is formed of a composite structure as explained below. A second material, for example, can be employed below a thin layer of the polymer layer (e.g., to reduce crowning).

Figure 17A:
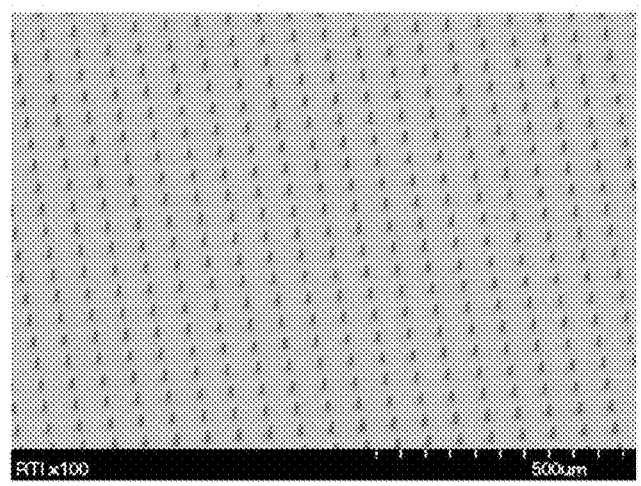
FIGS. 17A through 17C are SEM images of multi-layer posts configured in an array.
Figure 17B:
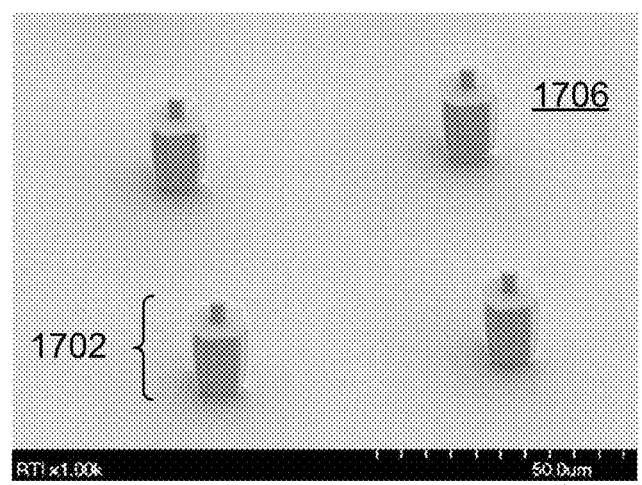
Figure 17C:
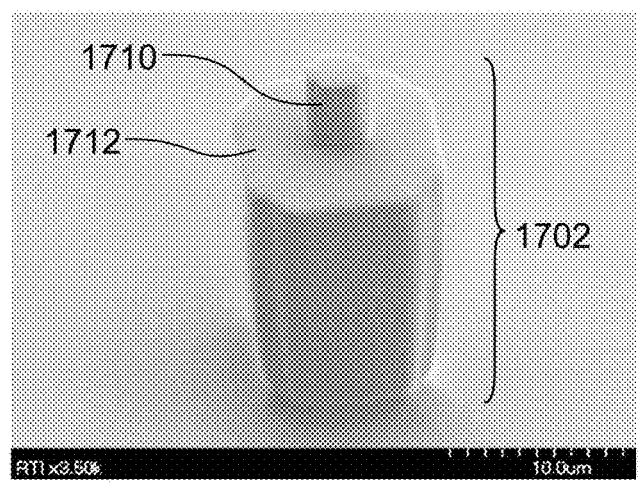

An example of multi-tiered posts is shown in FIGS. 17A-17C. FIGS. 17A-17C are SEM images of multi-layer posts 1702 configured in an array. The posts 1702 may be made of PDMS or other viscoelastic materials. In some embodiments, the posts 1702 and the bulk volume 1702 are formed of the same material. In other embodiments, the micro-posts 1710 can be formed of a material with a lower Young's modulus than the base posts 1712 and the bulk volume 1702. In other embodiments, the micro-posts 1710 and the base posts 1712 can be formed of a material with a lower Young's modulus than the bulk volume 1702. Embodiments including multi-material multi-tiered posts can be accomplished, for example, by selective deposition of the materials into the cast shown in FIG. 16. For example, material can be screen printed into the micro-post 1610 regions of the cast followed by injection molding of the higher Young's modulus material on top (e.g., in the base post 1612) and bulk volume area 1702.

In certain embodiments, multi-tiered posts are also used to solve issues related to crowning on the bulk volume as described below. The use of the multi-tier as explained above allows the multi-tiered post to be taller (e.g., taller than the crown on the bulk volume) while still maintaining the appropriate aspect ratio(s) and enabling the transfer of small devices (e.g., due to the small contact surface area of the micro-post).

Transfer Devices with Anti-Sag Features

Figure 18:
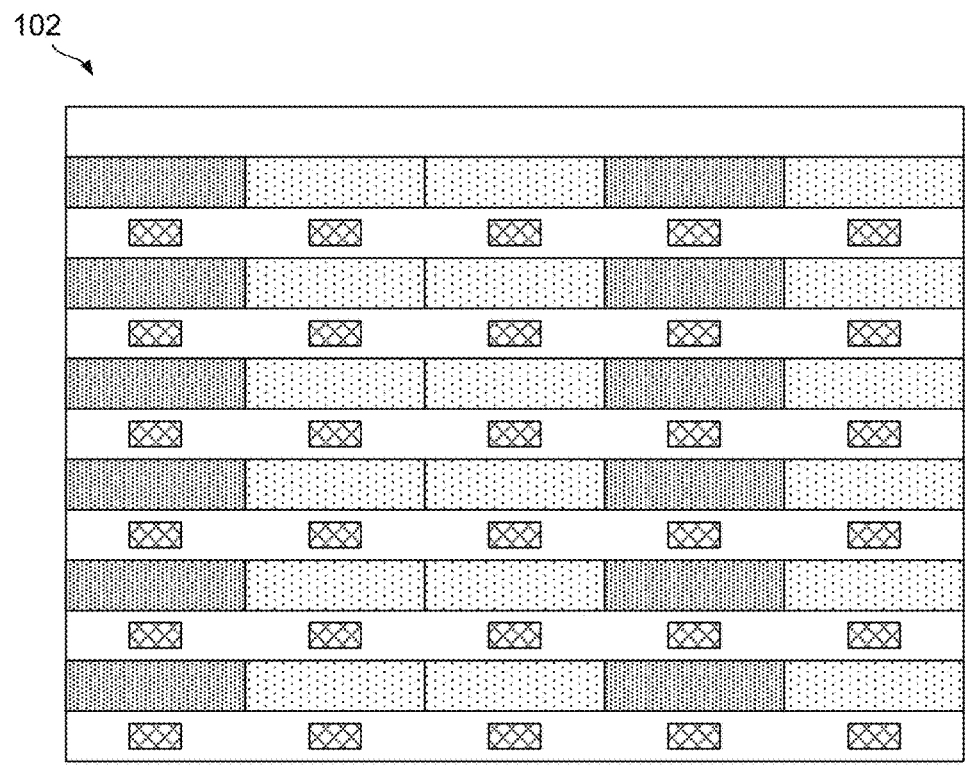

Examples of the anti-sag features 1802 are illustrated in FIGS. 18 and 19. In certain embodiments, to minimize or prevent sagging of the transfer device 102 between the posts (e.g., posts 1202 as shown in FIG. 12), the transfer device 102 includes anti-sag features 1802. The anti-sag features 1802 prevent the bulk volume from sagging during the compression of the transfer device 102, thereby preventing the inadvertent pick-up of unintended or unwanted material (e.g., semiconductor elements 104 not selected for pick-up or debris located at the surface of the native substrate 108) from the surface of the native substrate 108. The anti-sag features 1802 thus operate to improve the selectivity of the transfer device 102.

As shown in FIG. 18, the transfer device 102 includes one or more anti-sag features 1802 that can contact anti-sag regions on the surface of the source substrate 108 between printable regions during a pick up operation. Posts 1806 will pick up printable devices during a pick up operation. Regions 1808 of the stamp contact no posts 1806 or anti-sag posts 1802. These regions 1808 correspond to locations on the source substrate where printable devices are located (or where previously located if they have already been picked up. The compressibility and/or size of the anti-sag features 1802 are insufficient to pick-up the printable objects (e.g., the printable semiconductor element 104) and prevent the bulk volume of the transfer device 102 from sagging and touching the printable substrate.

The anti-sag features 1802 are disposed in the anti-sag regions between regions 1808 and regions with posts 1806. In certain embodiments, the anti-sag features 1802 have a lower aggregate cross-section area of contact than the array of pickup post 1806 of the transfer device 102.

The anti-sag features 1802 may be of any size or shape. In certain embodiments, the anti-sag features 1802 are of the same height as the posts 1806. In certain embodiments, the anti-sag features are taller than the posts 1806. The anti-sag features may be shaped, for example, as a cylindrical post, triangular post, rectangular post, pentagonal post, hexagonal post, heptagonal post, and octagonal post.

FIG. 19 is a diagram of an example transfer device 102 that includes anti-sag features 1802 to contact printable regions on the source (e.g., the semiconductor elements 104 and the native substrate 108). The anti-sag posts 1802 in FIG. 19 in the same location as those shown in FIG. 18 as well as the regions 1808. Thus, some of the anti-sag posts 1802 will contact locations on the native substrate where printable objects are located or were previously located. In certain embodiments, the anti-sag features 1802 are small enough that they have no pick-up capability. In certain embodiments, the anti-sag features 1802 have a compressibility insufficient to have pick-up capability.

Transfer Devices with Roughened Areas between Posts

In certain embodiments, to minimize or prevent the inadvertent pickup of printable material or undesired material from the source, the transfer device 102 includes a roughened field in the area located between the transfer device posts 114.

Figure 20A:
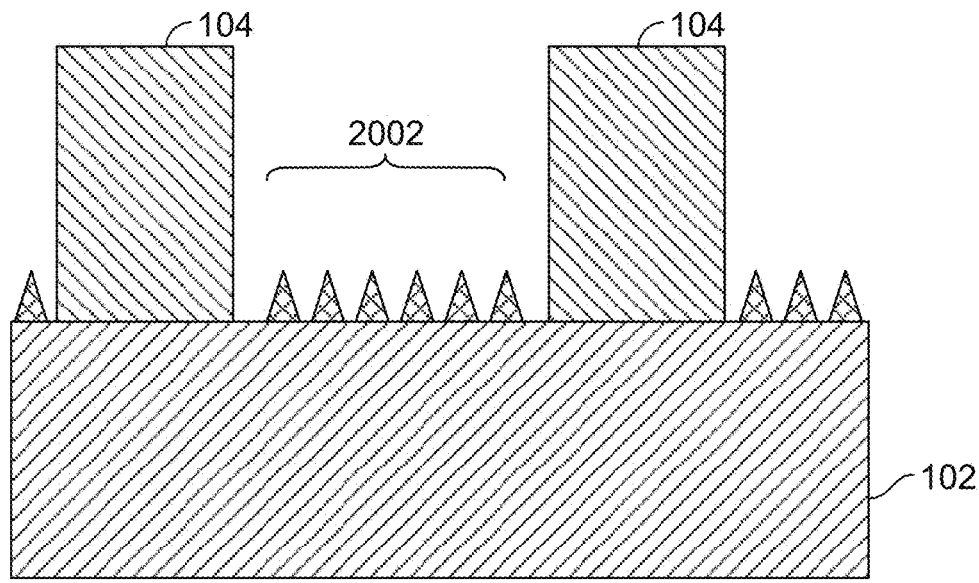
FIGS. 20A and 20B are diagrams that illustrate roughened areas incorporated on the transfer device between posts.
Figure 20B:
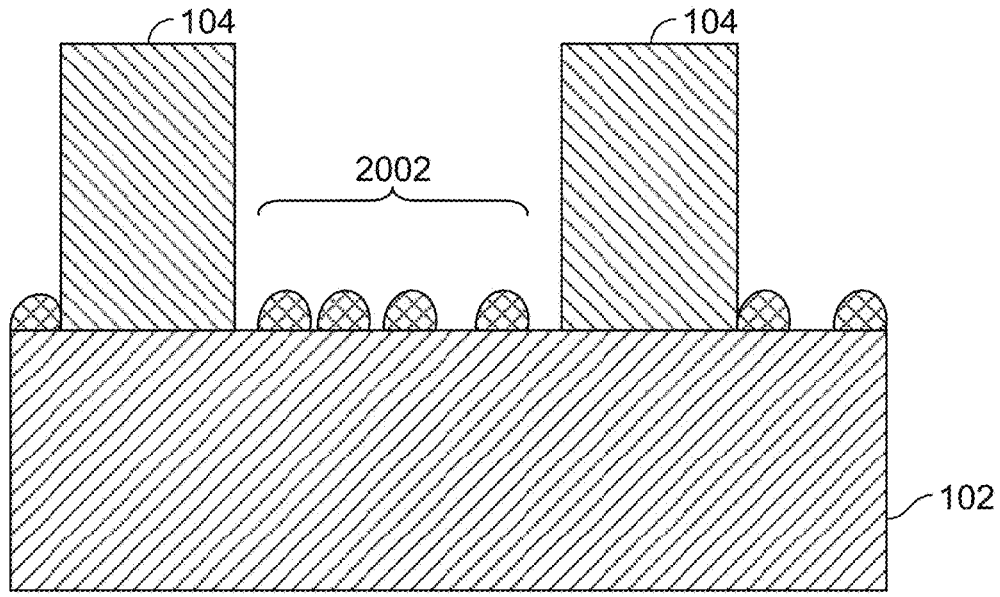

FIGS. 20A and 20B are diagrams that illustrate example roughened areas 2002 incorporated on the transfer device 102. A roughened field 2002 is added to the area of the transfer device 102 in between the transfer device posts 104. This roughened area 2002 will help to prevent pick of printable material if there is sag between the process posts 104. The area 2002 can be comprised of small features that may be placed in a specific pattern array or a random pattern array. In certain embodiments, the roughened field 2002 includes features that are smaller than the transfer device posts 104. For example, in certain embodiments, the roughened features may include cylindrical structures, prisms structures, concave structures, and frusto-conical structures. In certain embodiments, the roughened fields 2002 are placed in a uniform or regular patterned array. In other embodiments, the roughened fields 2002 are placed in a random patterned array.

Composite Transfer Devices

Figure 21A:
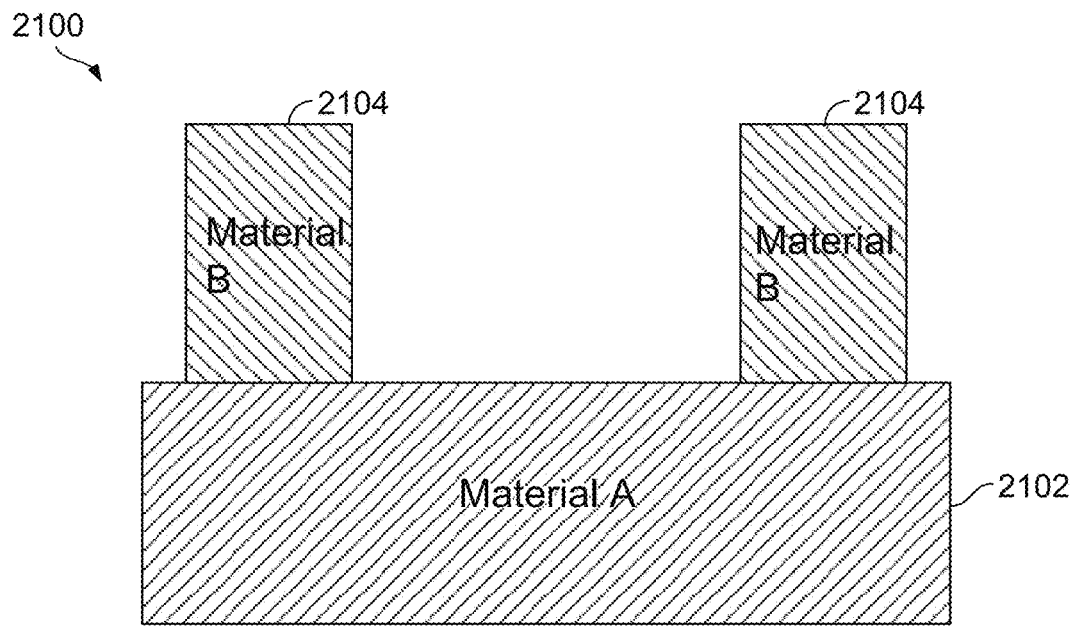
FIGS. 21A and 21B are illustrations of example composite transfer devices.
Figure 21B:
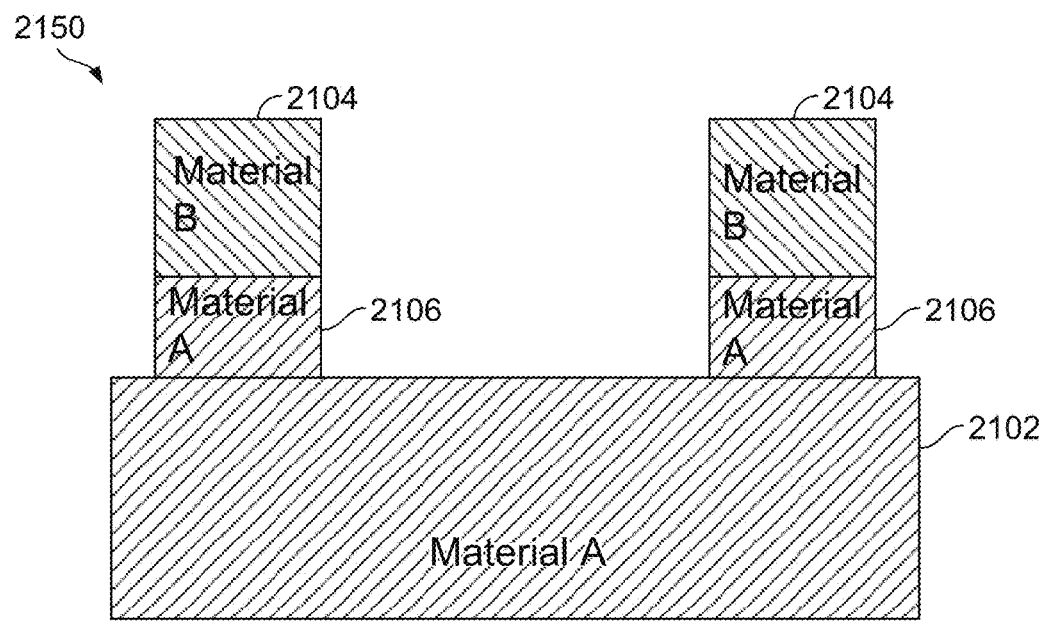

FIG. 21A illustrates a composite transfer device 2100 and FIG. 21B illustrates a composite transfer device 2150. Composite transfer devices (e.g., 2100 and 2150) can be constructed using different visco-elastic materials in various portions of the transfer device. For example, PDMS has a tunable Young's modulus tuned by controlling the cure temperature or by changing the amount of curing agent in the resin. The polymer formation could include several different materials used together or it could include a different ratio of polymer and hardener. Further, materials A & B can have different crosslink densities.

In certain embodiments, the transfer device 2100 is made of a composite material in which a second polymer formation is employed in the posts 2104 to improve the adhesion between a given transfer device 2100 and a printable element (e.g., printable semiconductor element 104). Further, a different polymer formation for the bulk transfer device allows for less adhesion in the event sag occurs between posts, thereby allowing sag while not picking up printable objects. For example, visco-elastic polymers or visco-elastic elastomers may be used in either the post 2104 or the bulk volume 2102. The posts 2104, in certain embodiments, have a lower Young's modulus compared to the bulk volume 2012.

In certain embodiments, the post 2104 includes a base 2106 that has a higher Young's modulus than the post 2104. The base 2106 may have the same Young's modulus as the bulk area 2102 as shown in FIG. 21B.

Typically, a transfer device is composed of a single sheet of glass and a bulk volume of polymer. The transfer device is cast against a standard silicon wafer with an imageable material (e.g., patterned photoresist or other photo-imageable polymers such as SU8 or BCB) covering the silicon allowing for a master pattern to be generated. Both the glass and the polymer can be optimized so that the CTE variation between the two can be reduced or eliminated during the cure step at elevated temperatures. This decreases the amount of pull back at the edge of the transfer device which reduces the amount of crowning noted at the edge of the bulk region and decreases differences from post to post. A room temperature cure can also minimize the pullback at the edge of the transfer device.

Transfer Devices with Reduced Crown

Figure 22:
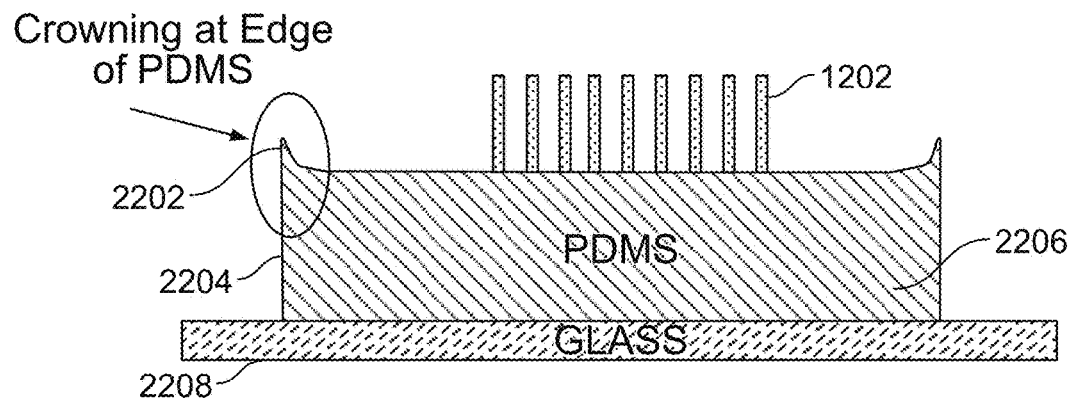
FIG. 22 is an illustration of crowning at the edge of the bulk material (e.g., PDMS layer) of a stamp.

FIG. 22 is an illustration of crowning 2202 at the edge 2204 of the bulk volume 2206 (e.g., PDMS layer) of a transfer device. The bulk volume 2206 (e.g., PDMS layer in this example) may take on various shapes and forms. In certain embodiments, the bulk volume 2206 is cylindrical, triangular, rectangular, pentagonal, hexagonal, heptagonal, or octagonal in shape. The crowning 2202 may be caused by a mismatch in the coefficients of thermal expansion (CTE) between the bulk volume 2206 and the hard-plate interface 2208 (e.g., glass in this example).

Figure 23:
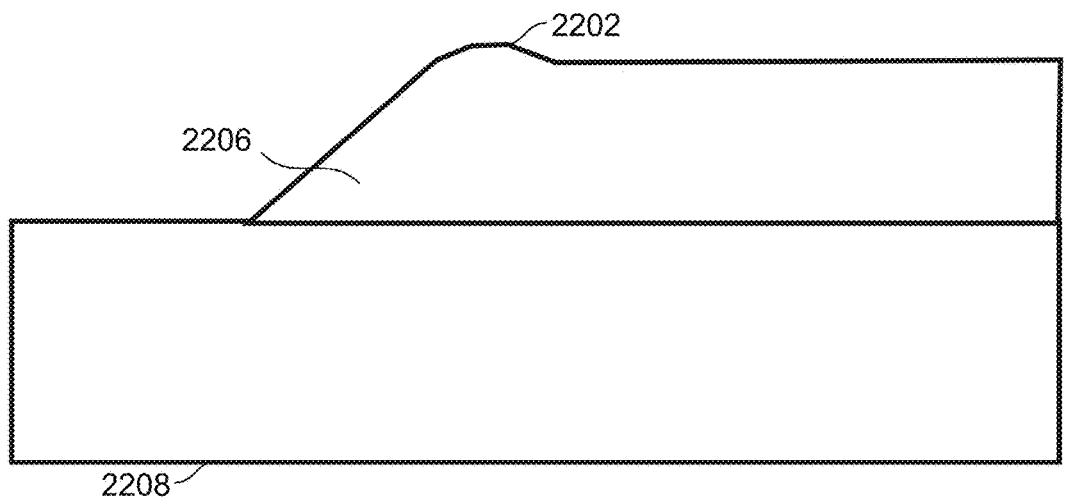
FIG. 23 is an illustration of crowning occurring on a piece of elastomer.

FIG. 23 is an illustration of crowning 2202 occurring on the bulk volume 2206 (e.g., visco-elastic material). FIG. 23 is a cross-sectional view of half of the bulk volume 2206 of a transfer device. For the purposes of this illustration, the posts are omitted. In certain embodiments, as the bulk volume 2206 cools on the hard-plate interface 2208 (e.g., glass substrate), the bulk volume 2206 distorts. This is particularly prevalent towards the edges (e.g., edge 2204) of the bulk volume 2206. The distortion can cause a crown 2202 to form on the top of the elastomer 2206 as shown in FIGS. 22 and 23. The crowning 2202 creates a problem because it can itself unintentionally pick up devices during the transfer process.

Figure 24:
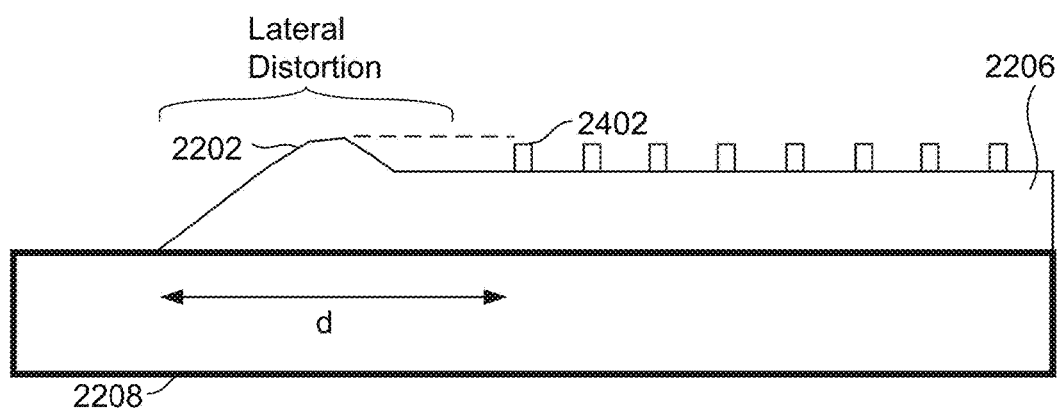
FIG. 24 is an illustration of an example transfer device with significant crowning.

As shown in FIG. 24, the crowning 2202 can be taller than the posts 2402. Additionally, the distortion occurs in the x and y direction as well (i.e., lateral distortion). As such, it is undesirable to have the posts positioned on the area of the bulk volume 2206 where the lateral distortion will occur as the spacing of the posts 2402 may change when the distortion occurs (i.e., the spacing of the posts must be known and controlled to ensure that printing occurs properly). A typical distance "d" that the post array would be positioned away from the edge of the bulk volume 2206 to avoid lateral distortions is 5 to 20 millimeters.

Transfer Devices with a Composite Structure

Figure 25:
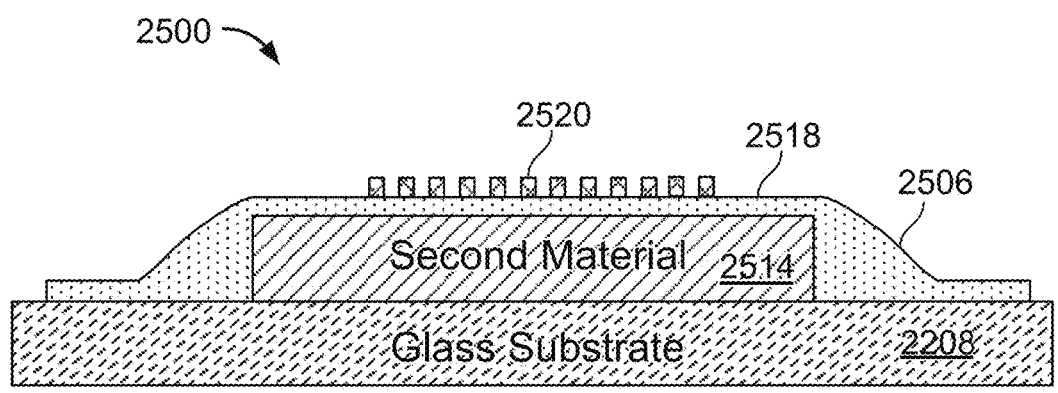
FIG. 25 is an illustration of an example transfer device made with multiple components to reduce crowning.

FIG. 25 is an illustration of an example transfer device 2500 with a composite structure. Typically, the transfer device 2500 is comprised of a single sheet of glass 2208 (other materials may be used for the hard-plate interface 2208 besides glass) and a bulk volume of viscoelastic material (e.g., PDMS). In certain embodiments, an additional material layer 2514 is added between the glass plate 2208 and the visco-elastic material 2506 to allow for a thin layer 2518 of visco-elastic material 2506 to be formed on top of the additional layer 2514. The thin layer 2518, for example, may enable the transfer device 2500 to be fabricated with less crowning at the edges as there is less material at the edge to form the crown.

The second material 2514, in certain embodiments, is permanently bonded to the first material 2208. The second material 2514 may be transparent, thereby allowing for a clearer image to be viewed through the transfer device 2500. The second material 2514 allows the use of a thinner bulk material, thereby allowing the transfer device 2500 to employ less compression to fully laminate the printable area.

In certain embodiments, a glass disc is used as the second material 2514 between the hard-plate interface 2208 (e.g., glass) and the transfer device bulk volume 2506. The second material 2514 can be any size or shape. In certain embodiments, the array of micro-posts 2520 are disposed over the area of the second material 2514.

Figure 26:
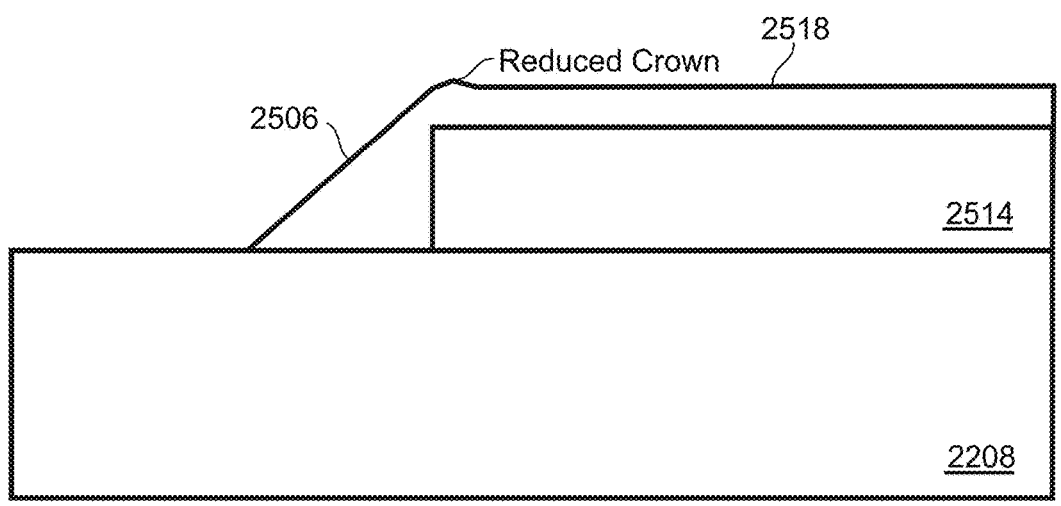
FIG. 26 is an illustration of an example transfer device with reduced crowning.
Figure 27:
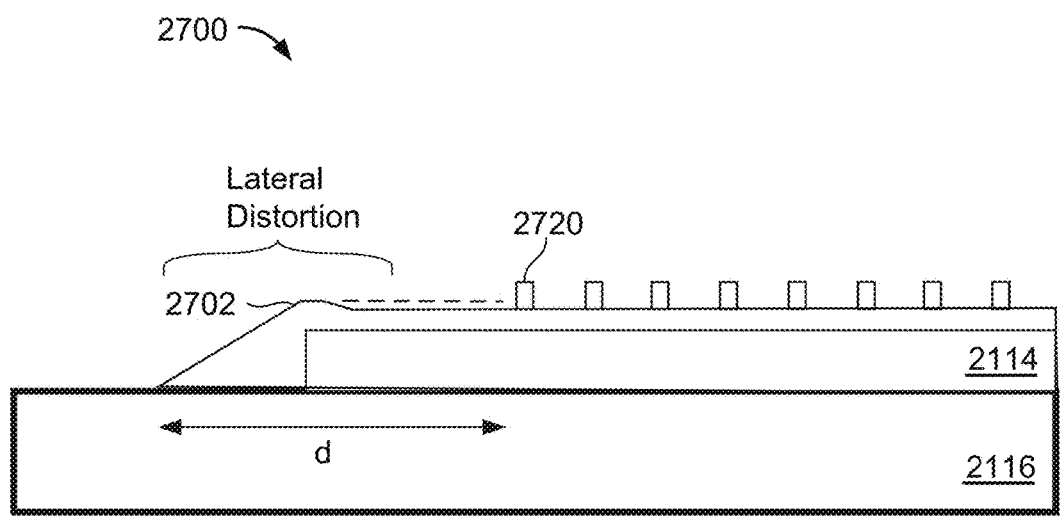
FIG. 27 is an illustration of an example transfer device with reduced crowning.

FIGS. 26 and 27 are illustrations of example transfer devices formed of a composite structure with reduced crowning. Reducing the volume (thickness) of the elastomer below the posts leads to smaller distortion regions (crown and lateral). FIG. 26 is a cross section view of half of a transfer device. As compared to FIG. 23, the transfer device in FIG. 26 has less crowning due to the use of the second material 2514 as explained above. As shown in FIG. 27, the crown 2702 is smaller than the crown shown in FIG. 24 and is smaller than the posts 2720 of the transfer device 2700. In this example, the distance "d" can be reduced to 1 to 5 millimeters. Additionally, the lateral distortion is less.

Transfer Device Mesa Around the Array of Posts

Figure 28A:
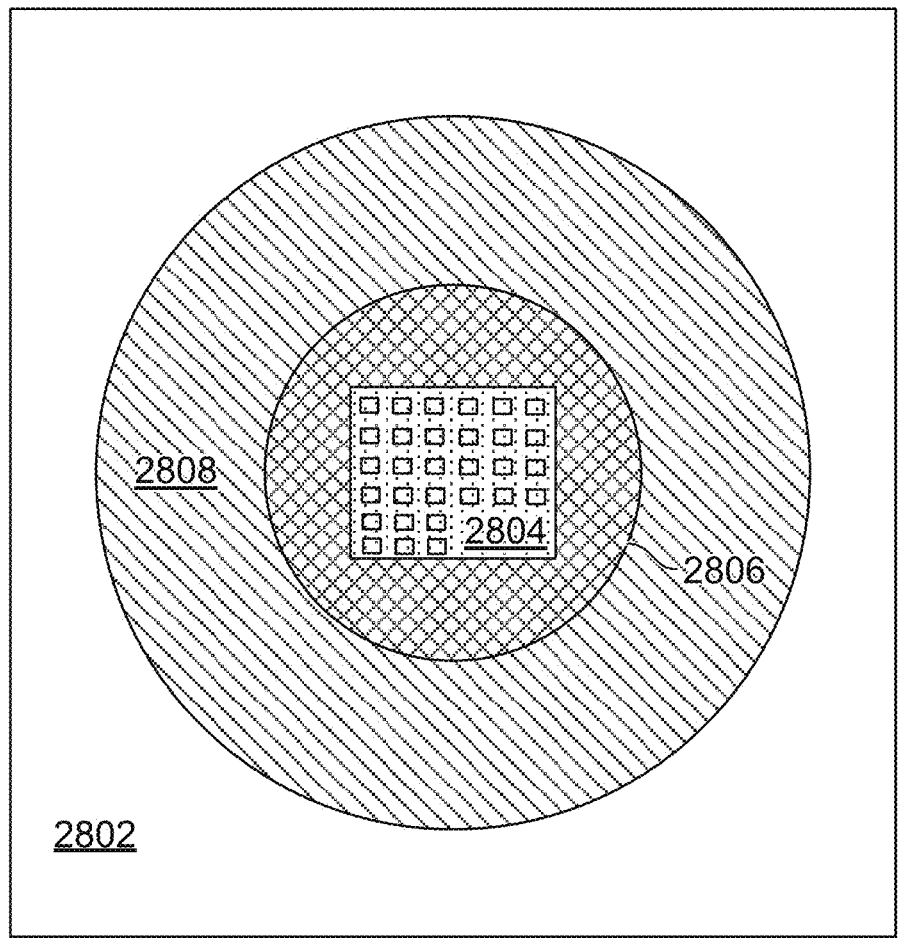
FIGS. 28A and 28B are illustrations of an example transfer device with a mesa and an array of posts on the mesa.
Figure 28B:
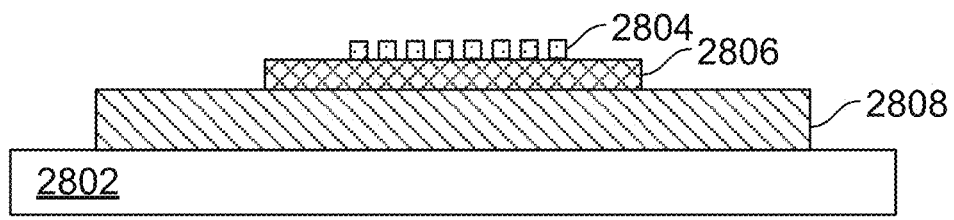

FIGS. 28A and 28B are illustrations of an example transfer device mesa 2806 with an array of posts 2804 formed thereon. Due to the smaller post sizes needed to pick up small printable objects, the height of the transfer device post is decreased in order to adhere to desired post aspect ratios. As explained above, if the length of the post (e.g., 1202) is too large relative to its width, the post will bend during compression (e.g., when picking up a device). However, crowning on the edge of the transfer device may cause devices to be picked up unintentionally if the length of the post relative to its width is such that it does not bend appropriately during compression (e.g., a desired post aspect ratio). A mesa 2806 has been developed around the transfer device array 2804 that allows for a smaller portion of the transfer device to be exposed to the wafer surface. The mesa material can allow for a large step between the array 2804 and the bulk layer 2808. In certain embodiments, the thickness of the mesa 2806 is greater than the height of crowning on the bulk material 2808. This eliminates (or significantly reduces) the risk that the crowning on the bulk material 2808 will unintentionally pick up devices during the transfer process. Additionally, in certain embodiments, the thickness of the mesa 2806 is less than the thickness of the bulk material 2808. As such, the crowning on the mesa 2806 (if any) is smaller than that of the crowning on the bulk material 2808.

The mesa 2806 can be any shape, as long as it encompasses the entire transfer device array 2804. The transfer device mesa 2806 may be fabricated on a bulk volume of polymer 2808 which itself is on a single sheet of glass 2802.

Figure 29:
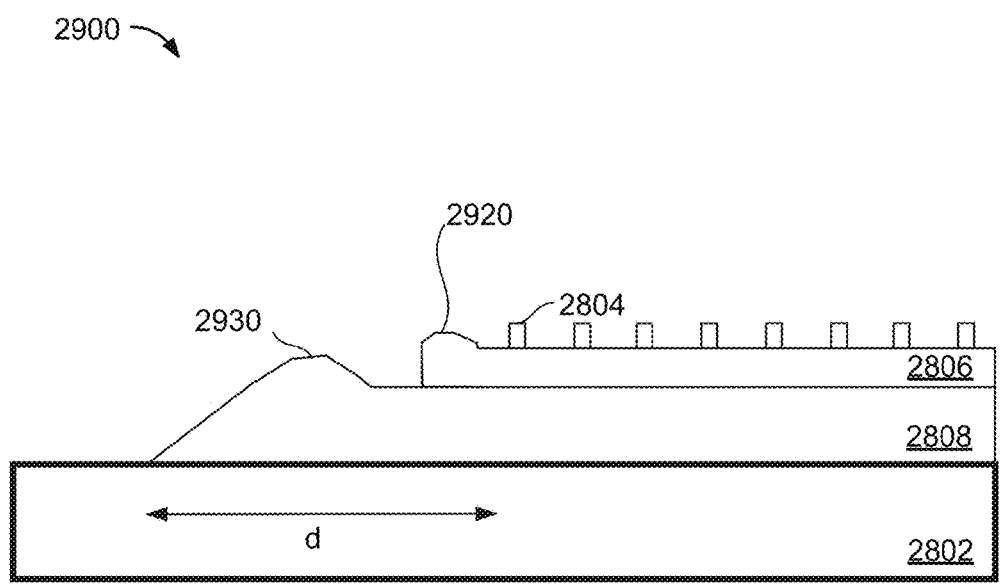
FIG. 29 is an illustration of an example transfer device with reduced crowning.

FIG. 29 is an illustration of an example transfer device 2900 with reduced crowning 2920. A mesa 2806 is positioned around/below the posts 2804. The thickness of the mesa 2806 is less than the thickness of the bulk volume 2808 (e.g., due to the thickness of the mesa 2806 and the height of the posts 2804). As such, the crowning 2920 on the mesa 2806 (if any) is smaller than that of the crowning 2930 on the bulk material 2808. The thickness of the mesa 2806 is such that the posts 2804 are prominent over both the crowning 2920 on the mesa 2806 and the crowning 2930 on the bulk volume 2808. Thus, the risk of accidentally picking up devices by the crowning 2920 and 2930 is reduced or eliminated.

Transfer Devices with the Crown at Least Partially Removed

Figure 30A:
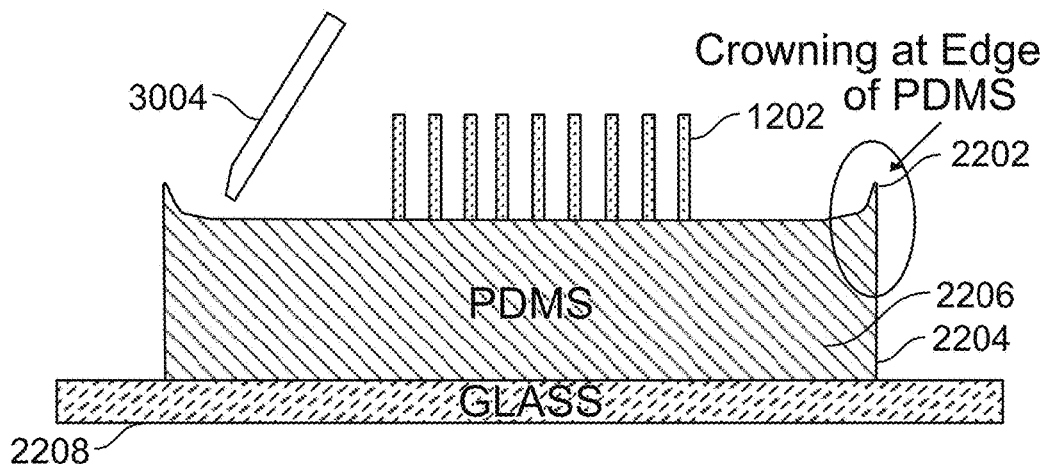
FIGS. 30A through 30B are illustrations of a method of reducing the crowning on a transfer device.
Figure 30B:
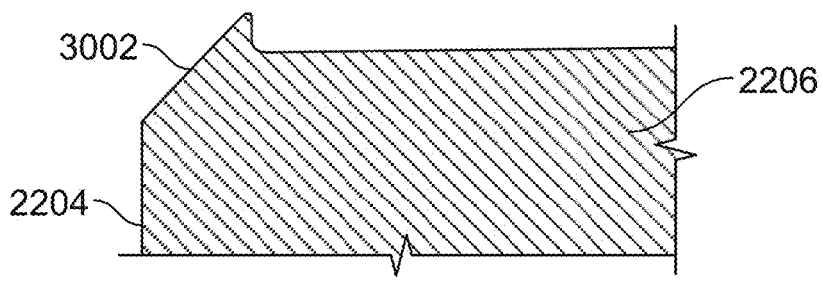
Figure 31A:
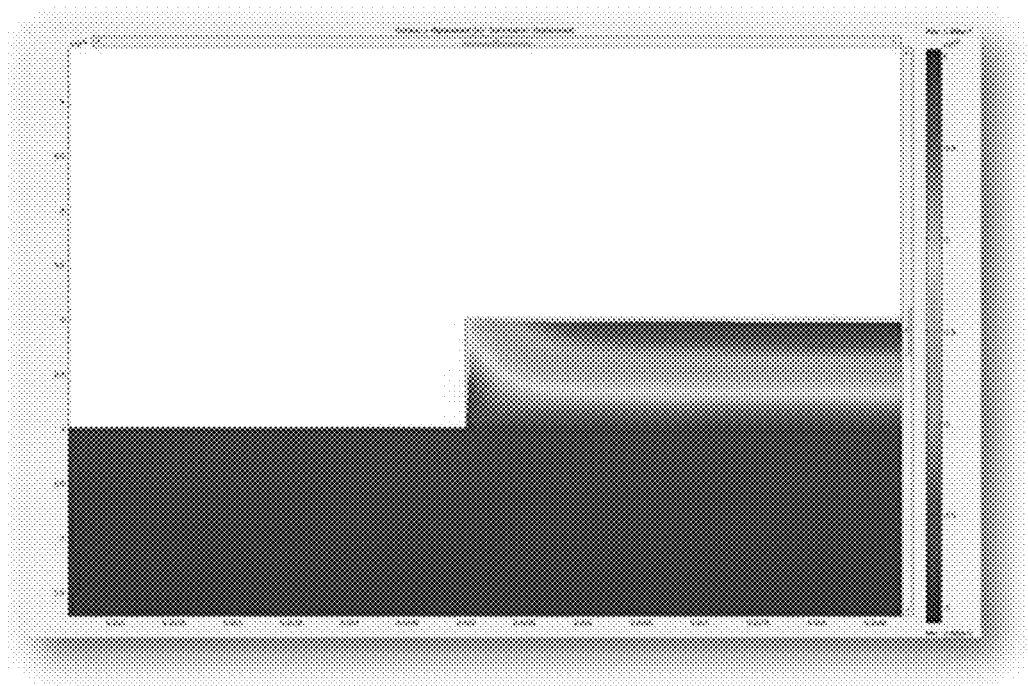
FIGS. 31A through 31G illustration example sidewall profiles for use with a transfer device.
Figure 31B:
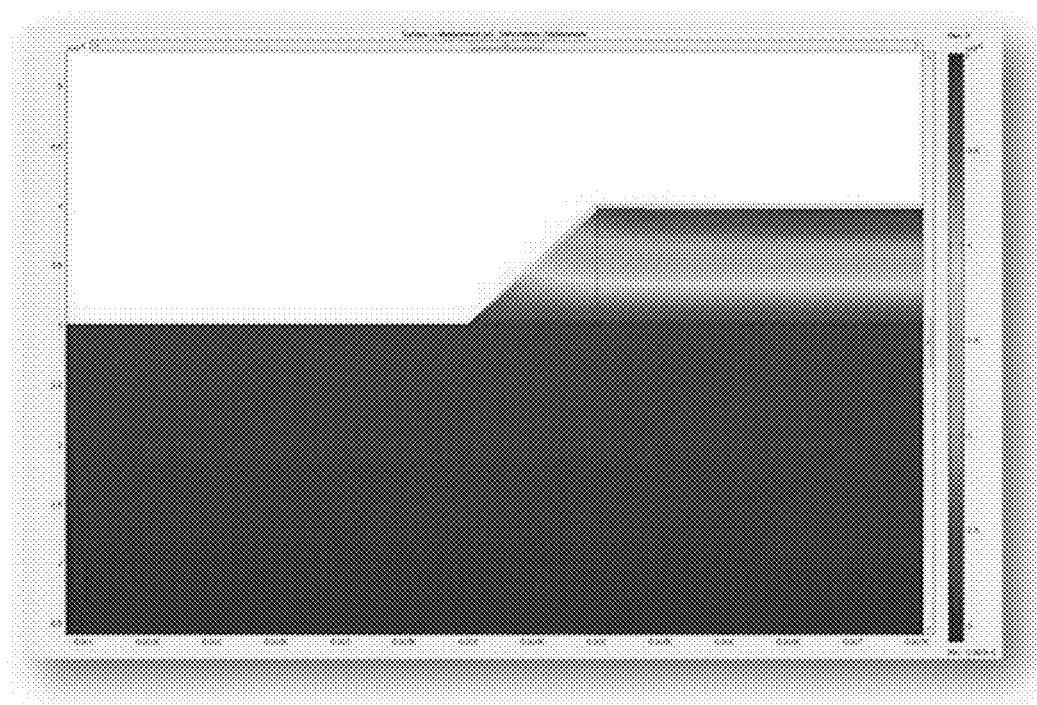
Figure 31C:
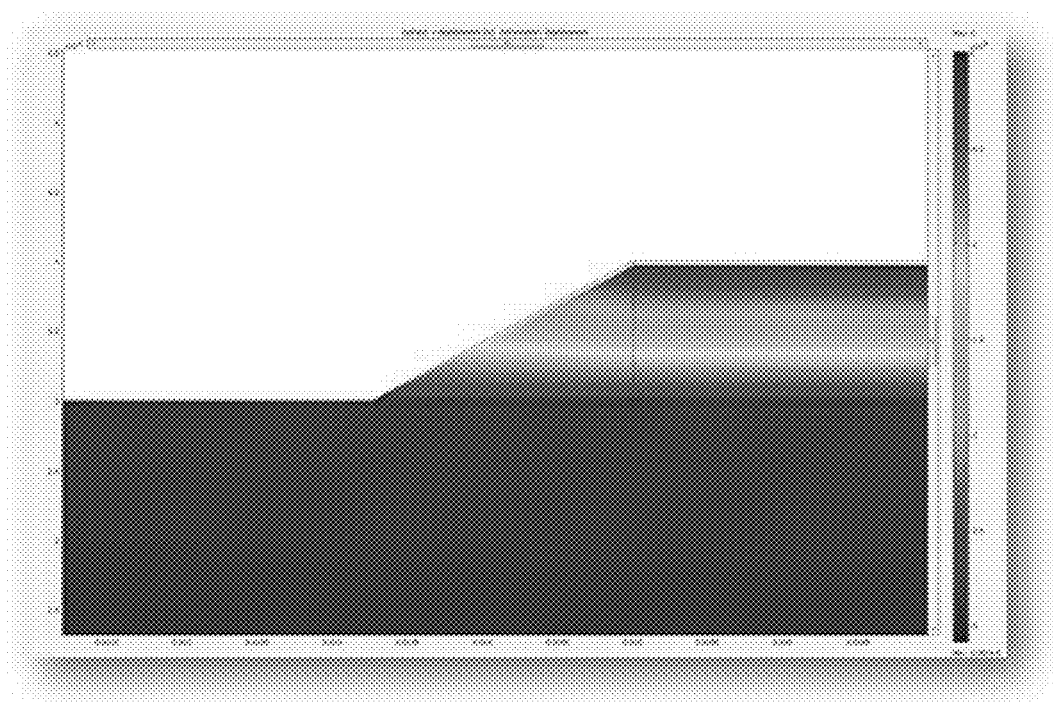
Figure 31D:
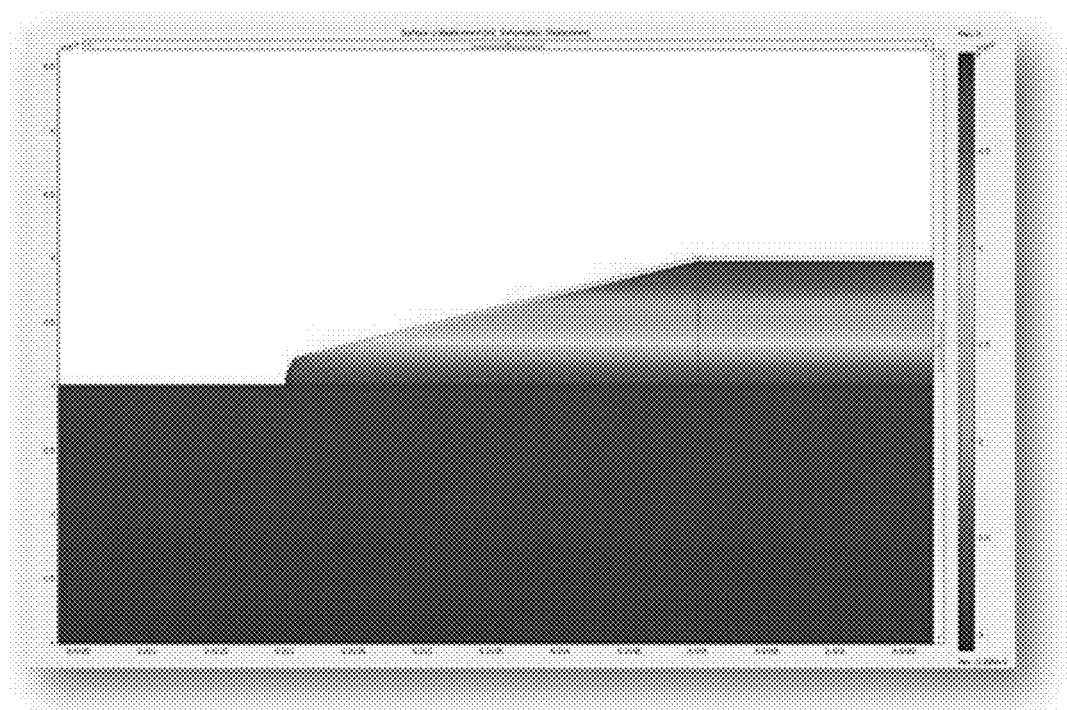
Figure 31E:
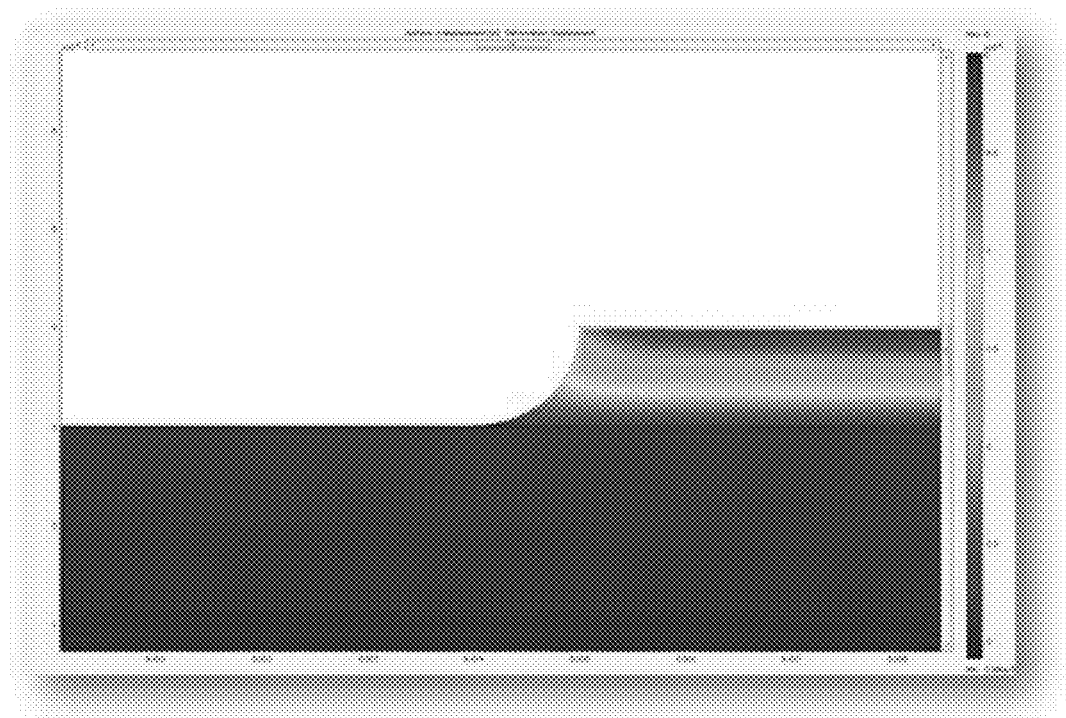
Figure 31F:
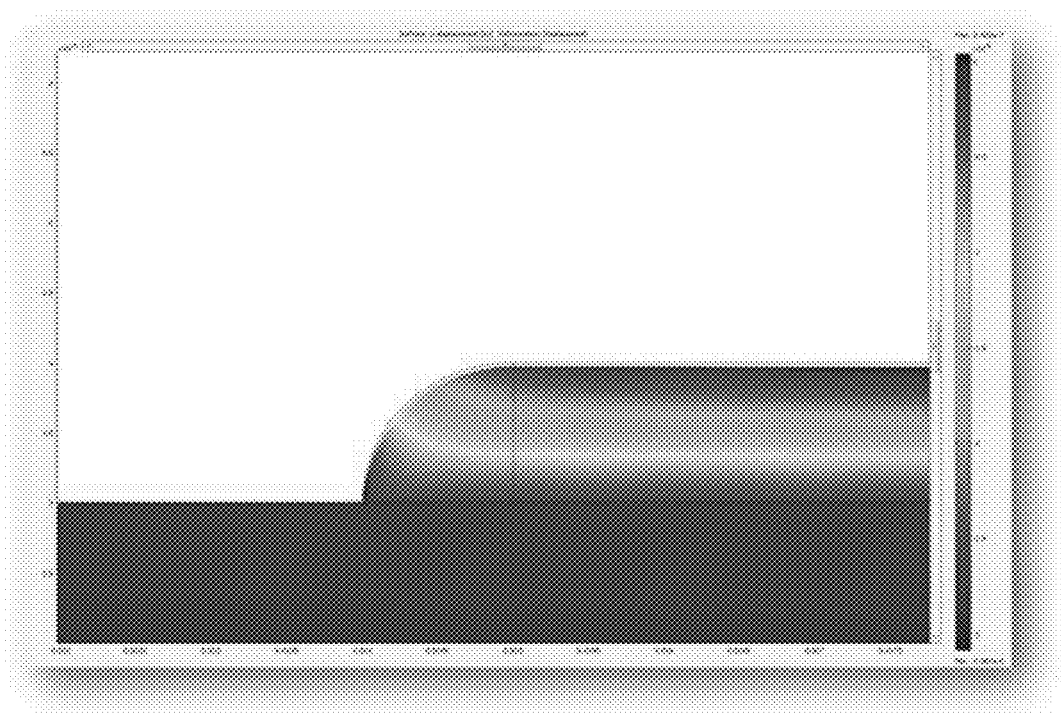
Figure 31G:
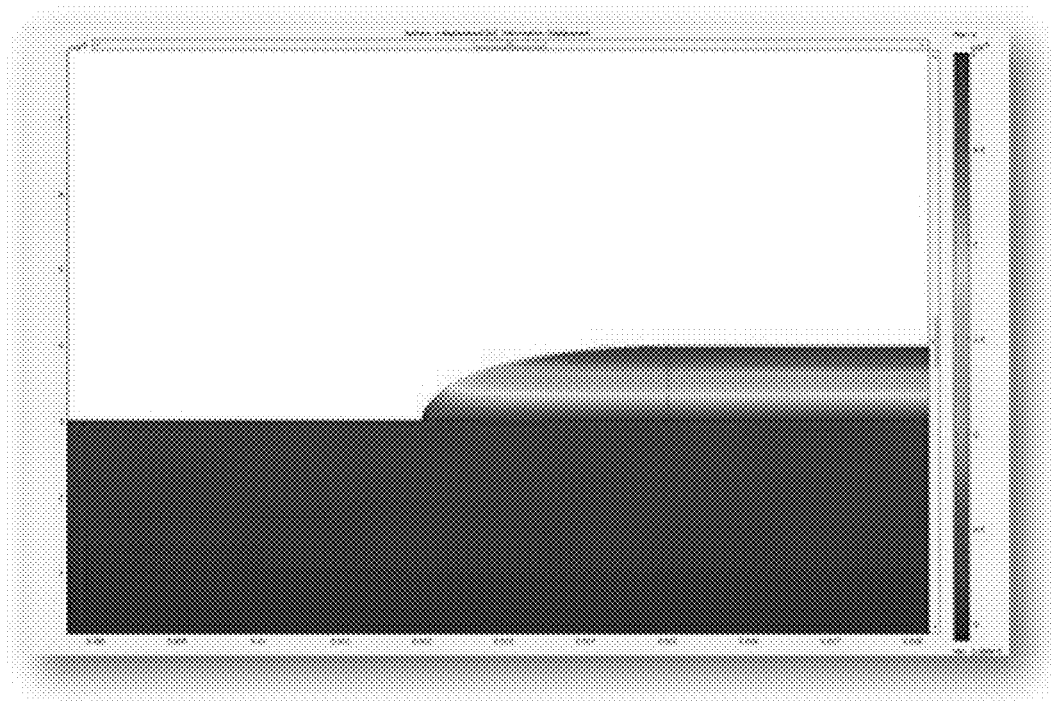

To reduce the crowning effect, the edges 1504 may be partially removed to produce an angled edge. FIGS. 30A and 30B are illustrations of a method of reducing the crowning 2202 on the bulk material 2206 as shown from a side/cross-sectional view of the transfer device. Angling cuts 3002 can be made to the edge 2204 of the transfer device to reduce the amount of crowning (e.g., that is formed when transfer devices are cast and as the PDMS pulls towards the center of the transfer device material). The cuts 3002 may be made using a razor 3004. These cuts 3002 may be made around the edge 2204 of the transfer device at regular intervals to significantly reduce the amount of crowning 2202 present. In certain embodiments, this reduces or eliminates the chance that the bulk material 2206 of the stamp will touch down at the edge of the transfer device before the array is fully laminated.

Transfer Device Sidewall Shapes

In certain embodiments, the shape of the elastomer sidewall may be used to control the distortions around the edge of the stamp. Finite element modeling was performed to understand how the shape of the elastomer sidewall affects the distortions around the edge of the stamp. In the example described below, a 1 mm thick, 20 mm broad slab of PDMS on 3 mm of glass, in plane strain was used. The CTE of the glass was 7 ppm/K and the CTE of PDMS was 300 ppm/K. The delta T was 333 K (cure temp) to 295K (lab temp). The bevel (i.e., sidewall) of the PDMS slab was varied. A transfer device with each of the following bevels/sidewalls was tested; 15-degree bevel, 30-degree bevel, 45-degree bevel, 60-degree bevel, 75-degree bevel, round bevel, elongated round bezel, and the square bevel as shown in FIGS. 31A through 31G.

Figure 32:
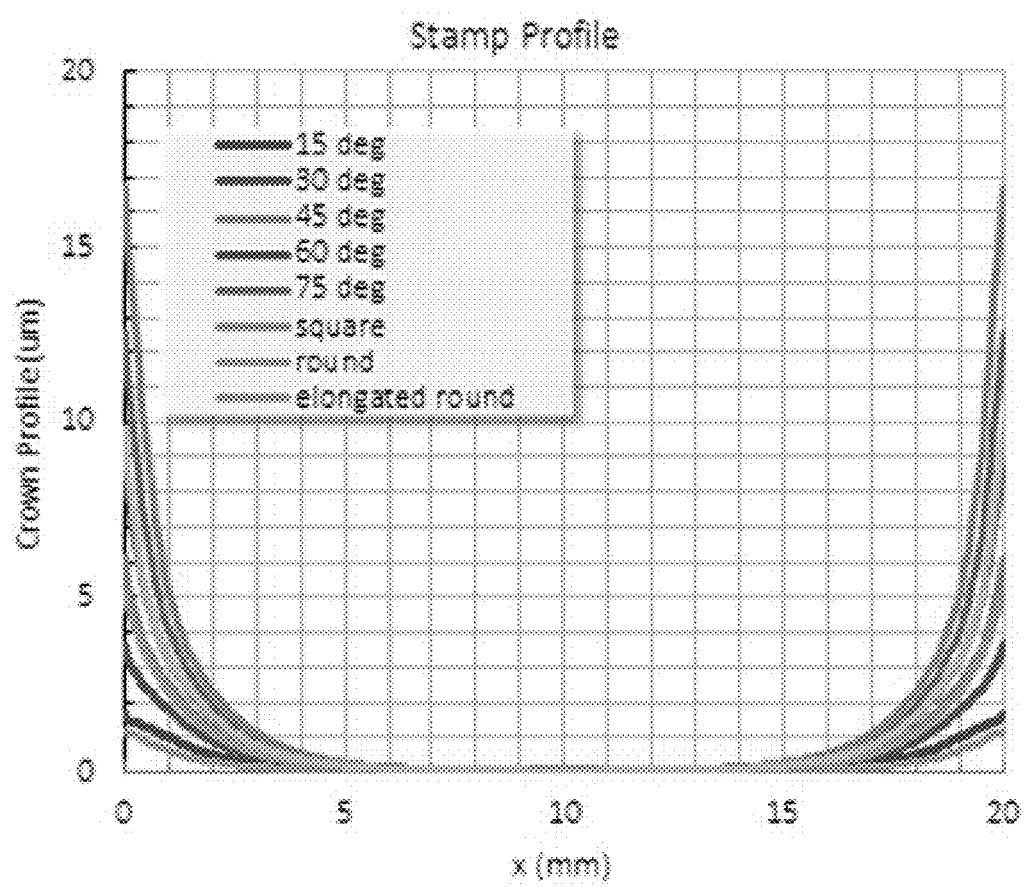
FIG. 32 is a plot of the crowning height from the top surface of the elastomer as a function of the lateral position coordinate on the top surface of the elastomer sidewall for each of the sidewall profiles shown in FIGS. 31A through 31G.
Figure 33:
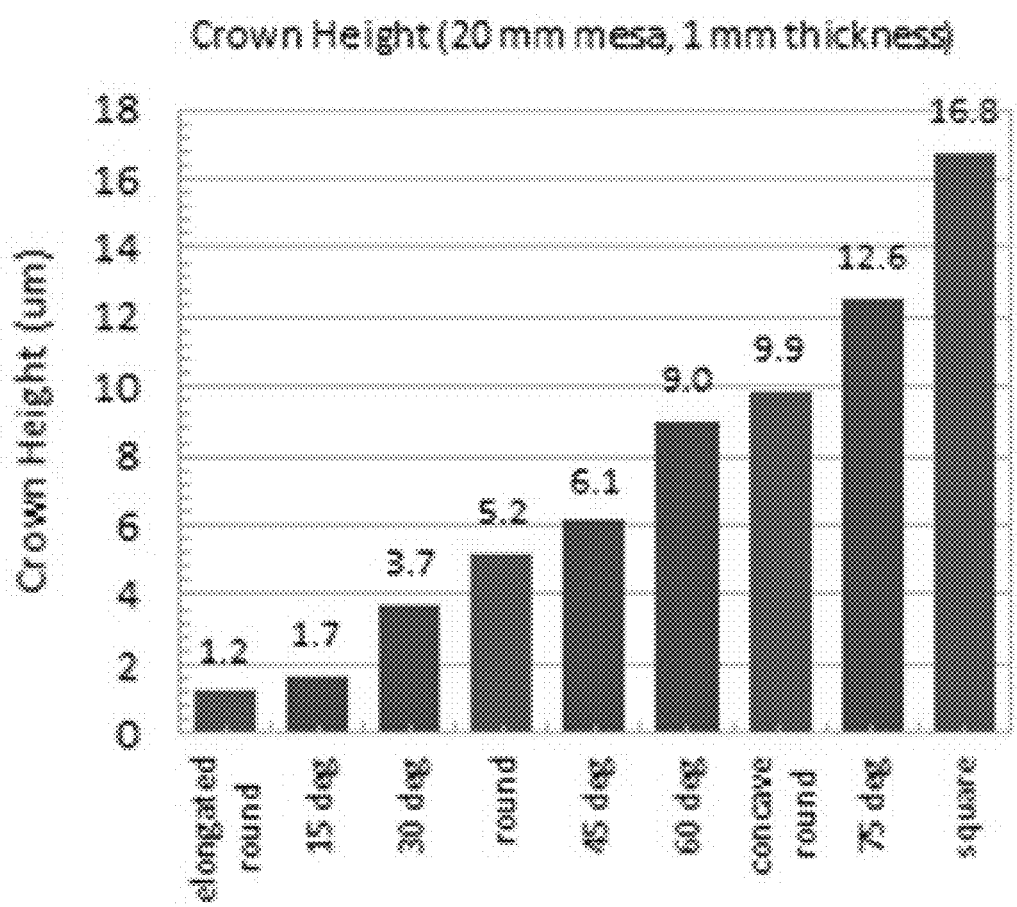
FIG. 33 is a plot of the crown height produced during formation of transfer devices with the sidewall profiles shown in FIGS. 31A through 31G.

FIG. 32 is a plot of the crowning height from the top surface of the elastomer as a function of the lateral position coordinate on the top surface of the elastomer sidewall as for each of the sidewall profiles shown in FIGS. 31A through 31G. FIG. 33 is a plot of the crown height produced during formation of transfer devices with the sidewall profiles shown in FIGS. 31A through 31G.

This analysis illustrated sidewall shapes that result in reduced crowning. As shown in FIGS. 32 and 33, the 15-degree bevel, 30-degree bevel, 45-degree bevel, 60-degree bevel, 75-degree bevel, round bevel, and elongated round bezel all had less crown than the square bevel.

In certain embodiments, features of different transfer devices discussed above are combined into a single transfer device. For example, a transfer device may include one or more anti-crown features, one or more sag pickup reduction features, etc. Furthermore, methods disclosed herein may be combined into a single method. For example, a method may include plasma treating the semiconductor elements and heat-assisted printing.

Having described various embodiments of the disclose technology, it will now become apparent to one of skill in the art that other embodiments incorporating the concepts may be used. It is felt, therefore, that these embodiments should not be limited to the disclosed embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist 10 of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions may be conducted simultaneously.

What is claimed:

1. A method for assembling a semiconductor device on a receiving surface of a destination substrate by micro-transfer printing, the method comprising:

providing the semiconductor device formed on a native substrate, wherein the semiconductor device has a relatively low coefficient of thermal expansion;

contacting a top surface of the semiconductor device with a conformable transfer device comprising an elastomer stamp comprising a protruding post having a contact surface, wherein contact between the contact surface and the top surface of the semiconductor device at least temporarily binds the semiconductor device to the conformable transfer device, wherein the conformable transfer device has a relatively high coefficient of thermal expansion that is higher than the relatively low coefficient of thermal expansion of the semiconductor device;

separating the semiconductor device from the native substrate such that the contact surface of the conformable transfer device has the semiconductor device disposed thereon with the semiconductor device released from the native substrate;

contacting the semiconductor device disposed on the contact surface with the receiving surface of the destination substrate;

heating the destination substrate and the conformable transfer device to cause the conformable transfer device to expand more than the semiconductor device; and separating the contact surface of the conformable transfer device from the semiconductor device, thereby micro-transfer printing the semiconductor device onto the receiving surface of the destination substrate.

2. The method of claim 1, wherein the heat is provided by a heating element.

3. The method of claim 2, wherein the heating element is disposed on a side of the destination substrate opposite the receiving surface.

4. The method of claim 2, wherein the heating element a non-contact thermal source that does not make direct physical contact with the destination substrate.

5. The method of claim 1, wherein the destination substrate is heated.

6. The method of claim 1, wherein the heating element is a hotplate.

7. The method of claim 6, wherein the hotplate is direct thermal contact with the destination substrate.

8. The method of claim 1, wherein the destination substrate is heated to an equilibrium temperature prior to the printable semiconductor elements being transferred to the substrate.

* * * * *